US012795999B2

(12) United States Patent
Kim et al.

(10) Patent No.: US 12,795,999 B2
(45) Date of Patent: Nov. 10, 2026

(54) SEMICONDUCTOR DEVICES

(71) Applicant: Samsung Electronics Co., Ltd., Suwon-si (KR)

(72) Inventors: Young Woo Kim, Suwon-si (KR); Kyoung Woo Lee, Suwon-si (KR); Min Chan Gwak, Suwon-si (KR); Guk Hee Kim, Suwon-si (KR); Sang Cheol Na, Suwon-si (KR); Anthony Dongick Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 378 days.

(21) Appl. No.: 18/500,797

(22) Filed: Nov. 2, 2023

(65) Prior Publication Data

US 2024/0282829 A1 Aug. 22, 2024

(30) Foreign Application Priority Data

Feb. 21, 2023 (KR) ........................ 10-2023-0022592

(51) Int. Cl.
*H10D 30/67* (2025.01)
*H10D 30/43* (2025.01)
(Continued)

(52) U.S. Cl.
CPC ......... *H10D 30/6729* (2025.01); *H10D 30/43* (2025.01); *H10D 30/6735* (2025.01);
(Continued)

(58) Field of Classification Search
CPC . H10D 30/6729; H10D 30/43; H10D 30/6735
See application file for complete search history.

(56) References Cited

U.S. PATENT DOCUMENTS 8,592,988 B2 * 11/2013 Lee ..................... H10W 20/023 257/773
10,522,459 B2 12/2019 Ohtou et al.
(Continued)

OTHER PUBLICATIONS

"European Search Report dated Jun. 25, 2024, issued in corresponding European Application No. 23216798.1, 4 pages".
(Continued)

*Primary Examiner* — Errol V Fernandes
(74) *Attorney, Agent, or Firm* — Wolf, Greenfield & Sacks, P.C.

(57) ABSTRACT

A semiconductor device includes a substrate that has first and second surfaces opposite to each other in a first direction, a first fin-type pattern that protrudes in the first direction from the first surface of the substrate and extends in a second direction, a first source/drain pattern on the first fin-type pattern, a first source/drain contact on the first source/drain pattern, a contact connection via that extends in the first direction and is electrically connected to the first source/drain contact, a buried conductive pattern that is in the substrate, is electrically connected to the contact connection via, and has first and second surfaces opposite to each other in the first direction, the first surface of the buried conductive pattern facing the first source/drain contact, and first buried insulating liners that extend along sidewalls and along the first surface of the buried conductive pattern.

20 Claims, 47 Drawing Sheets

(51) Int. Cl.
*H10D 62/10* (2025.01)
*H10W 20/20* (2026.01)

(52) U.S. Cl.
CPC ....... *H10D 30/6757* (2025.01); *H10D 62/121* (2025.01); *H10W 20/20* (2026.01)

(56) References Cited

U.S. PATENT DOCUMENTS

| | | | | |
|---|---|---|---|---|
| 11,177,286 | B2 | 11/2021 | Kim et al. | |
| 11,387,181 | B2 | 7/2022 | Chou et al. | |
| 2021/0028112 | A1 | 1/2021 | Kim et al. | |
| 2021/0280708 | A1* | 9/2021 | Wei ........................ | B82Y 10/00 |
| 2022/0157722 | A1 | 5/2022 | Bouche et al. | |
| 2022/0157957 | A1 | 5/2022 | Jin et al. | |
| 2022/0223698 | A1 | 7/2022 | Xie et al. | |
| 2022/0230947 | A1 | 7/2022 | Park et al. | |
| 2022/0270935 | A1 | 8/2022 | Yang et al. | |
| 2022/0310514 | A1 | 9/2022 | Wei | |
| 2022/0336330 | A1 | 10/2022 | Kim et al. | |
| 2022/0399251 | A1 | 12/2022 | Cho et al. | |

OTHER PUBLICATIONS

"Office Action, corresponding to European Application No. 23216798.1, dated Jul. 8, 2024, 9 pgs".

* cited by examiner

SEMICONDUCTOR DEVICES

CROSS-REFERENCE TO RELATED APPLICATION

This application claims priority from Korean Patent Application No. 10-2023-0022592 filed on Feb. 21, 2023 in the Korean Intellectual Property Office, and all the benefits accruing therefrom under 35 U.S.C. 119, the contents of which in its entirety are herein incorporated by reference.

BACKGROUND

The present disclosure relates to semiconductor devices.

As a scaling technique for increasing the density of a semiconductor device, a multi-gate transistor has been suggested in which a fin- or nanowire-type multi-channel active pattern (or silicon body) is formed on a substrate and a gate is formed on the surface of the multi-channel active pattern.

Since the multi-gate transistor uses a three-dimensional (3D) channel, scaling can be facilitated. Also, current control capability can be improved without increasing the length of the gate of the multi-gate transistor. Also, a short channel effect (SCE), i.e., the phenomenon of the potential of a channel region being affected by a drain voltage, can be effectively suppressed.

Meanwhile, as the pitch size of semiconductor devices has decreased, research has been conducted into ways to reduce the capacitance between contacts and secure electrical stability.

SUMMARY

Aspects of the present disclosure provide semiconductor devices capable of improving device performance and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to aspects of the present disclosure, there is provided a semiconductor device comprising a substrate that has first and second surfaces opposite to each other in a first direction, a first fin-type pattern that protrudes in the first direction from the first surface of the substrate and extends in a second direction, a first source/drain pattern that is on the first fin-type pattern and has a bottom surface electrically connected to the first fin-type pattern, a first source/drain contact that is on the first source/drain pattern and is electrically connected to the first source/drain pattern, a contact connection via that extends in the first direction and is electrically connected to the first source/drain contact, a buried conductive pattern that is in the substrate, is electrically connected to the contact connection via, and has first and second surfaces opposite to each other in the first direction, the first surface of the buried conductive pattern facing the first source/drain contact, and first buried insulating liners that extend along sidewalls and along the first surface of the buried conductive pattern, wherein a height from the bottom surface of the first source/drain pattern to an upper surface of the contact connection via is greater than a height from the bottom surface of the first source/drain pattern to an upper surface of the first source/drain contact, and wherein a thickness of a first portion of at least one of the first buried insulating liners that is on a respective one of the sidewalls of the buried conductive pattern is less than a thickness of a second portion of the at least one of the first buried insulating liners that is on the first surface of the buried conductive pattern.

According to aspects of the present disclosure, there is provided a semiconductor device comprising a substrate that has first and second surfaces opposite to each other in a first direction, the substrate comprising a buried pattern trench that extends in the first direction from the second surface toward the first surface of the substrate and has a bottom surface including first and second concave areas, a fin-type pattern that protrudes in the first direction from the first surface of the substrate and extends in a second direction, a source/drain pattern that is on the fin-type pattern and is electrically connected to the fin-type pattern, a source/drain contact that is on the source/drain pattern and is electrically connected to the source/drain pattern, a contact connection via that extends in the first direction and is electrically connected to the source/drain contact, first buried insulating liners that extend along sidewalls and along the first and second concave areas of the buried pattern trench, and a buried conductive pattern that is on the first buried insulating liners, is in the buried pattern trench, and is in contact with the contact connection via.

According aspects of the present disclosure, there is provided a semiconductor device comprising a substrate that has first and second surfaces opposite to each other in a first direction, a first fin-type pattern that protrudes in the first direction from the first surface of the substrate and extends in a second direction, a second fin-type pattern that protrudes in the first direction from the first surface of the substrate and is adjacent to the first fin-type pattern in a third direction, a first source/drain pattern that is on the first fin-type pattern and is electrically connected to the first fin-type pattern, a second source/drain pattern that is on the second fin-type pattern and is electrically connected to the second fin-type pattern, a first source/drain contact that is on the first source/drain pattern and is electrically connected to the first source/drain pattern, a second source/drain contact that is on the second source/drain pattern and is electrically connected to the second source/drain pattern, a contact connection via that is between the first and second source/drain contacts, extends in the first direction, and is electrically connected to the first source/drain contact, via insulating liners that extend along sidewalls of the contact connection via and are in contact with the first and second source/drain contacts, a buried conductive pattern that is in the substrate, is electrically connected to the contact connection via, and has first and second surfaces opposite to each other in the first direction, the first surface of the buried conductive pattern facing the first source/drain contact, and buried insulating liners that extend along sidewalls and along the first surface of the buried conductive pattern, wherein the contact connection via includes an upper portion that protrudes in the first direction beyond an upper surface of the first source/drain contact, and a lower portion that is between the upper portion of the contact connection via and the buried conductive pattern, wherein the buried insulating liners include first and second curved portions on the first surface of the buried conductive pattern, wherein the contact connection via is between the first and second curved portions of the buried insulating liners, and wherein outer surfaces of the first and second curved portions of the buried insulating liners that are in contact with the substrate have a convex shape.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

It will be understood that, although the terms “first,” “second,” “upper,” “lower,” and the like may be used herein to describe various elements, these elements should not be limited by these terms. These terms are only used to distinguish one element from another. Thus, a “first” element discussed below could also be termed a “second” element without departing from the teachings of the present disclosure. Similarly, a “lower” element discussed below could also be termed an “upper element” without departing from the teachings of the present disclosure. In addition, as used herein, the terms “comprises”, “comprising”, “includes”, “including”, “has”, “having” and any other variations thereof specify the presence of the stated features, steps, operations, elements, and/or components, but do not preclude the presence or addition of one or more other features, steps, operations, elements, components, and/or groups thereof.

FIGS. 1 through 47 illustrate semiconductor devices according to some embodiments of the present disclosure as including fin field-effect transistors (FinFETs) including fin-type channel regions, transistors including nanowires or nanosheets, or multibridge channel field-effect transistors (MBCFETs), but the present disclosure is not limited thereto.

Also, the semiconductor devices according to some embodiments of the present disclosure may include tunneling field-effect transistors (FETs), three-dimensional (3D) transistors, or vertical FETs. Also, the semiconductor devices according to some embodiments of the present disclosure may include planar transistors. Also, the semiconductor devices according to some embodiments of the present disclosure may be applicable to two-dimensional (2D) material-based FETs and heterostructures thereof. Also, the semiconductor devices according to some embodiments of the present disclosure may include bipolar junction transistors (BJTs) or laterally-diffused metal-oxide semiconductor (LDMOS) transistors.

A semiconductor device according to some embodiments of the present disclosure will hereinafter be described with reference to FIGS. 1 through 8.

Figure 1:
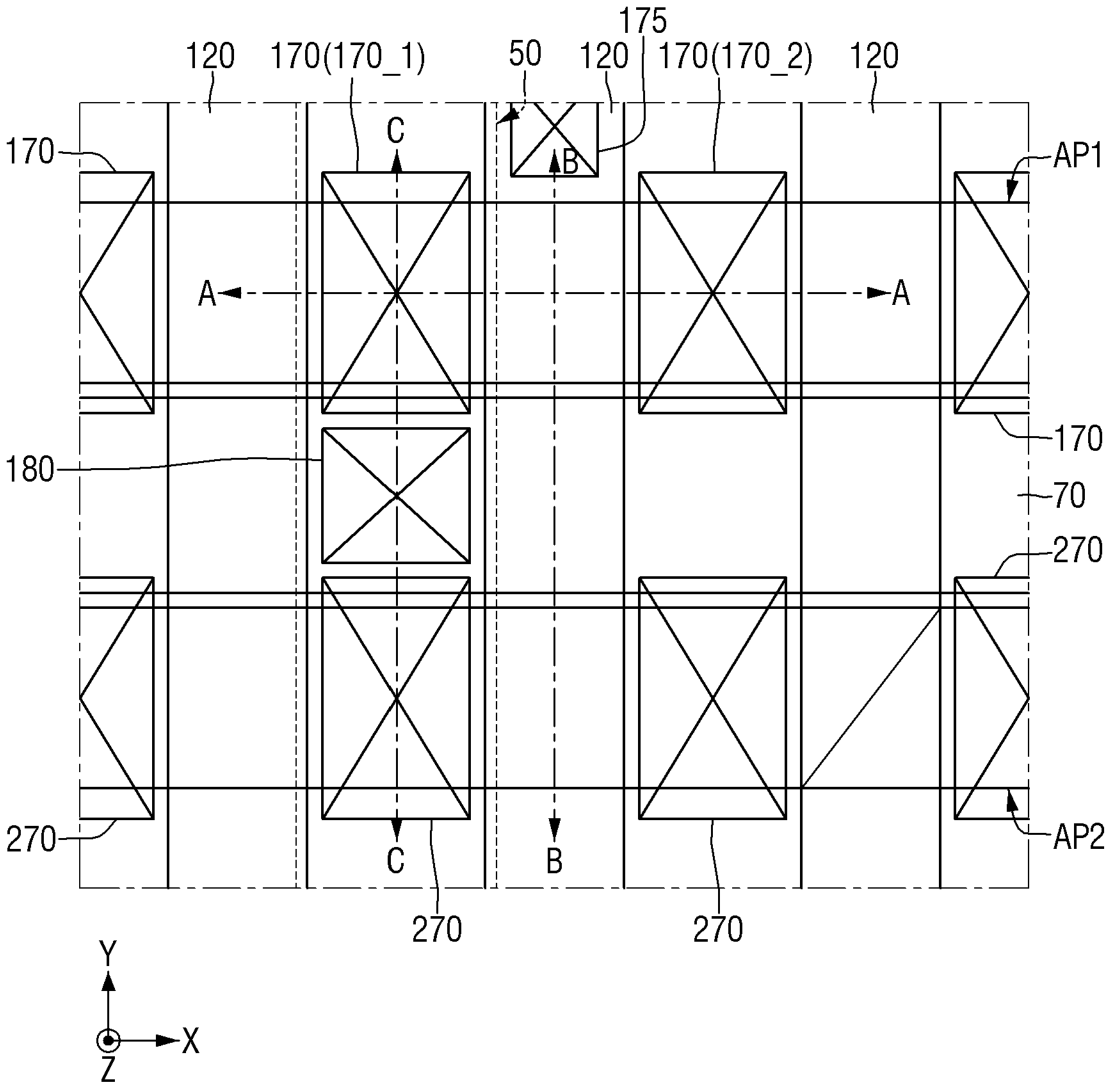
FIG. 1 is a layout view of a semiconductor device according to some embodiments of the present disclosure.
Figure 2:
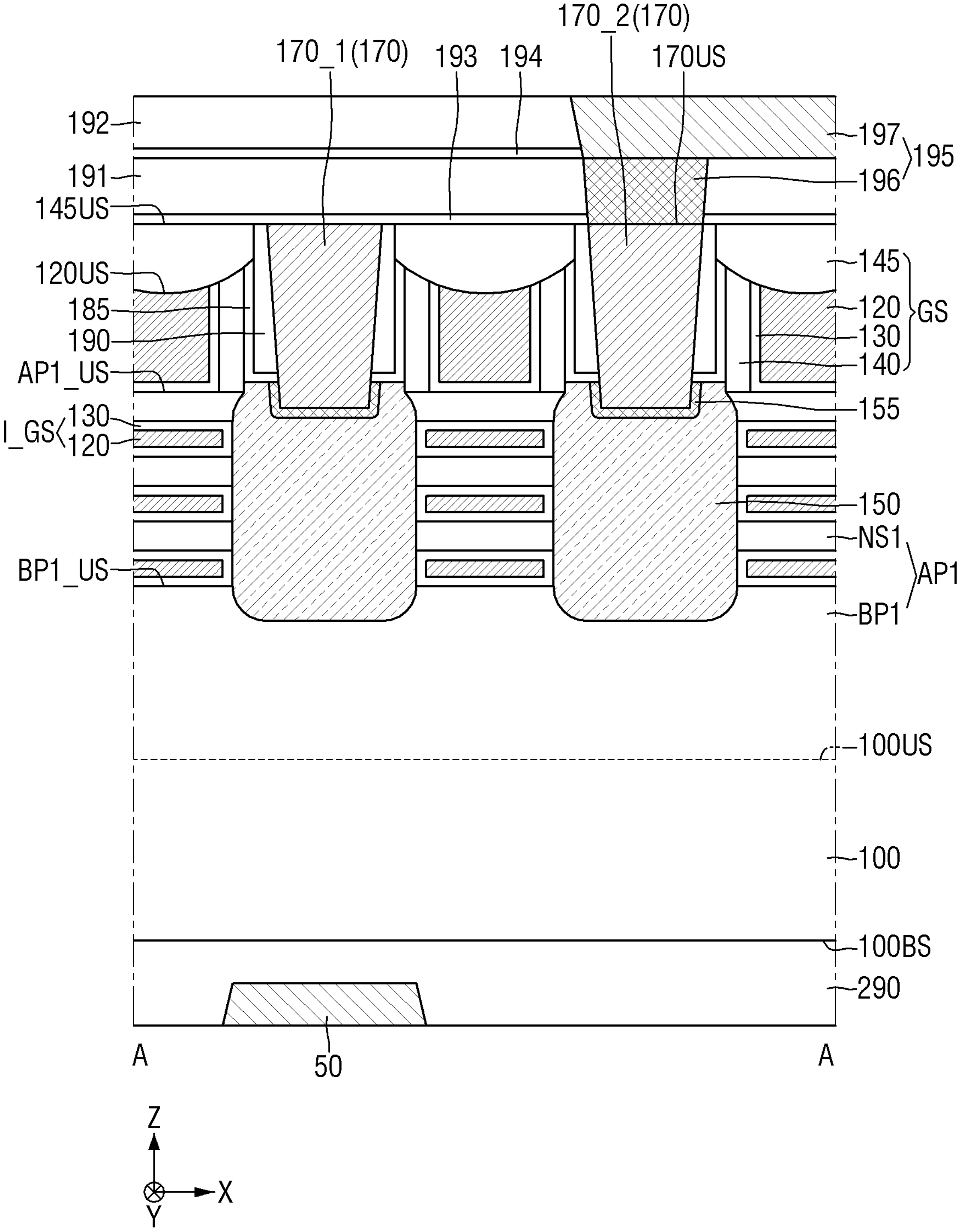
FIGS. 2 through 4 are cross-sectional views taken along lines A-A, B-B, and C-C, respectively, of FIG. 1.
Figure 3:
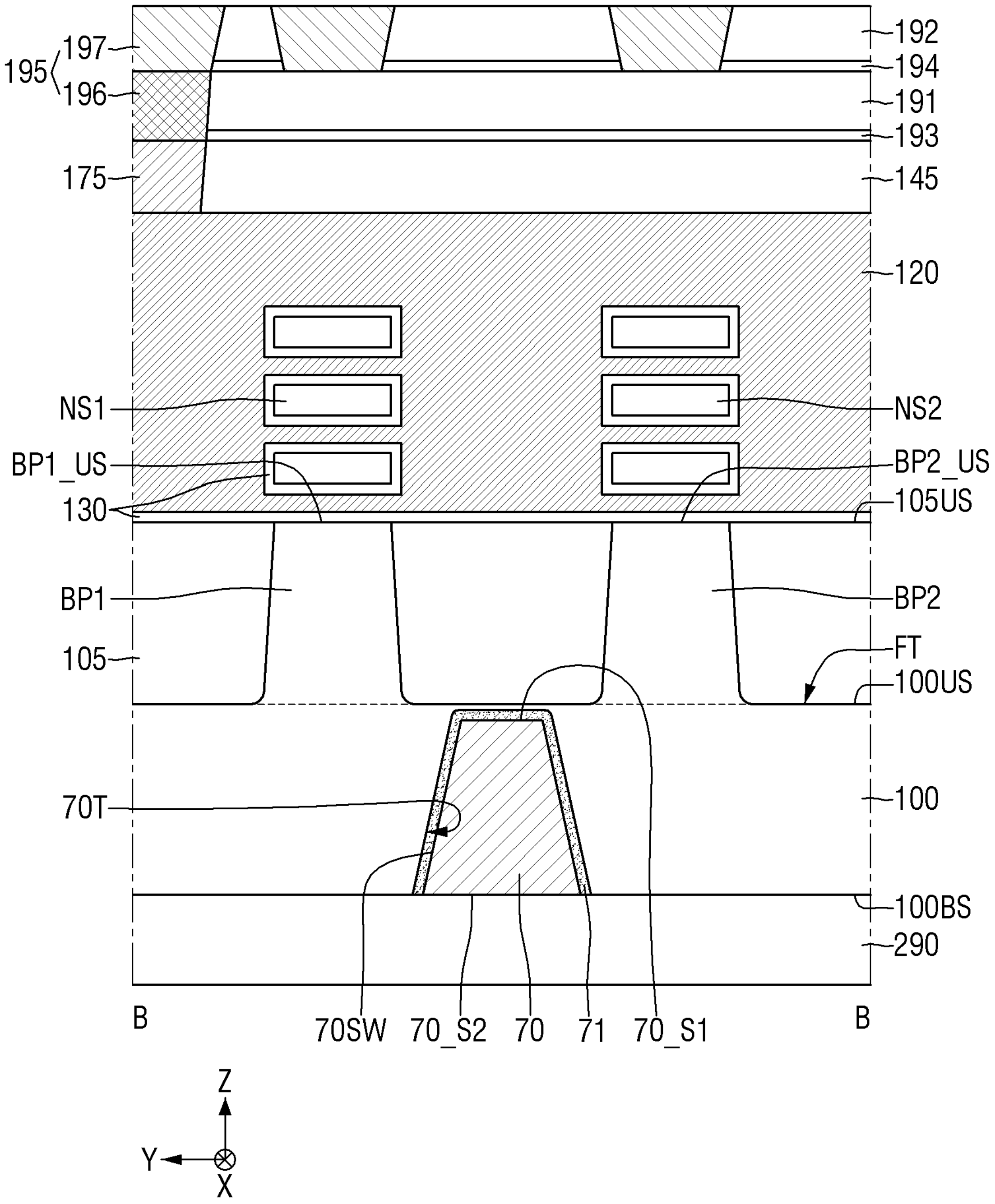
Figure 4:
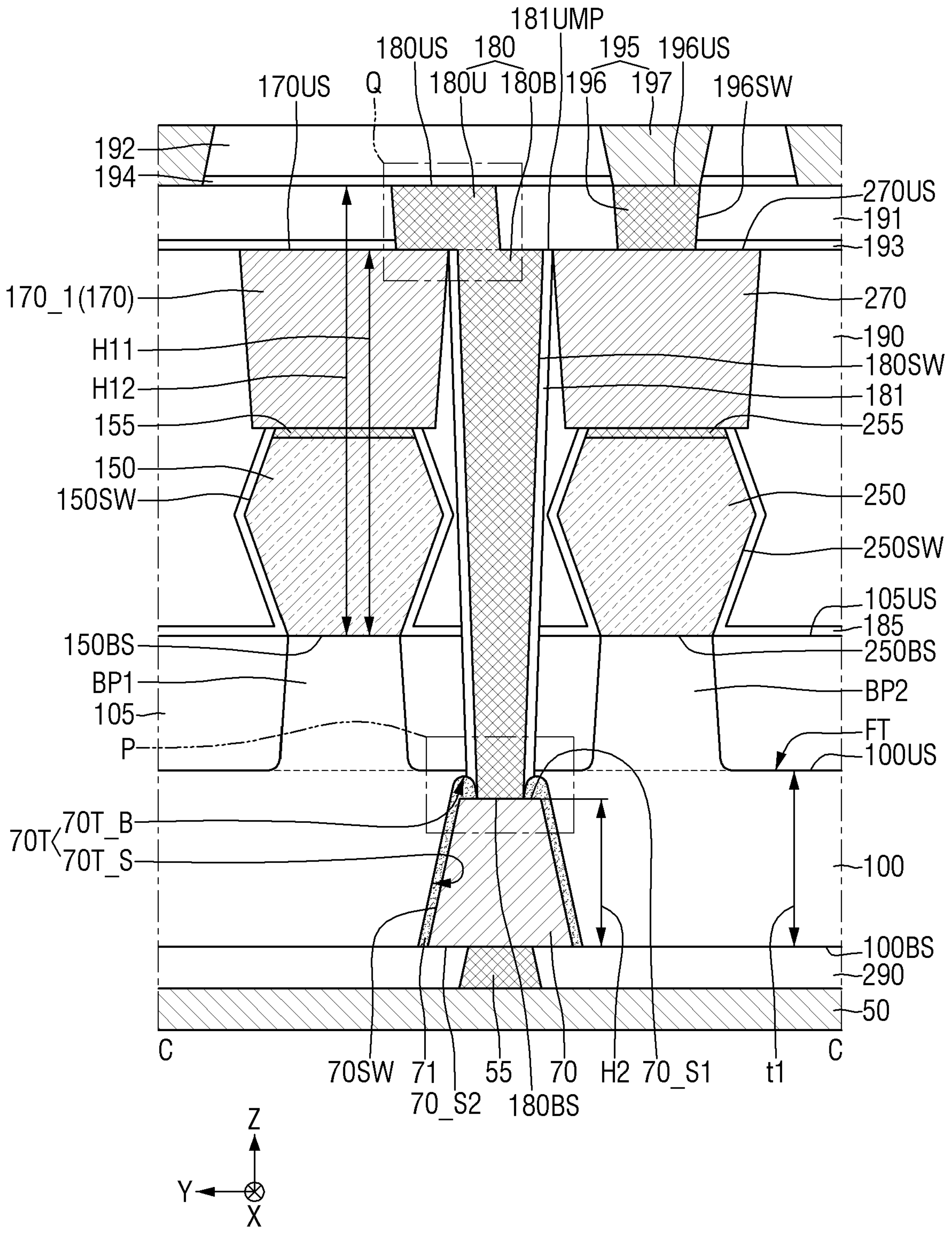
Figure 5:
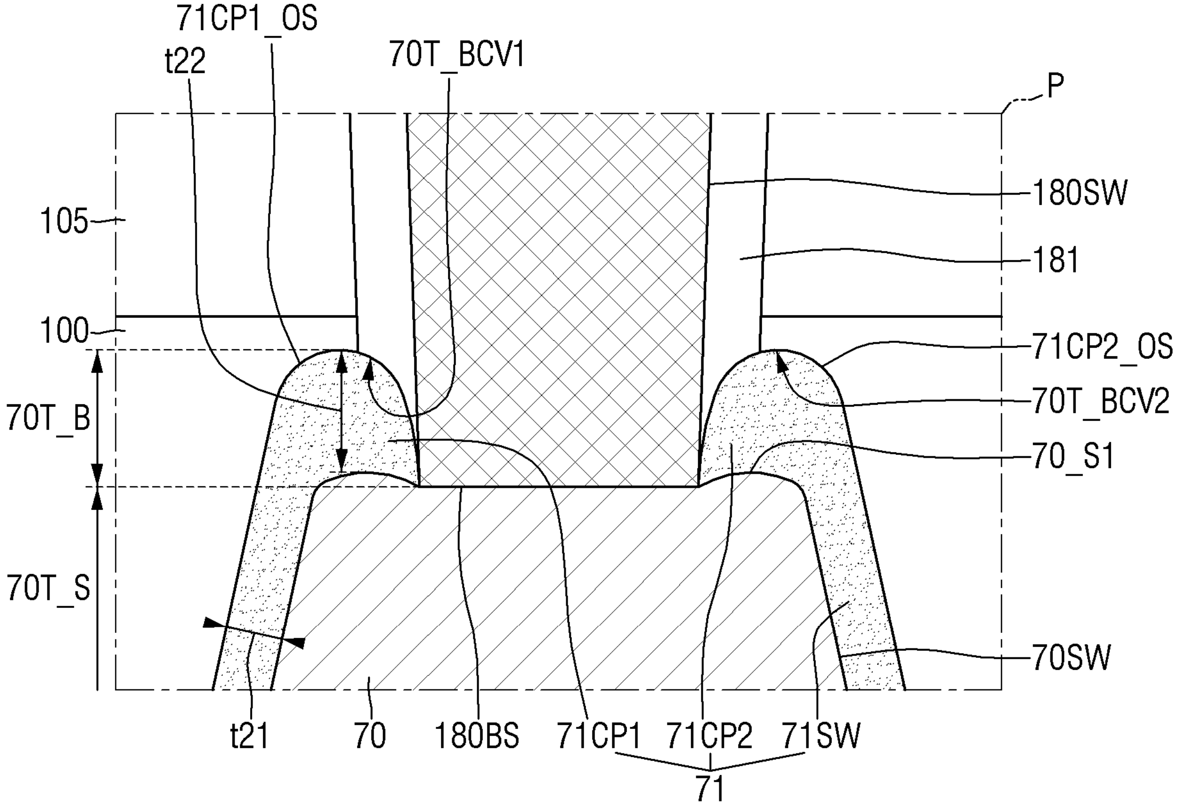
FIGS. 5 through 7 are enlarged cross-sectional views of part P of FIG. 4.
Figure 6:
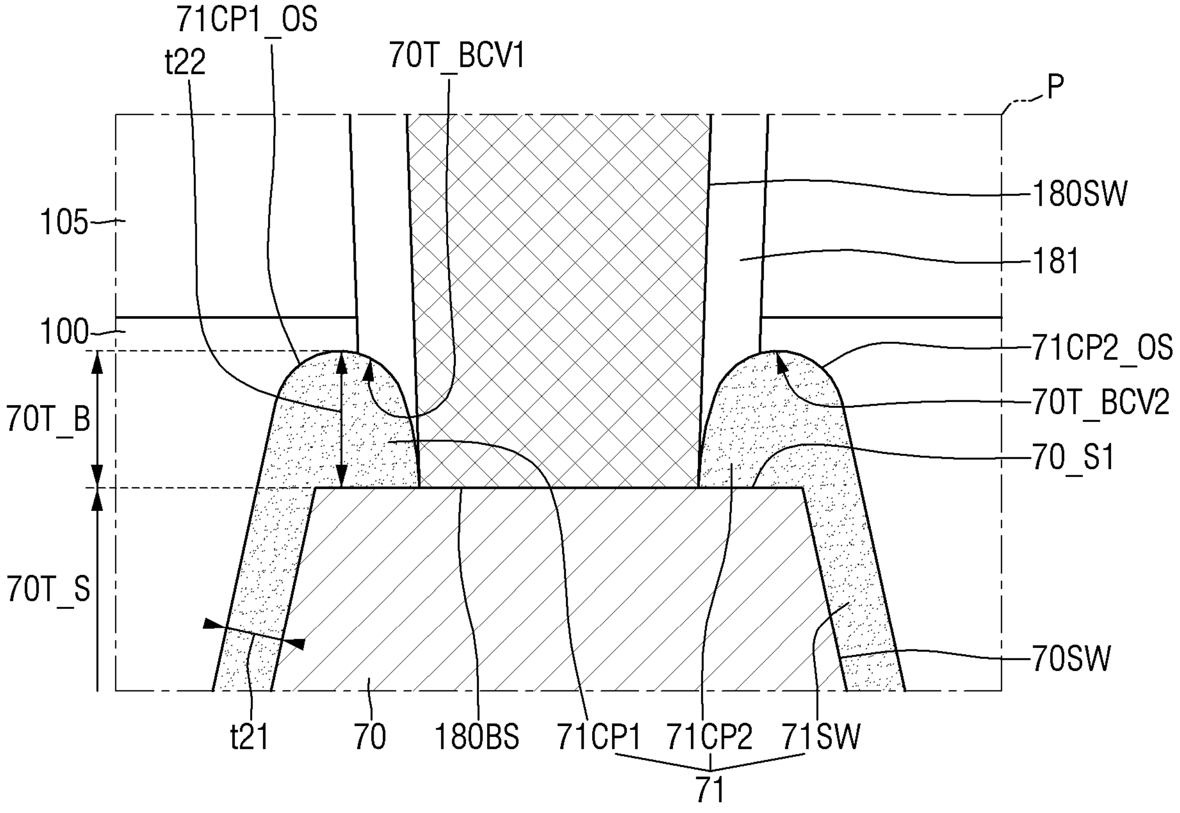
Figure 7:
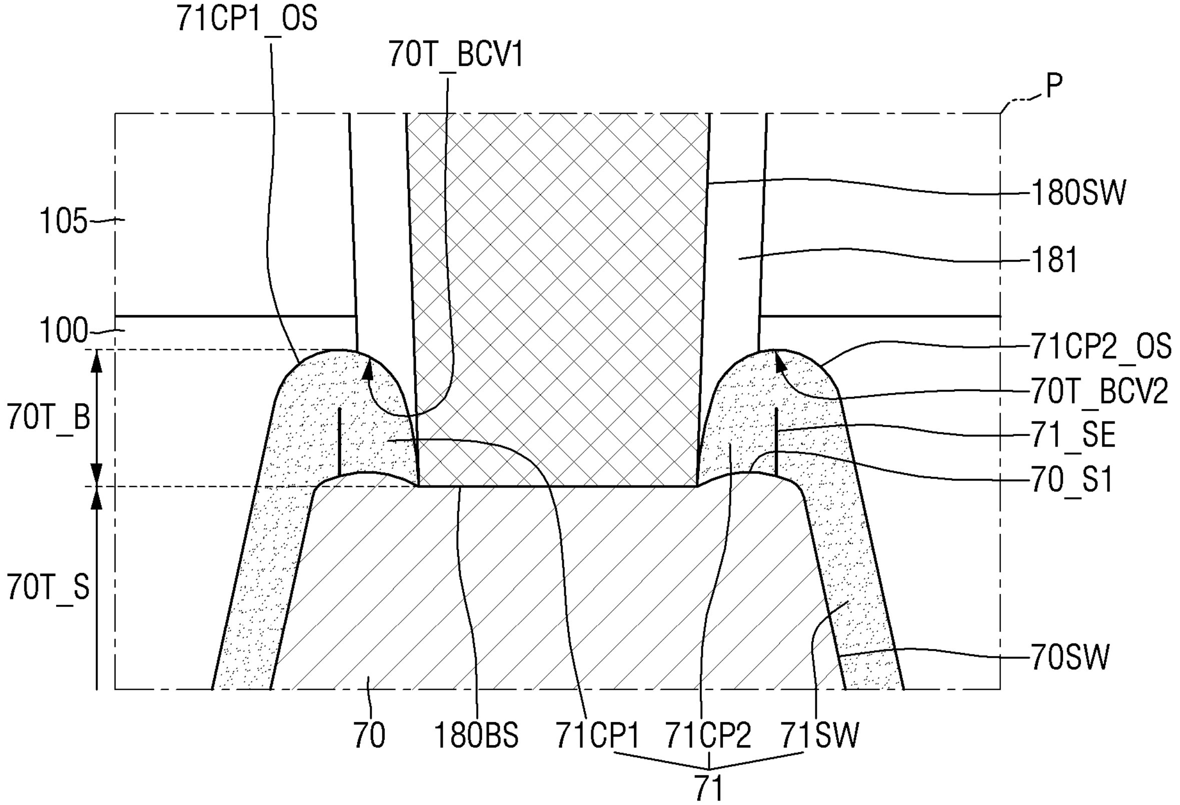
Figure 8:
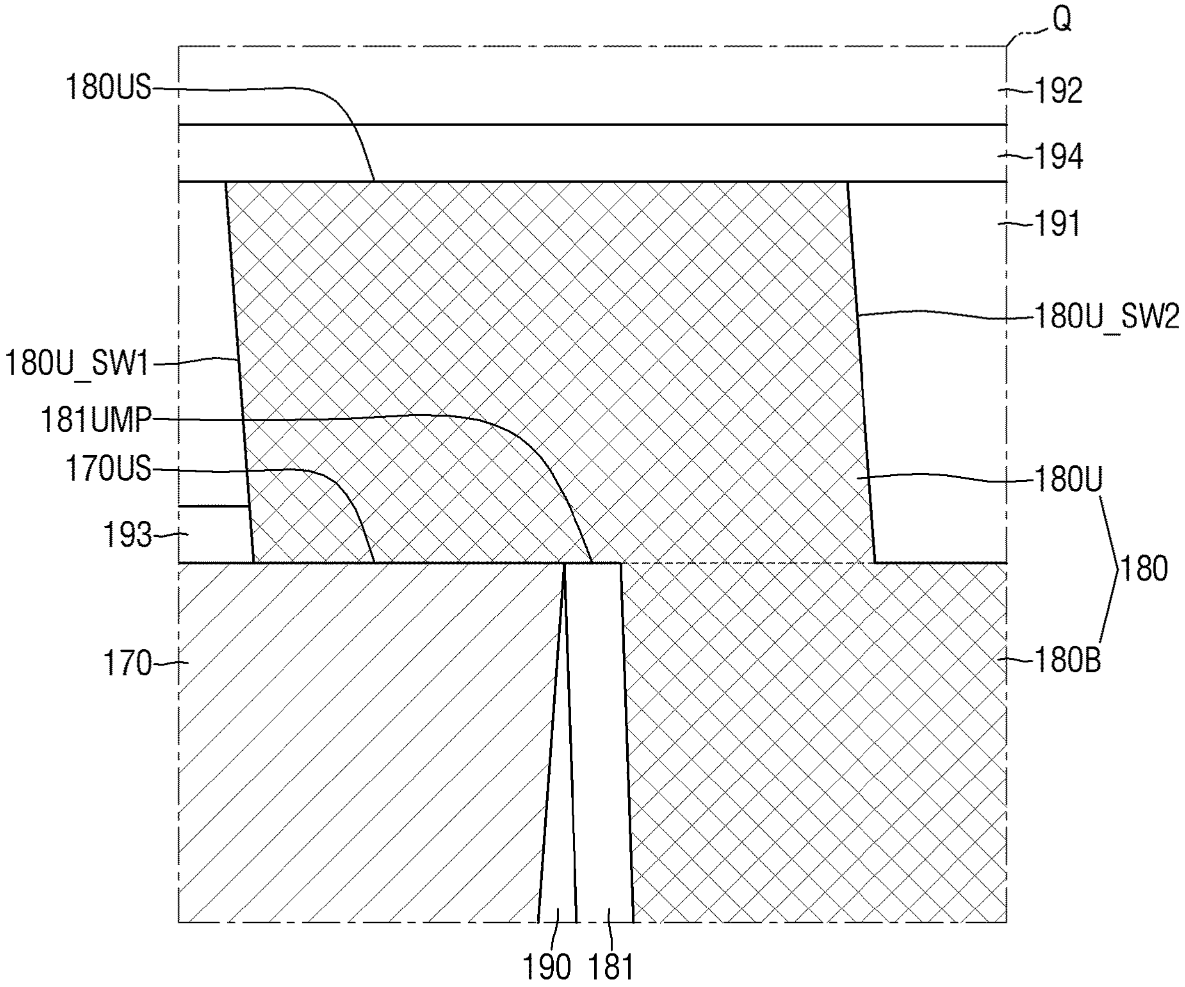
FIG. 8 is an enlarged cross-sectional view of part Q of FIG. 4.

FIG. 1 is a layout view of a semiconductor device according to some embodiments of the present disclosure. FIGS. 2 through 4 are cross-sectional views taken along lines A-A, B-B, and C-C, respectively, of FIG. 1. FIGS. 5 through 7 are enlarged cross-sectional views of part P of FIG. 4. FIG. 8 is an enlarged cross-sectional view of part Q of FIG. 4.

For convenience, a front wiring structure 195 is not illustrated in FIG. 1. Although not specifically illustrated, a cross-sectional view taken across a second active pattern AP2 along a first direction X may be similar to FIG. 2.

Referring to FIGS. 1 through 8, the semiconductor device according to some embodiments of the present disclosure may include a substrate 100, a first active pattern AP1, a second active pattern AP2, a rear wiring line 50, a buried conductive pattern 70, first buried insulating liners 71, a plurality of gate electrodes 120, first source/drain patterns 150, second source/drain patterns 250, first source/drain contacts 170, second source/drain contacts 270, a contact connection via 180, a source/drain etch stopper film 185, and a front wiring structure 195.

The substrate 100 may have first and second surfaces 100US and 100BS, which are opposite to each other in a third direction Z. As the gate electrodes 120, the first source/drain patterns 150, and the second source/drain patterns 250 are disposed on the first surface 100US of the substrate 100, the first surface 100US of the substrate 100 may be the upper surface of the substrate 100. The second surface 100BS of the substrate 100, which is opposite to the first surface 100US of the substrate 100, may be the bottom surface of the substrate 100.

The substrate 100 may be formed of, or may include, a semiconductor material. The substrate 100 may be a silicon (Si) substrate or a silicon-on-insulator (SOI) substrate. The substrate 100 may be a silicon substrate or may include another material such as, for example, silicon-germanium (SiGe), SiGe-on-insulator (SGOI), indium antimonide, a lead tellurium compound, indium arsenide, indium phosphide, gallium arsenide, or gallium antimonide, but the present disclosure is not limited thereto.

The first and second active patterns AP1 and AP2 may be disposed on the substrate 100. For example, the first and second active patterns AP1 and AP2 may be disposed on the first surface 100US of the substrate 100. The first and second active patterns AP1 and AP2 may extend in the first direction X.

The first and second active patterns AP1 and AP2 may be spaced apart from each other in a second direction Y. The first and second active patterns AP1 and AP2 may be adjacent to each other in the second direction Y.

For example, one of the first or second active patterns AP1 or AP2 may be a region where a p-type transistor is formed, and the other of the first or second active patterns AP1 or AP2 may be a region where an n-type transistor is formed. In another example, the first and second active patterns AP1 and AP2 may be regions where p-type transistors are formed. In another example, the first and second active patterns AP1 and AP2 may be regions where n-type transistors are formed.

The first and second active patterns AP1 and AP2 may be multichannel active patterns. For example, the first active pattern AP1 may include a first lower pattern BP1 and a plurality of first sheet patterns NS1, and the second active pattern AP2 may include a second lower pattern BP2 and a plurality of second sheet patterns NS2. The first and second active patterns AP1 and AP2 may be active patterns including nanosheets or nanowires.

The first and second lower patterns BP1 and BP2 may protrude from the substrate 100. For example, the first and second lower patterns BP1 and BP2 may protrude from the first surface 100US of the substrate 100. The first and second lower patterns BP1 and BP2 may be fin-type patterns.

The first and second lower patterns BP1 and BP2 may extend in the first direction X. The first lower pattern BP1 may be spaced apart from the second lower pattern BP2 in the second direction Y. The first and second lower patterns BP1 and BP2 may be separated by fin trenches FT, which extend in the first direction X. The first surface 100US of the substrate 100 may correspond to the bottom surfaces of the fin trenches FT.

Each of the first and second lower patterns BP1 and BP2 may include sidewalls extending in the first direction X. The sidewalls of each of the first and second lower patterns BP1 and BP2 may be defined by the fin trenches FT.

The plurality of first sheet patterns NS1 may be disposed on the first lower pattern BP1. The plurality of first sheet patterns NS1 may be spaced apart from an upper surface BP1_US of the first lower pattern BP1 in the third direction Z. The first sheet patterns NS1 may be disposed on the first surface 100US of the substrate 100.

The plurality of second sheet patterns NS2 may be disposed on the second lower pattern BP2. The plurality of second sheet patterns NS2 may be spaced apart from an upper surface BP2_US of the second lower pattern BP2 in the third direction Z. The second sheet patterns NS2 may be disposed on the first surface 100US of the substrate 100.

Here, the first direction X may intersect the second and third directions Y and Z, the second direction Y may intersect the third direction Z, and the third direction Z may be the thickness direction of the substrate 100. For example, the first, second, and third directions X, Y, and Z may be perpendicular to each other. For example, the first and second directions X and Y may be parallel to the first surface 100US of the substrate 100, and the third direction Z may be perpendicular to the first surface 100US of the substrate 100.

Each of the first sheet patterns NS1 may have upper and bottom surfaces that are opposite to each other in the third direction Z, and each of the second sheet patterns NS2 may have upper and bottom surfaces that are opposite to each other in the third direction Z. The bottom surfaces of the first sheet patterns NS1 and the bottom surfaces of the second sheet patterns NS2 may face the substrate 100. It is illustrated that three first sheet patterns NS1 and three second sheet patterns NS2 are arranged in the third direction Z, but the present disclosure is not limited thereto. For example, in some embodiments, there may be more or less than three first sheet patterns NS1 and/or three second sheet patterns NS2.

The first sheet patterns NS1 and the second sheet patterns NS2 may include an uppermost first sheet pattern NS1 and an uppermost second sheet pattern NS2, respectively, that are spaced most apart from the substrate 100. For example, the upper surface AP1_US of the first active pattern AP1 may correspond to the upper surface of the uppermost first sheet pattern NS1.

The first and second lower patterns BP1 and BP2 may be formed by etching parts of the substrate 100 or may include epitaxial layers grown from the substrate 100. The first and second lower patterns BP1 and BP2 may include an element semiconductor material such as, for example, Si or germanium (Ge). Also, the first and second lower patterns BP1 and BP2 may include a compound semiconductor such as, for example, a group IV-IV compound semiconductor or a group III-V compound semiconductor.

The group IV-IV compound semiconductor may be, for example, a binary or ternary compound containing at least two of Si, Ge, and tin (Sn) or a compound obtained by doping the binary or ternary compound with a group IV element.

The group III-V compound semiconductor may be, for example, a binary, ternary, or quaternary compound obtained by combining at least one of aluminum (Al), gallium (Ga), and/or indium (In), which are group III elements, and one of phosphorus (P), arsenic (As), and/or antimony (Sb), which are group V elements.

The first sheet patterns NS1 and the second sheet patterns NS2 may include one of an element semiconductor material (e.g., Si or Ge), the group IV-IV compound semiconductor, and/or the group III-V compound semiconductor. The width, in the second direction Y, of the first sheet patterns NS1 may increase or decrease in proportion to the width, in the second direction Y, of the first lower pattern BP1. The width, in the second direction Y, of the second sheet patterns NS2 may increase or decrease in proportion to the width, in the second direction Y, of the second lower pattern BP2.

The first sheet patterns NS1, which are disposed on the first lower pattern BP1, are illustrated as all having the same width in the second direction Y, but the present disclosure is not limited thereto.

A field insulating film 105 is disposed on the substrate 100. For example, the field insulating film 105 may be disposed on the first surface 100US of the substrate 100. The field insulating film 105 may fill or be in at least parts of the fin trenches FT, which separate the first and second lower patterns BP1 and BP2.

The field insulating film 105 may be disposed on the substrate 100, between the first and second lower patterns BP1 and BP2. For example, the field insulating film 105 may cover or be on the entire sidewalls of the first lower pattern BP1 and the entire sidewalls of the second lower pattern BP2.

The field insulating film 105 may cover or be on parts of the sidewalls of the first lower pattern BP1 and/or parts of the sidewalls of the second lower pattern BP2. For example, part of the first lower pattern BP1 and/or part of the second lower pattern BP2 may protrude in the third direction Z beyond an upper surface 105US of the field insulating film 105.

The field insulating film 105 may not cover or be on the upper surface BP1_US of the first lower pattern BP1 and the upper surface BP2_US of the second lower pattern BP2. The first sheet patterns NS1 and the second sheet patterns NS2 may be disposed above the upper surface 105US of the field insulating film 105, with respect to the first surface 100US of the substrate 100. For example, the first sheet patterns NS1 and the second sheet patterns NS2 may be above the upper surface 105US of the field insulating film 105, with the first surface 100US of the substrate 100 serving as a base reference plane.

The upper surface 105US of the field insulating film 105 is illustrated as being flat, but the present disclosure is not limited thereto. The field insulating film 105 may include, for example, an oxide film, a nitride film, an oxynitride film, or a combination thereof. The field insulating film 105 is illustrated as being a single film, but the present disclosure is not limited thereto. For example, in some embodiments, the field insulating film 105 may be a multilayer film.

A plurality of gate structures GS may be disposed on the first surface 100US of the substrate 100. The gate structures GS may extend in the second direction Y. The gate structures GS may be spaced apart from one another in the first direction X. The gate structures GS may be adjacent to one another in the first direction X.

The gate structures GS may be disposed on the first and second active patterns AP1 and AP2. The gate structures GS may intersect the first and second active patterns AP1 and AP2.

The gate structures GS may intersect the first and second lower patterns BP1 and BP2. The gate structures GS may surround each of the first sheet patterns NS1. The gate structures GS may surround each of the second sheet patterns NS2. It will be understood that "an element A surrounds an element B" (or similar language) as used herein means that the element A is at least partially around the element B in one or more planes but does not necessarily mean that the element A completely encloses the element B.

The gate structures GS may be disposed in and across the first and second active patterns AP1 and AP2, but the present disclosure is not limited thereto. Some of the gate structures GS may be divided into two parts by a gate separation structure on the field insulating film 105 and may then be disposed on the first and second active patterns AP1 and AP2.

Each of the gate structures GS may include, for example, a gate electrode 120, a gate insulating film 130, gate spacers 140, and a gate capping pattern 145.

Each of the gate structures GS may include a plurality of inner gate structures I_GS, which are disposed between the first sheet patterns NS1 and between the first lower pattern BP1 and the first sheet patterns NS1. For example, respective ones of the inner gate structures I_GS may be between respective ones of the first sheet patterns NS1. For example, respective ones of the inner gate structures I_GS may be between the first lower pattern BP1 and one or more of the first sheet patterns NS1. The inner gate structures I_GS may be disposed between the upper surface BP1_US of the first lower pattern BP1 and the bottom surfaces of one or more of the first sheet patterns NS1 and between the upper and bottom surfaces of each pair of adjacent first sheet patterns NS1 that are opposite to each other in the third direction Z.

The number of inner gate structures I_GS may be the same as the number of first sheet patterns NS1. The inner gate structures I_GS may be in contact with the upper surface BP1_US of the first lower pattern BP1 and the upper surfaces and the bottom surfaces of the first sheet patterns NS1. The inner gate structures I_GS may also be in contact with the first source/drain patterns 150 that will be described later.

Each of the inner gate structures I_GS may include the gate electrode 120 and the gate insulating film 130 which are disposed between each pair of adjacent first sheet patterns NS1 and between the first lower pattern BP1 and the first sheet patterns NS1. Although not specifically illustrated, the inner gate structures I_GS may also be disposed between the second sheet patterns NS2, which are adjacent to one another in the third direction Z, and between the second lower pattern BP2 and the second sheet patterns NS2. In some embodiments, the inner gate structures I_GS may be provided similarly with respect to the second sheet patterns NS2 and the second lower pattern BP2 as they are provided with respect to the first sheet patterns NS1 and the first lower pattern BP1.

Gate electrodes 120 may be formed on the first lower pattern BP1 and the second lower pattern BP2. The gate electrode 120 may intersect the first lower pattern BP1 and the second lower pattern BP2. The gate electrodes 120 may surround the first sheet patterns NS1 and/or the second sheet patterns NS2.

FIG. 2 illustrates that upper surfaces 120US of the gate electrodes 120 are concave surfaces, but the present disclosure is not limited thereto. In some embodiments, the upper surfaces 120US of the gate electrodes 120 may be flat.

The gate electrodes 120 may include at least one of a metal, a metal alloy, a conductive metal nitride, a metal silicide, a doped semiconductor material, a conductive metal oxide, and/or a conductive metal oxynitride. The gate electrodes 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), Al, copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and/or a combination thereof, but the present disclosure is not limited thereto. Here, the conductive metal oxide and the conductive metal oxynitride may include oxides of the aforementioned materials, but the present disclosure is not limited thereto.

Gate insulating films 130 may extend along the upper surface 105US of the field insulating film 105, the upper surface BP1_US of the first lower pattern BP1, and the upper surface BP2_US of the second lower pattern BP2. The gate insulating films 130 may surround the first sheet patterns NS1. The gate insulating films 130 may surround the second sheet patterns NS2. The gate insulating films 130 may be disposed along the circumferences of the first sheet patterns NS1 and the circumferences of the second sheet patterns NS2. The gate electrodes 120 may be disposed on the gate insulating films 130.

The gate insulating films 130 may be disposed between the gate electrodes 120 and the first sheet patterns NS1 and between the gate electrodes 120 and the second sheet patterns NS2. The gate insulating films 130, which are included in the inner gate structures I_GS, may be in contact with the first source/drain patterns 150 that will be described later.

The gate insulating films 130 may include silicon oxide, silicon oxynitride, silicon nitride, or a high-k material having a greater dielectric constant than silicon oxide. The high-k material may include, for example, one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The gate insulating films 130 are illustrated as being single films, but the present disclosure is not limited thereto. Each of the gate insulating films 130 may include a plurality of films. The gate insulating films 130 may include interfacial films, which are disposed between the first active pattern AP1 and the gate electrodes 120 and between the second active pattern AP2 and the gate electrodes 120, and high-k insulating films. For example, the interfacial films may not be formed along the profile of the upper surface 105US of the field insulating film 105.

The semiconductor device according to some embodiments of the present disclosure may include negative capacitance (NC) FETs (i.e., NC-FETs) using negative capacitors. For example, the gate insulating films 130 may include ferroelectric material films having ferroelectric properties and paraelectric material films having paraelectric properties.

The ferroelectric material films may have a negative capacitance, and the paraelectric material films may have a positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material films having a negative capacitance and the paraelectric material films having a positive capacitance are connected in series, the total capacitance of the ferroelectric material films and the paraelectric material films may increase. Accordingly, transistors having the ferroelectric material films can have a sub-threshold swing (SS) of less than 60 mV/decade at room temperature.

The ferroelectric material films may have ferroelectric properties. The ferroelectric material films may include, for example, at least one of hafnium oxide, hafnium zirconium oxide, barium strontium titanium oxide, barium titanium oxide, and/or lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material films may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and/or tin (Sn). The type of dopant may vary depending on the type of material of the ferroelectric material films.

If the ferroelectric material films include hafnium oxide, the dopant of the ferroelectric material films may include, for example, at least one of Gd, Si, Zr, Al, and/or Y.

If the dopant of the ferroelectric material films is Al, the ferroelectric material films may include 3 atomic % (at %) to 8 at % of Al. Here, the ratio of the dopant in the ferroelectric material films may refer to the ratio of the sum of the amounts of Hf and Al to the amount of Al in the ferroelectric material films.

If the dopant of the ferroelectric material films is Si, the ferroelectric material films may include 2 at % to 10 at % of Si. If the dopant of the ferroelectric material films is Y, the ferroelectric material films may include 2 at % to 10 at % of Y. If the dopant of the ferroelectric material films is Gd, the ferroelectric material films may include 1 at % to 7 at % of Gd. If the dopant of the ferroelectric material films is Zr, the ferroelectric material films may include 50 at % to 80 at % of Zr.

The paraelectric material films may include paraelectric properties. The paraelectric material films may include, for example, at least one of silicon oxide and/or a high-k metal oxide. The high-k metal oxide may include, for example, at least one of hafnium oxide, zirconium oxide, and/or aluminum oxide, but the present disclosure is not limited thereto.

The ferroelectric material films and the paraelectric material films may include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, for example, 0.5 nm to 10 nm, but the present disclosure is not limited thereto. A critical thickness that can exhibit ferroelectric properties may vary depending on the type of ferroelectric material, and thus, the thickness of the ferroelectric material films may vary depending on the type of ferroelectric material included in the ferroelectric material films.

For example, each of the gate insulating films 130 may include one ferroelectric material film. In another example, each of the gate insulating films 130 may include a plurality of ferroelectric material films that are spaced apart from one another. Each of the gate insulating films 130 may have a structure in which a plurality of ferroelectric material films and a plurality of paraelectric material films are alternately stacked.

Gate spacers 140 may be formed on the sidewalls of each of the gate electrodes 120. The gate spacers 140 may not be disposed between the first lower pattern BP1 and the first sheet patterns NS1 and between the first sheet patterns NS1, which are adjacent to one another in the third direction Z.

The gate spacers 140 may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and/or a combination thereof. The gate spacers 140 are illustrated as being single films, but the present disclosure is not limited thereto. For example, in some embodiments, the gate spacers 140 may be multilayer films.

Gate capping patterns 145 may be disposed on the upper surfaces 120US of the gate electrodes 120. Upper surfaces 145US of the gate capping patterns 145 may correspond to the upper surfaces of the gate structures GS. The gate capping patterns 145 may be disposed between the gate spacers 140.

The gate capping patterns 145 may include at least one of, for example, SiN, SiON, silicon carbonitride (SiCN), SiOCN, and/or a combination thereof. The gate capping patterns 145 may include a material having etch selectivity with respect to a first upper interlayer insulating film 190.

The first source/drain patterns 150 may be disposed on the first active pattern AP1. The first source/drain patterns 150 may be disposed on the first lower pattern BP1.

The first source/drain patterns 150 may be disposed between the gate electrodes 120, which are adjacent to one another in the first direction X. The first source/drain patterns 150 may be in contact with the first active pattern AP1. The first source/drain patterns 150 may be in contact with the first sheet patterns NS1. The first source/drain patterns 150 may be connected to the first sheet patterns NS1, on the first surface 100US of the substrate 100.

Each of the first source/drain patterns 150 may have a bottom surface 150BS, which faces the first lower pattern BP1, and sidewalls 150SW, which extend from the bottom surface 150BS in the third direction Z. The bottom surface 150BS may be connected to the first lower pattern BP1. Each of the sidewalls 150SW may include a facet intersection between inclined surfaces, but the present disclosure is not limited thereto.

The second source/drain patterns 250 may be disposed on the second active pattern AP2. The second source/drain patterns 250 may be disposed on the second lower pattern BP2.

The second source/drain patterns 250 may be disposed between the gate electrodes 120, which are adjacent to each other in the first direction X. The second source/drain patterns 250 may be in contact with the second active pattern AP2. Although not specifically illustrated, the second source/drain patterns 250 may be in contact with the second sheet patterns NS2. The second source/drain patterns 250 may be connected to the second sheet patterns NS2, on the first surface 100US of the substrate 100.

Each of the second source/drain patterns 250 may have a bottom surface 250BS, which faces the second lower pattern BP2, and sidewalls 250SW, which extend from the bottom surface 250BS in the third direction Z. The bottom surface 250BS may be connected to the second lower pattern BP2. Each of the sidewalls 250SW may include a facet intersection between inclined surfaces, but the present disclosure is not limited thereto.

The first source/drain patterns 150 may be included in the source/drain of a transistor using the first sheet patterns NS1 as a channel region. The second source/drain patterns 250 may be included in the source/drain of a transistor using the second sheet patterns NS2 as a channel region.

The first source/drain patterns 150 and the second source/drain patterns 250 may include epitaxial patterns. The first source/drain patterns 150 and the second source/drain patterns 250 may include a semiconductor material.

For example, the first source/drain patterns 150 and the second source/drain patterns 250 may include a p-type dopant. The p-type dopant may include at least one of boron (B) and/or Ga, but the present disclosure is not limited thereto. In another example, the first source/drain patterns 150 and the second source/drain patterns 250 may include an n-type dopant. The n-type dopant may include at least one of P, As, Sb, and/or bismuth (Bi), but the present disclosure is not limited thereto. In another example, the first source/drain patterns 150 and the second source/drain patterns 250 may include the p-type dopant and the n-type dopant, respectively, or vice versa.

The source/drain etch stopper film 185 may extend along the outer sidewalls of the gate spacers 140, the sidewalls 150SW of each of the first source/drain patterns 150, and the sidewalls of each of the second source/drain patterns 250. The source/drain etch stopper film 185 may extend along the upper surface 105US of the field insulating film 105.

The source/drain etch stopper film 185 may not extend along the sidewalls of each of the gate capping patterns 145. In some embodiments, the source/drain etch stopper film 185 may extend along the sidewalls of each of the gate capping patterns 145.

The source/drain etch stopper film 185 may include a material with etch selectivity with respect to the first upper interlayer insulating film 190 that will be described later. The source/drain etch stopper film 185 may include at least one of, for example, SiN, SiON, SiOCN, SiBN, SiOBN, SiOC, and/or a combination thereof.

The first upper interlayer insulating film 190 is disposed on the first surface 100US of the substrate 100. The first upper interlayer insulating film 190 may be disposed on the first source/drain patterns 150 and the second source/drain patterns 250. The first upper interlayer insulating film 190 may not cover or may not be on the upper surfaces of the gate capping patterns 145.

The first upper interlayer insulating film 190 may include at least one of, for example, silicon oxide, silicon nitride, silicon oxynitride, and/or a low-k material. The low-k material may have a dielectric constant less than 3.9, which is the dielectric constant of silicon oxide.

The first source/drain contacts 170 may be disposed on the first surface 100US of the substrate 100. The first source/drain contacts 170 may be disposed on the first source/drain patterns 150. The first source/drain contacts 170 may be electrically connected to the first source/drain patterns 150.

The first source/drain contacts 170 may include a first rear connection contact 170_1 and a first front connection contact 170_2. The first rear connection contact 170_1 may be connected to the buried conductive pattern 70 via the contact connection via 180. The first front connection contact 170_2 may not be in contact with the contact connection via 180. The first front connection contact 170_2 may not be connected to the contact connection via 180.

The second source/drain contacts 270 may be disposed on the first surface 100US of the substrate 100. The second source/drain contacts 270 may be disposed on the second source/drain patterns 250. The second source/drain contacts 270 may be electrically connected to the second source/drain patterns 250. The second source/drain contacts 270 may be spaced apart from the first source/drain contacts 170 in the second direction Y.

Although not specifically illustrated, the second source/drain contacts 270 may include a second rear connection contact and a second front connection contact.

The height from the upper surface AP1_US of the first active pattern AP1 to upper surfaces 170US of the first source/drain contacts 170 may be the same as the height from the upper surface AP1_US of the first active pattern AP1 to the upper surfaces 145US of the gate capping patterns 145. The upper surfaces 170US of the first source/drain contacts 170 may be disposed on the same plane as (i.e., may be coplanar with) upper surfaces 270US of the second source/drain contacts 270. The first upper interlayer insulating film 190 may not cover or may not be on the upper surfaces 170US of the first source/drain contacts 170 and the upper surfaces 270US of the second source/drain contacts 270.

A gate contact 175 is disposed on the gate electrodes 120. The gate contact 175 may be connected to the upper surfaces 120US of the gate electrodes 120. The gate contact 175 may penetrate or extend in the gate capping patterns 145.

The gate electrodes 120 may be connected to the gate contact 175 and to front wiring lines 197 via a front wiring via 196. The gate electrodes 120 may be connected to the front wiring lines 197 via the gate contact 175, in which case, part of the gate contact 175 may protrude in the third direction Z beyond the upper surfaces 145US of the gate capping patterns 145.

First contact silicide films 155 may be disposed between the first source/drain contacts 170 and the first source/drain patterns 150. Second contact silicide films 255 may be disposed between the second source/drain contacts 270 and the second source/drain patterns 250.

The first source/drain contacts 170 and the second source/drain contacts 270 are illustrated as having a single conductive film structure, but the present disclosure is not limited thereto. The first source/drain contacts 170 and the second source/drain contacts 270 may have a multilayer conductive film structure including a contact barrier film and a contact plug film.

The first source/drain contacts 170 and the second source/drain contacts 270 may include at least one of, for example, a metal, a metal alloy, a conductive metal nitride, a conductive metal carbide, a conductive metal oxide, a conductive metal carbonitride, and/or a two-dimensional (2D) material. The first contact silicide films 155 and the second contact silicide films 255 may include a metal silicide material.

The 2D material may include a 2D allotrope or a 2D compound such as at least one of, for example, graphene, boron nitride (BN), molybdenum sulfide, molybdenum selenide, tungsten sulfide, tungsten selenide, and/or tantalum sulfide, but the present disclosure is not limited thereto. The 2D material, however, is merely example and is not particularly limited.

The contact connection via 180 may be disposed between the first source/drain contacts 170 and the second source/drain contacts 270. The contact connection via 180 may extend in the third direction Z.

The contact connection via 180 may be connected to the first source/drain contacts 170. The contact connection via 180 may be connected to the first rear connection contact 170_1. For example, the contact connection via 180 may be electrically connected to the first rear connection contact 170_1. The contact connection via 180 may not be connected to the second source/drain contacts 270. For example, the contact connection via 180 may not be electrically connected to the second source/drain contacts 270.

An upper surface 180US of the contact connection via 180 may be higher than the upper surfaces 170US of the first source/drain contacts 170 and the upper surfaces 270US of the second source/drain contacts 270. For example, a height H12 from the bottom surfaces 150BS of the first source/drain patterns 150 to the upper surface 180US of the contact connection via 180 may be greater than a height H11 from the bottom surfaces 150BS of the first source/drain patterns 150 to the upper surfaces 170US of the first source/drain contacts 170.

The contact connection via 180 may include upper and lower portions 180U and 180B. For example, the upper and lower portions 180U and 180B of the contact connection via 180 may be divided from each other by the upper surfaces 170US of the first source/drain contacts 170. For example, an interface between the upper and lower portions 180U and 180B of the contact connection via 180 may be coplanar with the upper surfaces 170US of the first source/drain contacts 170.

There is no physical boundary between the upper and lower portions 180U and 180B of the contact connection via 180. The upper and lower portions 180U and 180B of the contact connection via 180 may have an integral structure.

The upper portion 180U of the contact connection via 180 may protrude in the third direction Z beyond the upper surfaces 170US of the first source/drain contacts 170. The upper portion 180U of the contact connection via 180 may include the upper surface 180US of the contact connection via 180.

For example, part of the upper portion 180U of the contact connection via 180 may extend along the upper surfaces 170US of the first source/drain contacts 170. The upper portion 180U of the contact connection via 180 may be in contact with the upper surfaces 170US of the first source/drain contacts 170. The first source/drain contacts 170 may be directly connected to the contact connection via 180.

Referring to FIGS. 4 and 8, the upper portion 180U of the contact connection via 180 may include first and second sidewalls 180U_SW1 and 180U_SW2, which are opposite to each other in the second direction Y. The first sidewall 180U_SW1 may be inclined in the same direction as the second sidewall 180U_SW2. The sign of the slope of the first sidewall 180U_SW1 may be the same as the sign of the slope of the second sidewall 180U_SW2. For example, a gradient of the first sidewall 180U_SW1 may be the same as a gradient of the second sidewall 180U_SW2.

The lower portion 180B of the contact connection via 180 may be disposed between the upper portion 180U of the contact connection via 180 and the buried conductive pattern 70. The lower portion 180B of the contact connection via 180 may pass or extend between the first source/drain contacts 170 and the second source/drain contacts 270. The lower portion 180B of the contact connection via 180 may pass or extend between the first source/drain patterns 150 and the second source/drain patterns 250.

The contact connection via 180 may penetrate or extend into the first upper interlayer insulating film 190, the source/drain etch stopper film 185, and the field insulating film 105. The contact connection via 180 may have the upper and bottom surfaces 180US and 180BS, which are opposite to each other in the third direction Z. The lower portion 180B of the contact connection via 180 may include the bottom surface 180BS of the contact connection via 180.

Referring to FIG. 4, the lower portion 180B of the contact connection via 180 may include sidewalls 180SW, which extend in the third direction Z. The contact connection via 180 may include the sidewalls 180SW in the lower portion 180B.

The sign of the slope of a sidewall 180SW facing the first source/drain patterns 150 may be opposite to the sign of the slope of a sidewall 180SW facing the second source/drain patterns 250. For example, the width, in the second direction Y, of the lower portion 180B of the contact connection via 180 may increase away from the second surface 100BS of the substrate 100. For example, the width, in the second direction Y, of the lower portion 180B of the contact connection via 180 may increase when moving away from the bottom surface 180BS of the contact connection via 180.

The bottom surface 180BS of the contact connection via 180, which is in contact with the buried conductive pattern 70, may be lower than the first surface 100US of the substrate 100. A height H2 from the second surface 100BS of the substrate 100 to the bottom surface 180BS of the contact connection via 180 may be less than a thickness t1, in the third direction Z, of the substrate 100. The thickness t1, in the third direction Z, of the substrate 100 may correspond to the height from the second surface 100BS to the first surface 100US of the substrate 100. For example, the bottom surface 180BS of the contact connection via 180 may include the lowermost portion of the contact connection via 180. The bottom surface 180BS of the contact connection via 180 is illustrated as being flat, but the present disclosure is not limited thereto.

Via insulating liners 181 may extend along the sidewalls of the contact connection via 180. For example, the via insulating liners 181 may extend along the sidewalls 180SW of the lower portion 180B of the contact connection via 180. The via insulating liners 181 may not extend to the upper surface 180US of the contact connection via 180. For example, the via insulating liners 181 may not extend along the first and second sidewalls 180U_SW1 and 180U_SW2 of the upper portion 180U of the contact connection via 180.

The via insulating liners 181 may be disposed between the contact connection via 180 and the first source/drain contacts 170 and between the contact connection via 180 and the second source/drain contacts 270. For example, the via insulating liners 181 may be disposed between the lower portion 180B of the contact connection via 180 and the first source/drain contacts 170 and between the lower portion 180B of the contact connection via 180 and the second source/drain contacts 270. The via insulating liners 181 are in contact with the first source/drain contacts 170 and the second source/drain contacts 270.

Part of the contact connection via 180 may protrude in the third direction Z beyond uppermost portions 181UMP of the via insulating liners 181. For example, a portion of the contact connection via 180 may protrude in the third direction Z beyond the uppermost portions 181UMP of the via insulating liners 181. For example, the upper portion 180U of the contact connection via 180 may cover or be on the uppermost portions 181UMP of the via insulating liners 181. For example, the upper portion 180U of the contact connection via 180 may be in contact with the uppermost portions 181UMP of the via insulating liners 181.

The contact connection via 180 may include at least one of, for example, a metal, a metal alloy, a conductive metal nitride, a conductive metal carbide, a conductive metal oxide, a conductive metal carbonitride, and/or a 2D material. The via insulating liners 181 may be formed of an insulating material.

The buried conductive pattern 70 may be disposed between the first and second active patterns AP1 and AP2. The buried conductive pattern 70 may overlap with part of the field insulating film 105 between the first and second lower patterns BP1 and BP2, in the third direction Z. As used herein, "an element A overlaps with an element B in a direction X" (or similar language) means that there is at least one line that extends in the direction X and intersects both the elements A and B.

The buried conductive pattern 70 may extend in the first direction X. In a plan view, the buried conductive pattern 70 may intersect the gate electrodes 120. Parts of the buried conductive pattern 70 may overlap with the gate electrodes 120 in the third direction Z. The buried conductive pattern 70 may be formed as a line.

The buried conductive pattern 70 is connected to the contact connection via 180. The buried conductive pattern 70 may be connected to the first rear connection contact 170_1 via the contact connection via 180. The buried conductive pattern 70 may be connected to the rear wiring line 50.

The buried conductive pattern 70 may be disposed in the substrate 100. The buried conductive pattern 70 may extend from the second surface 100BS of the substrate 100 toward the first surface 100US of the substrate 100. The buried conductive pattern 70 may be disposed in a buried pattern trench 70T.

The buried conductive pattern 70 may have first and second surfaces 70_S1 and 70_S2, which are opposite to each other in the third direction Z. The first surface 70_S1 of the buried conductive pattern 70 may be the upper surface of the buried conductive pattern 70. The second surface 70_S2 of the buried conductive pattern 70 may be the bottom or lower surface of the buried conductive pattern 70.

The first surface 70_S1 of the buried conductive pattern 70 may face the first source/drain contacts 170 and the contact connection via 180. The first surface 70_S1 of the buried conductive pattern 70 may be in contact with the contact connection via 180. The bottom surface 180BS of the contact connection via 180 is connected to the first surface 70_S1 of the buried conductive pattern 70. The second surface 70_S2 of the buried conductive pattern 70 is connected to the rear wiring line 50 that will be described later.

The width, in the second direction Y, of the buried conductive pattern 70 decreases away from the second surface 100BS of the substrate 100. The width, in the second direction Y, of the second surface 70_S2 of the buried conductive pattern 70 may be greater than the width, in the second direction Y, of the first surface 70_S1 of the buried conductive pattern 70.

The buried pattern trench 70T may be included in the substrate 100. The buried pattern trench 70T may extend in the first direction X in the substrate 100. The buried pattern trench 70T may extend from the second surface 100BS toward the first surface 100US of the substrate 100. The opening of the buried pattern trench 70T may be positioned on the second surface 100BS of the substrate 100.

The buried pattern trench 70T may include sidewalls 70T_S and a bottom surface 70T_B. Referring to FIGS. 4 through 7, the sidewalls 70T_S and the bottom surface 70T_B of the buried pattern trench 70T may be divided from one another by the closest point in the region where the first buried insulating liner 71 is in contact with the contact connection via 180 to the second surface 100BS of the substrate 100. The sidewalls 70T_S and the bottom surface 70T_B of the buried pattern trench 70T may be divided from one another by the bottom surface 180BS of the contact connection via 180.

The sidewalls 70T_S of the buried pattern trench 70T may be inclined planes defined by the substrate 100. The width between the sidewalls 70T_S of the buried pattern trench 70T, which are opposite to each other in the second direction Y, may decrease away from the second surface 100BS of the substrate 100.

Referring to FIGS. 5 through 7, the bottom surface 70T_B of the buried pattern trench 70T may include a first concave area 70T_BCV1 and a second concave area 70T_BCV2. The first and second concave areas 70T_BCV1 and 70T_BCV2 may be defined by, for example, the substrate 100 and the via insulating liners 181.

The first and second concave areas 70T_BCV1 and 70T_BCV2 may have a concave shape. The width, in the second direction Y, of the first concave area 70T_BCV1 may decrease away from the second surface 100BS of the substrate 100.

The first buried insulating liners 71 may extend along the sidewalls 70SW and the first surface 70_S1 of the buried conductive pattern 70. The first buried insulating liners 71 do not extend along the bottom surface 180BS of the contact connection via 180. The first buried insulating liners 71 do not cover the bottom surface 180BS of the contact connection via 180.

The first buried insulating liners 71 may extend along the sidewalls 70T_S and the bottom surface 70T_B of the buried pattern trench 70T. The first buried insulating liners 71 may extend along the first and second concave areas 70T_BCV1 and 70T_BCV2 of the bottom surface 70T_B of the buried pattern trench 70T. For example, the first buried insulating liners 71 may fill or be in at least part of the first concave area 70T_BCV1 of the bottom surface 70T_B of the buried pattern trench 70T. The first buried insulating liners 71 may also fill or be in at least part of the second concave area 70T_BCV2 of the bottom surface 70T_B of the buried pattern trench 70T.

Referring to FIGS. 4 through 7, the first buried insulating liners 71 may include sidewall portions 71SW and first and second curved portions 71CP1 and 71CP2. The first and second curved portions 71CP1 and 71CP2 of the first buried insulating liners 71 are spaced apart from each other in the second direction Y. The first curved portion 71CP1 may be directly connected to the sidewall portions 71SW. The second curved portion 71CP2 may be directly connected to the sidewall portions 71SW.

The contact connection via 180 may be disposed between the first and second curved portions 71CP1 and 71CP2 of the first buried insulating liners 71. The contact connection via 180 may pass or extend between the first and second curved portions 71CP1 and 71CP2 of the first buried insulating liners 71.

The sidewall portions 71SW of the first buried insulating liners 71 may be disposed on the 70SW sidewalls of the buried conductive pattern 70. The sidewall portions 71SW of the first buried insulating liners 71 may extend along the sidewalls 70T_S of the buried pattern trench 70T.

The first and second curved portions 71CP1 and 71CP2 of the first buried insulating liners 71 may be disposed on the first surface 70_S1 of the buried conductive pattern 70. The first curved portion 71CP1 may fill or be in at least part of the first concave area 70T_BCV1 of the bottom surface 70T_B of the buried pattern trench 70T. The second curved portion 71CP2 may fill or be in at least part of the second concave area 70T_BCV2 of the bottom surface 70T_B of the buried pattern trench 70T.

The first curved portion 71CP1 may include an outer surface 71CP1_OS, which is in contact with the substrate 100 and the via insulating liners 181. The second curved portion 71CP2 may include an outer surface 71CP2_OS, which is in contact with the substrate 100 and the via insulating liners 181. The outer surfaces 71CP1_OS and 71CP2_OS may include convex surfaces. For example, the outer surfaces 71CP1_OS and 71CP2_OS may be convex surfaces. For example, the outer surfaces 71CP1_OS and 71CP2_OS may have a convex shape.

The first and second curved portions 71CP1 and 71CP2 of the first buried insulating liners 71 may include inner surfaces, which face the buried conductive pattern 70. For example, the inner surfaces of the first and second curved portions 71CP1 and 71CP2 may be in contact with the buried conductive pattern 70. Referring to FIG. 5, the inner surfaces of the first and second curved portions 71CP1 and 71CP2 may be curved. Referring to FIG. 6, the inner surfaces of the first and second curved portions 71CP1 and 71CP2 may be flat or straight.

Referring to FIGS. 5 and 6, the first and second curved portions 71CP1 and 71CP2 of the first buried insulating liners 71 may not include seam patterns or airgaps. Referring to FIG. 7, the first and second curved portions 71CP1 and 71CP2 of the first buried insulating liners 71 may include seam patterns 71_SE, which extend in the third direction Z, or airgaps.

For example, a thickness t21 of the first buried insulating liners 71 on the sidewalls 70SW of the buried conductive pattern 70 may be less than a thickness t22 of the first buried insulating liners 71 on the first surface 70_S1. In other words, the thickness t21 of the sidewall portions 71SW of the first buried insulating liners 71 may be less than the thickness t22 of the first and second curved portions 71CP1 and 71CP2 of the first buried insulating liners 71. For example, a thickness t21 of a first portion of at least one of the first buried insulating liners 71 that is on a respective one of the sidewalls 70SW of the buried conductive pattern 70 may be less than a thickness t22 of a second portion of the at least one of the first buried insulating liners 71 that is on the first surface 70_S1 of the buried conductive pattern 70.

At least one of the first and second concave areas 70T_BCV1 and 70T_BCV2 of the buried pattern trench 70T may extend to the first surface 100US of the substrate 100. In other words, the first buried insulating liners 71 may be in contact with the field insulating film 105.

The buried conductive pattern 70 may be disposed on the first buried insulating liners 71, in the buried pattern trench 70T. The buried conductive pattern 70 may be in contact with the first buried insulating liners 71. The buried conductive pattern 70 may be in contact with the sidewall portions 71SW and the first and second curved portions 71CP1 and 71CP2 of the first buried insulating liners 71.

The bottom surface 180BS of the contact connection via 180 may be in contact with the buried conductive pattern 70. For example, referring to FIG. 4, the sidewalls 180SW of the contact connection via 180 may not be in contact with the buried conductive pattern 70.

The first and second curved portions 71CP1 and 71CP2 of the first buried insulating liners 71 may be disposed on the first surface 70_S1 of the buried conductive pattern 70 so that the buried conductive pattern 70 may not be in contact with the substrate 100. That is, the buried conductive pattern 70 may be electrically insulated from the substrate 100. Accordingly, the performance and reliability of the semiconductor device according to some embodiments of the present disclosure can be improved.

Referring to FIGS. 3 and 4, the thickness, in the third direction Z, of the buried conductive pattern 70 may vary.

For example, the thickness of the buried conductive pattern 70 of FIG. 3 may be greater than the thickness of the buried conductive pattern 70 of FIG. 4 due to the presence of the first and second curved portions 71CP1 and 71CP2 of the first buried insulating liners 71 and the contact connection via 180.

The buried conductive pattern 70 is illustrated as having a single conductive film structure, but the present disclosure is not limited thereto. The buried conductive pattern 70 may have a multilayer conductive film structure including a buried conductive barrier film and a buried conductive plug film. The buried conductive pattern 70 may include at least one of, for example, a metal, a metal alloy, a conductive metal nitride, a conductive metal carbide, a conductive metal oxide, a conductive metal carbonitride, and/or a 2D material. The first buried insulating liners 71 may be formed of an insulating material.

The rear wiring line 50 may be disposed on the second surface 100BS of the substrate 100. For example, the rear wiring line 50 may extend in the second direction Y, but the present disclosure is not limited thereto.

The rear wiring line 50 is connected to the buried conductive pattern 70. The rear wiring line 50 may be connected to the first rear connection contact 170_1 via the buried conductive pattern 70. The first rear connection contact 170_1 connects the rear wiring line 50 and the first source/drain patterns 150. The first front connection contact 170_2 is not connected to the rear wiring line 50.

For example, the rear wiring line 50 may be a power line supplying power to the semiconductor device according to some embodiments of the present disclosure. In another example, the rear wiring line 50 may be a signal line providing an operating signal to the semiconductor device according to some embodiments of the present disclosure.

A rear wiring via 55 may be disposed between the rear wiring line 50 and the buried conductive pattern 70. The rear wiring via 55 connects the rear wiring line 50 and the buried conductive pattern 70. The rear wiring via 55 may not be disposed between the rear wiring line 50 and the buried conductive pattern 70.

The rear wiring line 50 and the rear wiring via 55 are illustrated as having a single conductive film structure, but the present disclosure is not limited thereto. At least one of the rear wiring line 50 or the rear wiring via 55 may have a multilayer conductive film structure including a rear wiring barrier film and a rear wiring plug film.

The rear wiring line 50 and the rear wiring via 55 may include at least one of, for example, a metal, a metal alloy, a conductive metal nitride, a conductive metal carbide, a conductive metal oxide, a conductive metal carbonitride, and/or a 2D material. The rear wiring line 50 and the rear wiring via 55 are illustrated as having a physical boundary therebetween, but the present disclosure is not limited thereto. The rear wiring line 50 and the rear wiring via 55 may have an integral structure with no physical boundary therebetween.

A lower interlayer insulating film 290 may be disposed on the second surface 100BS of the substrate 100. The rear wiring line 50 and the rear wiring via 55 may be disposed in the lower interlayer insulating film 290. The lower interlayer insulating film 290 may include at least one of, for example, silicon oxide, silicon nitride, silicon carbonitride, silicon oxynitride, and/or a low-k material.

A first upper etch stopper film 193 may be disposed on the first upper interlayer insulating film 190. The first upper etch stopper film 193 may be disposed on the upper surfaces 145US of the gate capping patterns 145, the upper surfaces 170US of the first source/drain contacts 170, and the upper surfaces 270US of the second source/drain contacts 270.

A second upper interlayer insulating film 191 may be disposed on the first upper interlayer insulating film 190. The first upper etch stopper film 193 is disposed between the first upper interlayer insulating film 190 and the second upper interlayer insulating film 191.

A second upper etch stopper film 194 and a third upper interlayer insulating film 192 may be sequentially disposed on the second upper interlayer insulating film 191. The second upper etch stopper film 194 may be disposed between the second and third upper interlayer insulating films 191 and 192.

The first and second upper etch stopper films 193 and 194 may include at least one of, for example, SiN, SiON, SiOCN, SiBN, SiOBN, SiOC, aluminum oxide (AlO), aluminum nitride (AlN), aluminum oxycarbide (AlOC), and/or a combination thereof. The second and third upper interlayer insulating films 191 and 192 may include at least one of, for example, silicon oxide, silicon nitride, silicon carbonitride, silicon oxynitride, and/or a low-k material.

The front wiring structure 195 is disposed on the first surface 100US of the substrate 100. The front wiring structure 195 may include the front wiring via 196 and a front wiring line 197.

The front wiring structure 195 may be connected to the first source/drain contacts 170, the second source/drain contacts 270, and the gate contact 175. For example, the front wiring structure 195 may be connected to the first front connection contact 170_2. The first front connection contact 170_2 may connect the front wiring structure 195 and the first source/drain patterns 150. The front wiring structure 195 may not be connected to the first rear connection contact 170_1.

The front wiring via 196 may be disposed in the second upper interlayer insulating film 191. The front wiring via 196 may be connected to the first source/drain contacts 170, the second source/drain contacts 270, and the gate contact 175 through the first upper etch stopper film 193.

The second upper interlayer insulating film 191 may cover or be on sidewalls 196SW (see FIG. 4) of the front wiring via 196. The width of the front wiring via 196 may increase away from the first surface 100US of the substrate 100. The front wiring via 196 may be in contact with the upper surfaces 170US of the first source/drain contacts 170 and the upper surfaces 270US of the second source/drain contacts 270.

The height from the upper surfaces 170US of the first source/drain contacts 170 to the upper surface 196US of the front wiring via 196 may be the same as the height from the upper surfaces 170US of the first source/drain contacts 170 to the upper surface 180US of the contact connection via 180. For example, the upper surface 196US of the front wiring via 196 may be disposed on the same plane as (e.g., may be coplanar with) the upper surface 180US of the contact connection via 180.

The front wiring line 197 may be disposed in the third upper interlayer insulating film 192. The front wiring line 197 may be connected to the first source/drain contacts 170, the second source/drain contacts 270, and the gate contact 175. The front wiring line 197 may be connected to the first source/drain contacts 170, the second source/drain contacts 270, and the gate contact 175 via the front wiring via 196. The front wiring line 197 may be connected to the front wiring via 196 through the second upper etch stopper film 194.

The front wiring via 196 and the front wiring line 197 may include at least one of, for example, a metal, a metal alloy, a conductive metal nitride, a conductive metal carbide, a conductive metal oxide, a conductive metal carbonitride, and/or a 2D material.

The front wiring via 196 and the front wiring line 197 are illustrated as having a single conductive film structure, but the present disclosure is not limited thereto. In some embodiments, at least one of the front wiring via 196 or the front wiring line 197 may have a multilayer conductive film structure. The front wiring structure 195 may have an integral structure with no physical boundary between the front wiring via 196 and the front wiring line 197.

Figure 9:
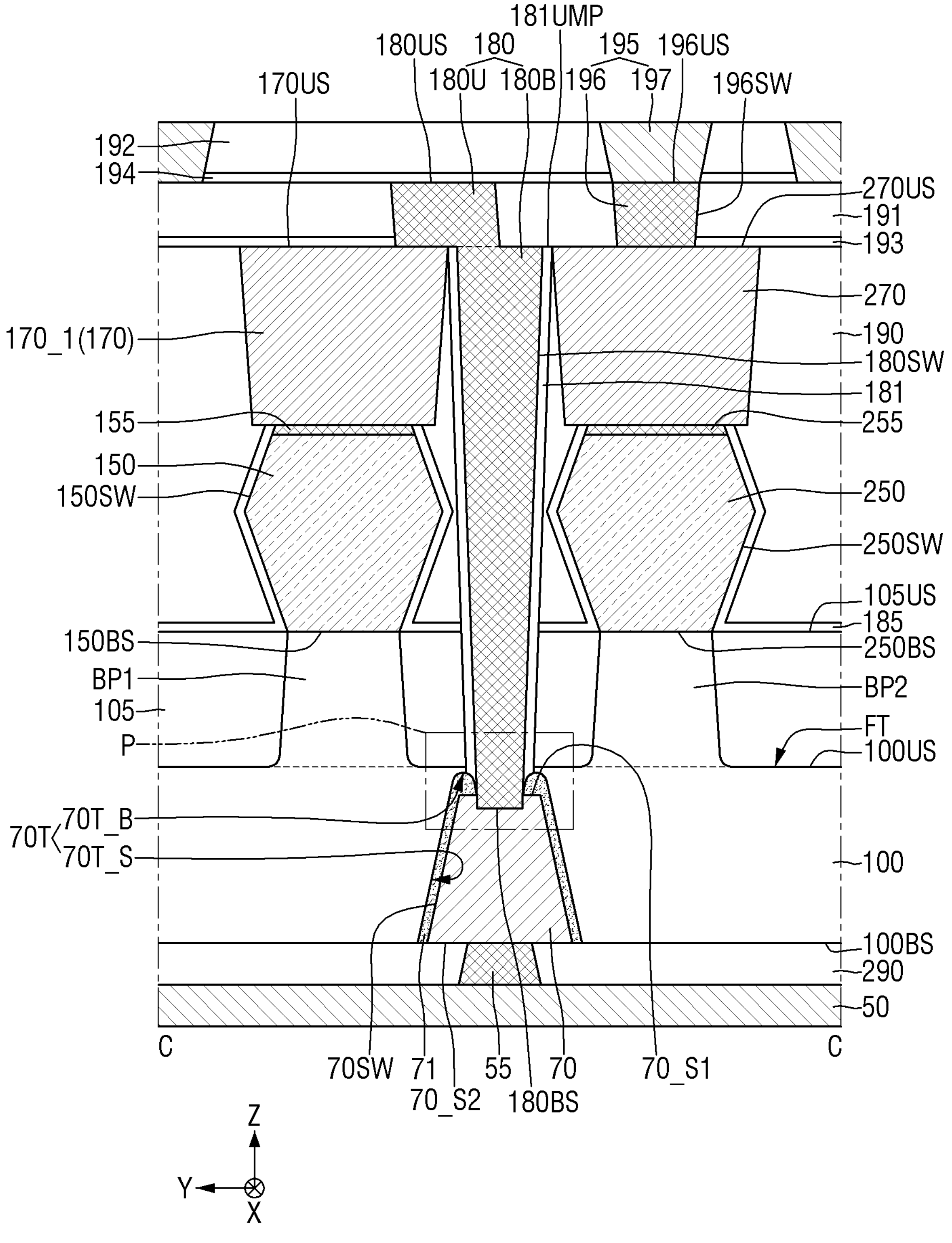
FIGS. 9 and 10 are cross-sectional views of a semiconductor device according to some embodiments of the present disclosure.
Figure 10:
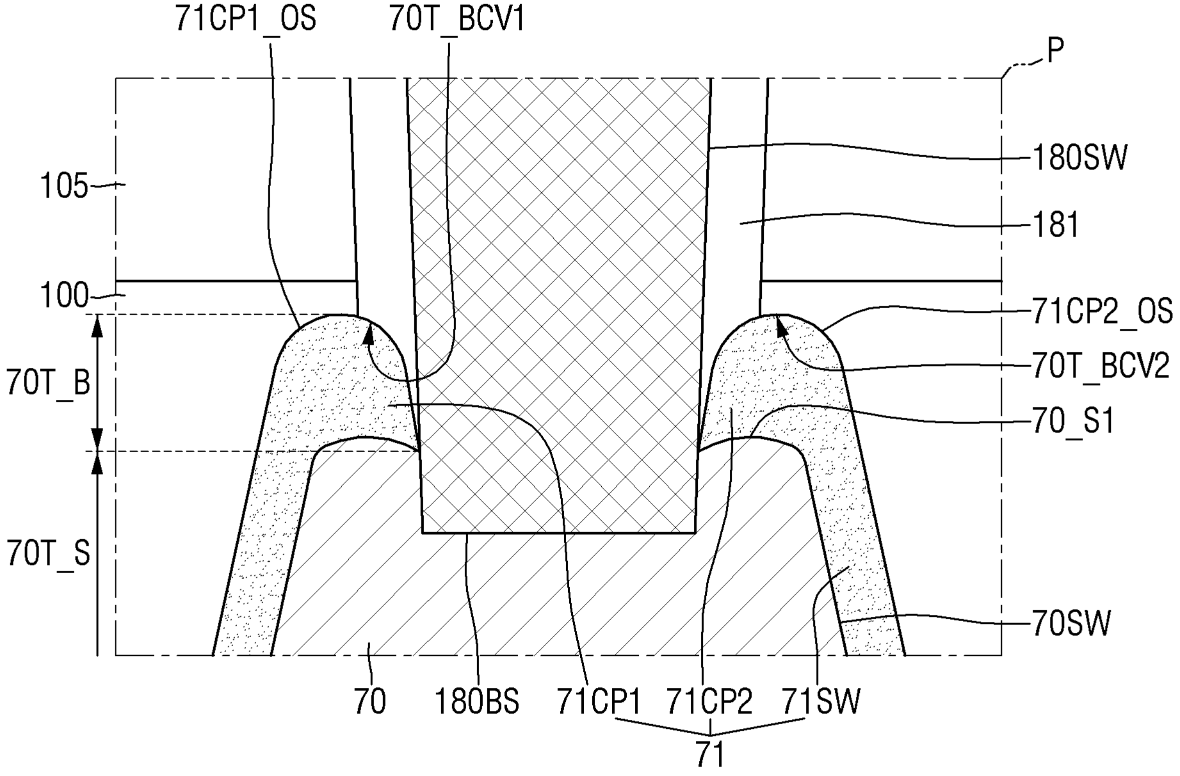
Figure 11:
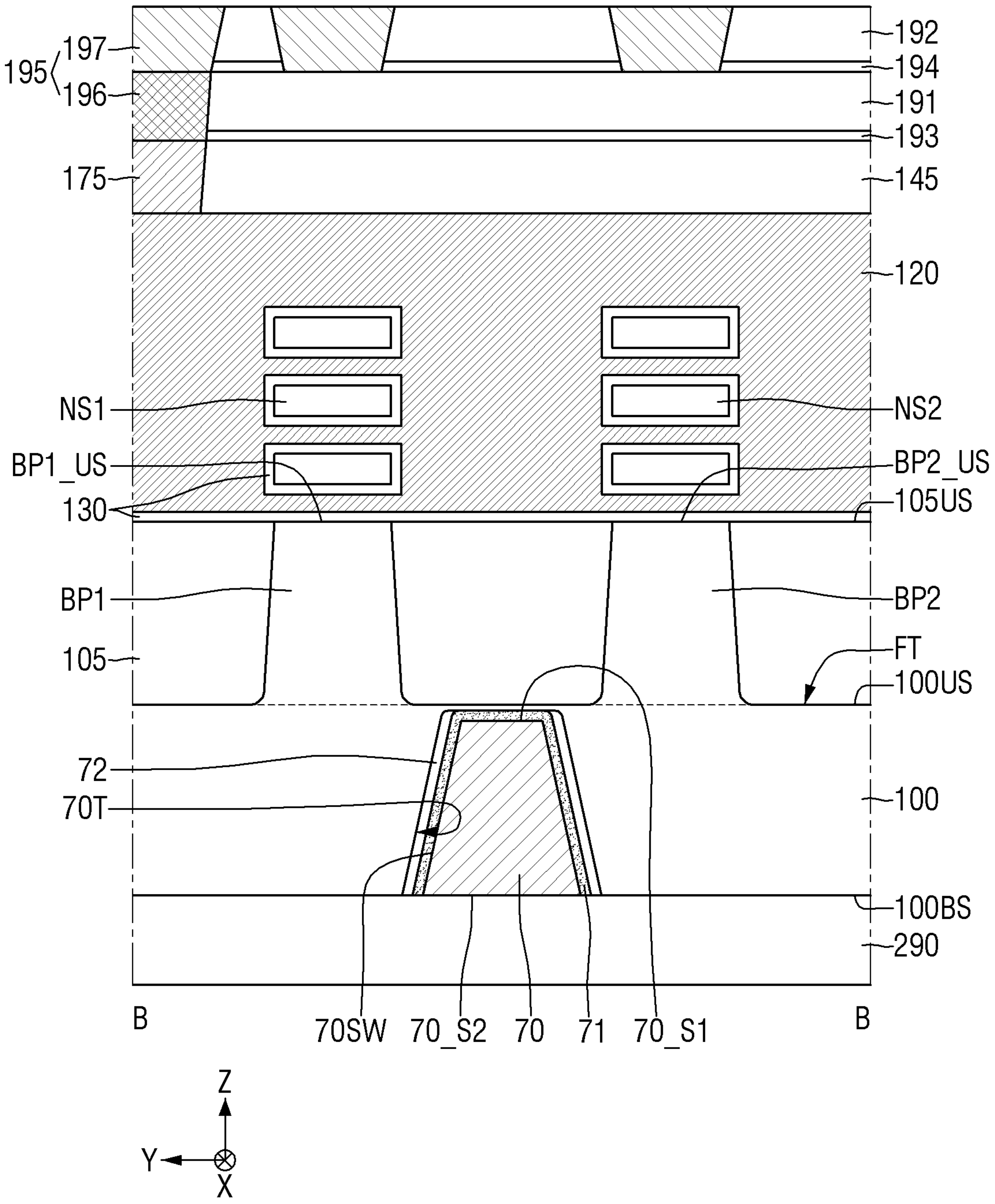
FIGS. 11 and 12 are cross-sectional views of a semiconductor device according to some embodiments of the present disclosure.
Figure 12:
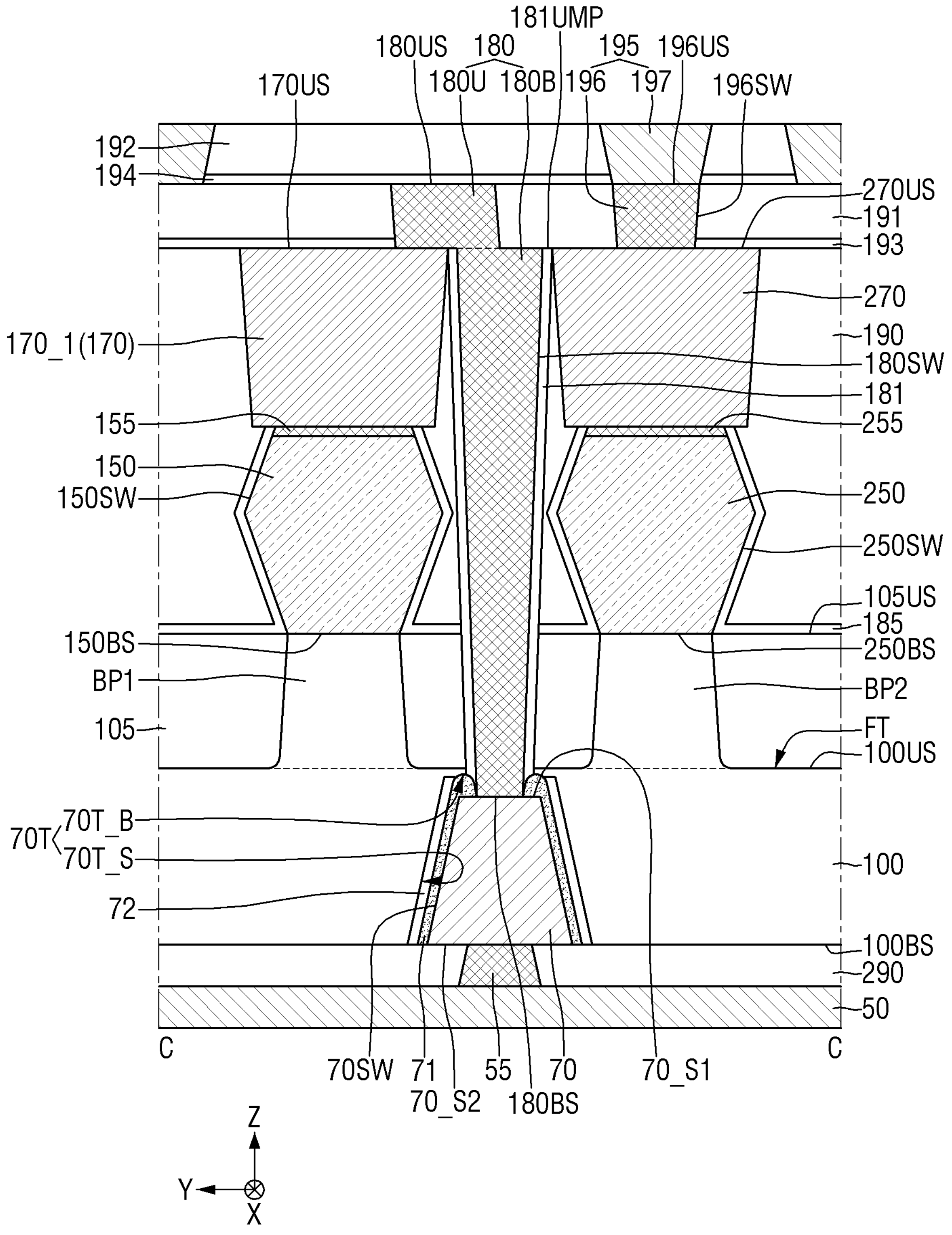
Figure 13:
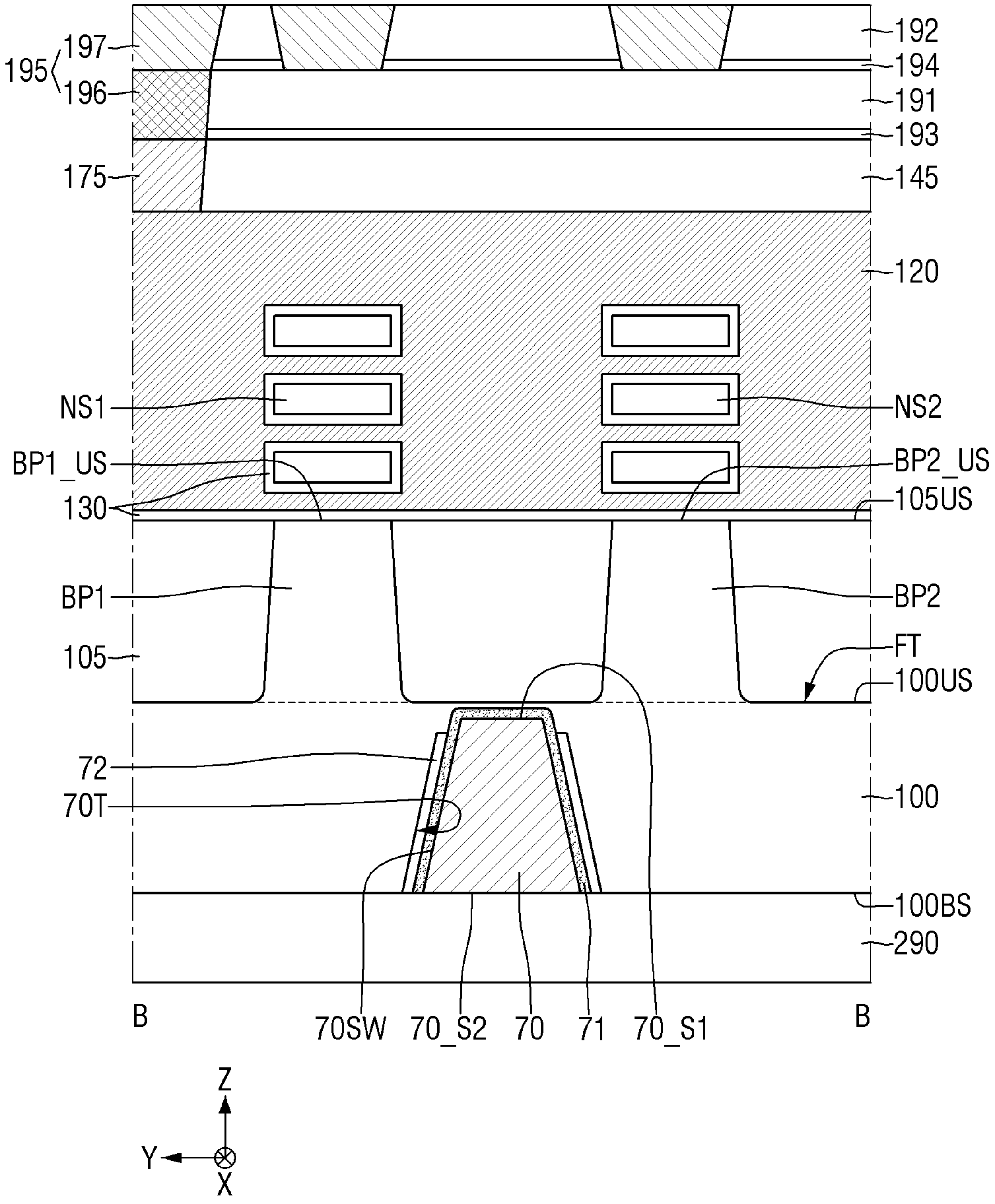
FIGS. 13 and 14 are cross-sectional views of a semiconductor device according to some embodiments of the present disclosure.
Figure 14:
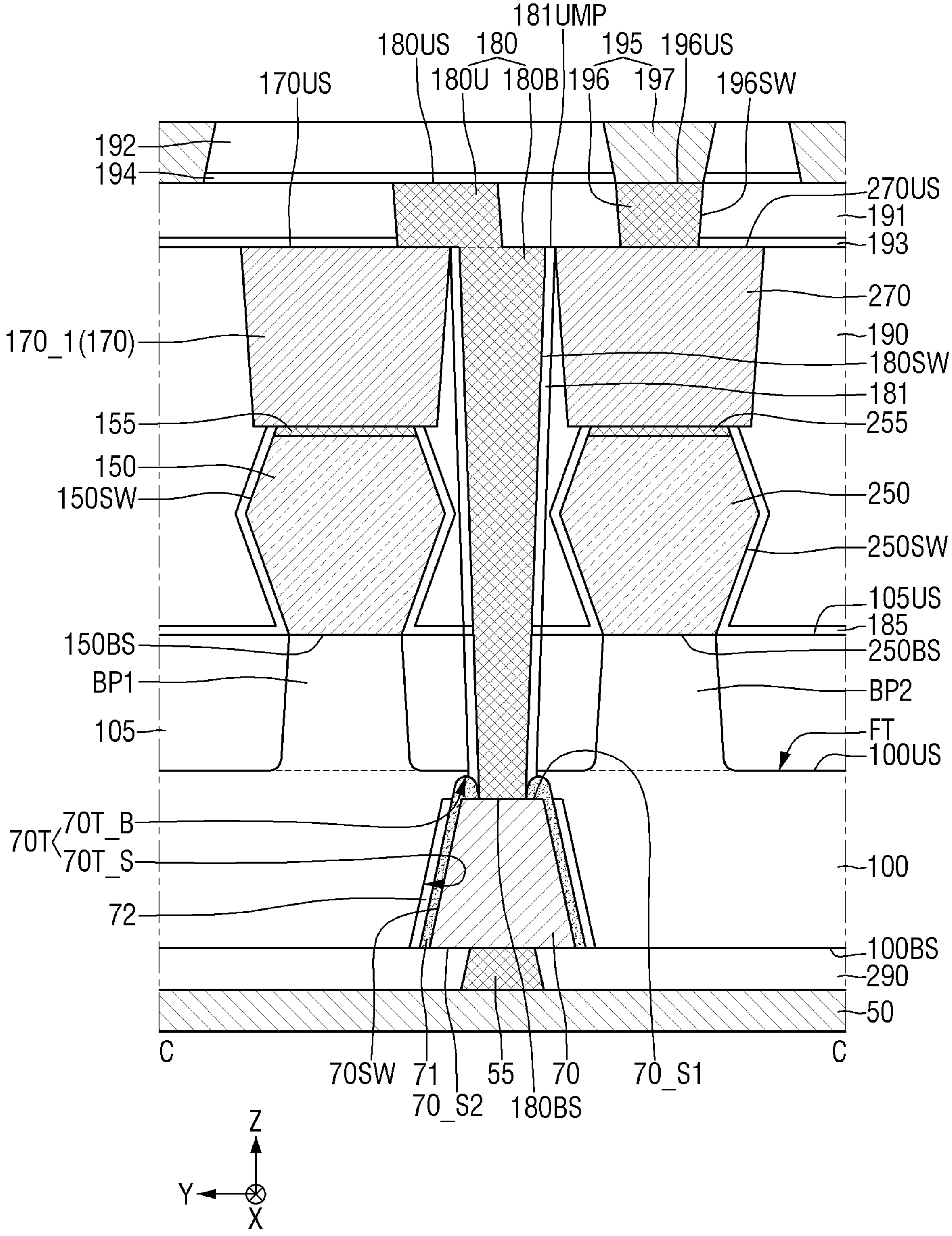
Figure 15:
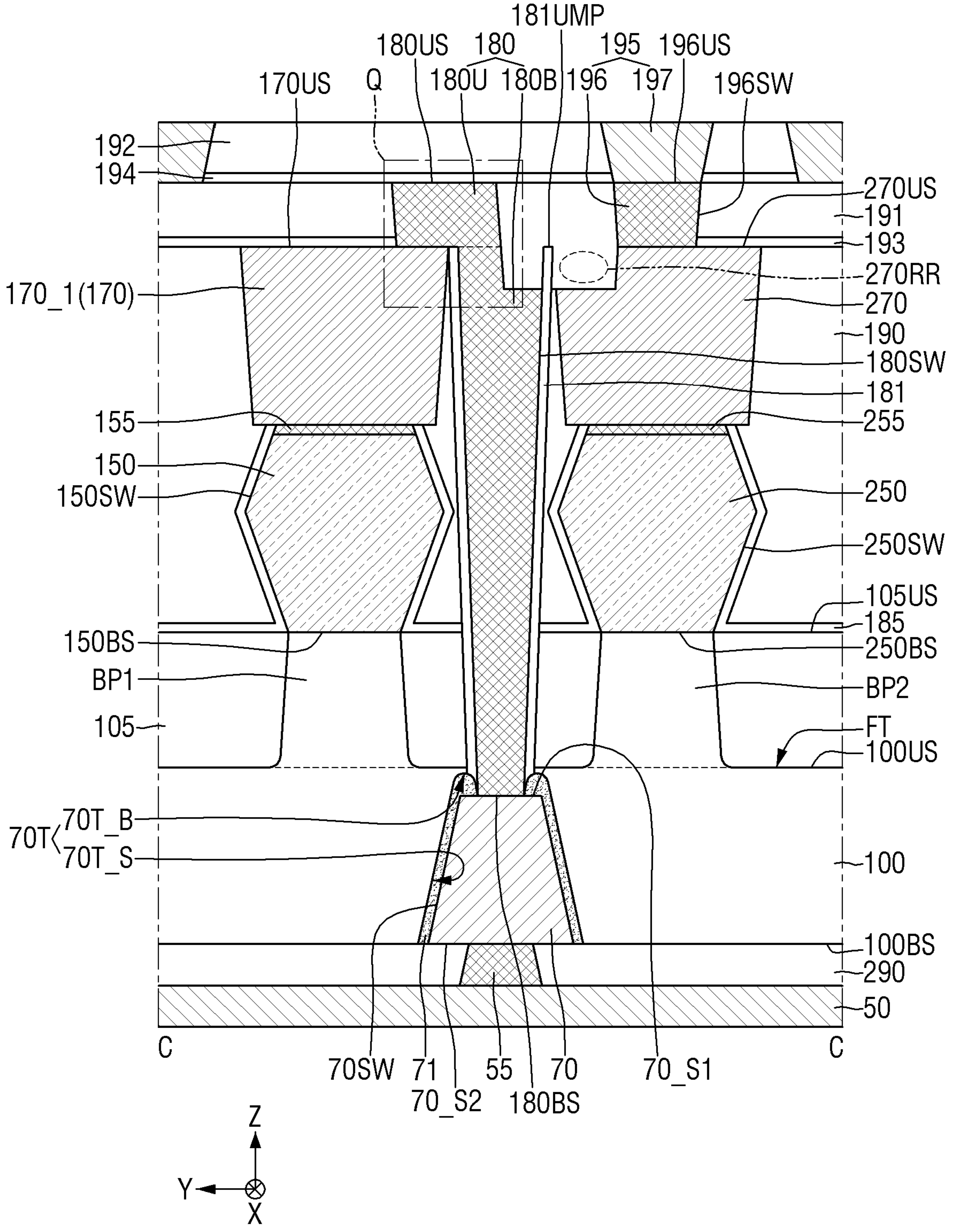
FIGS. 15 and 16 are cross-sectional views of a semiconductor device according to some embodiments of the present disclosure.
Figure 16:
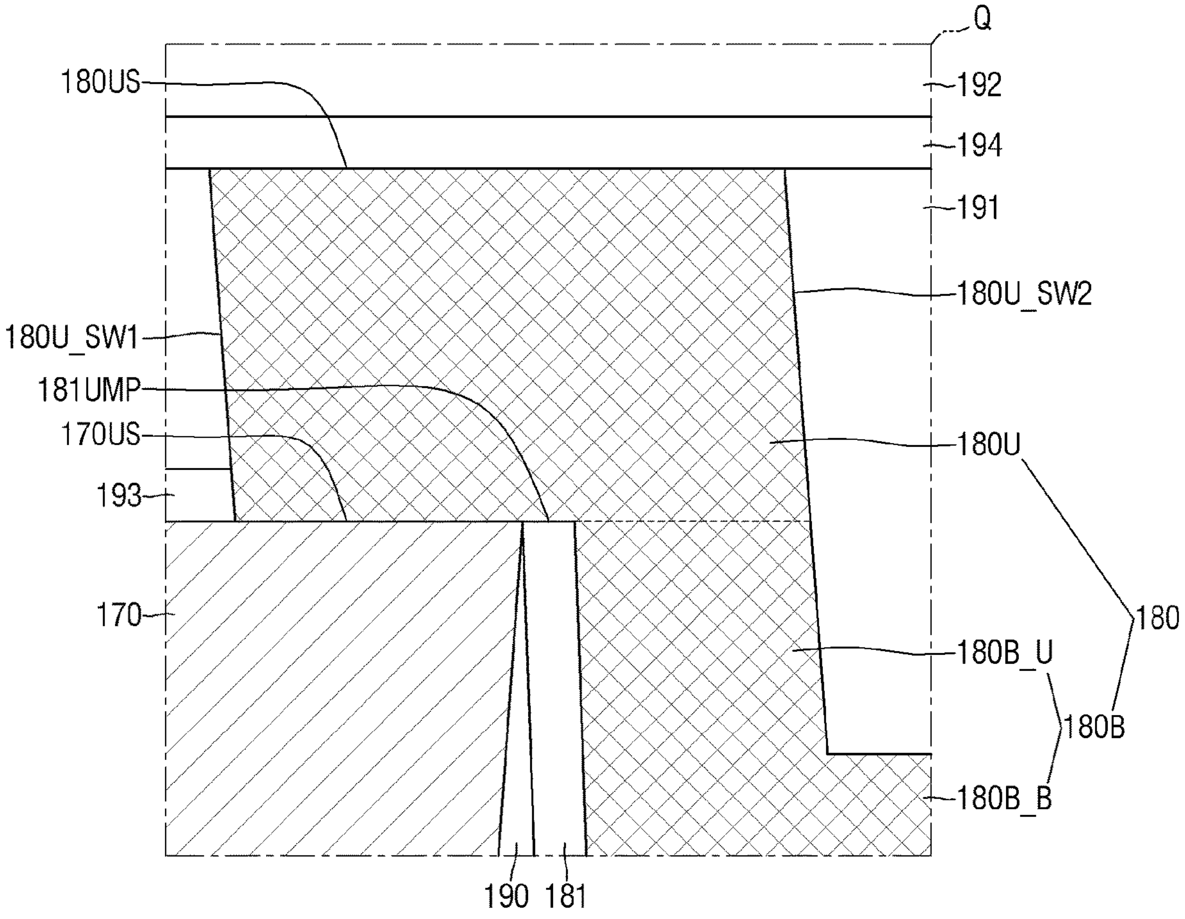
Figure 17:
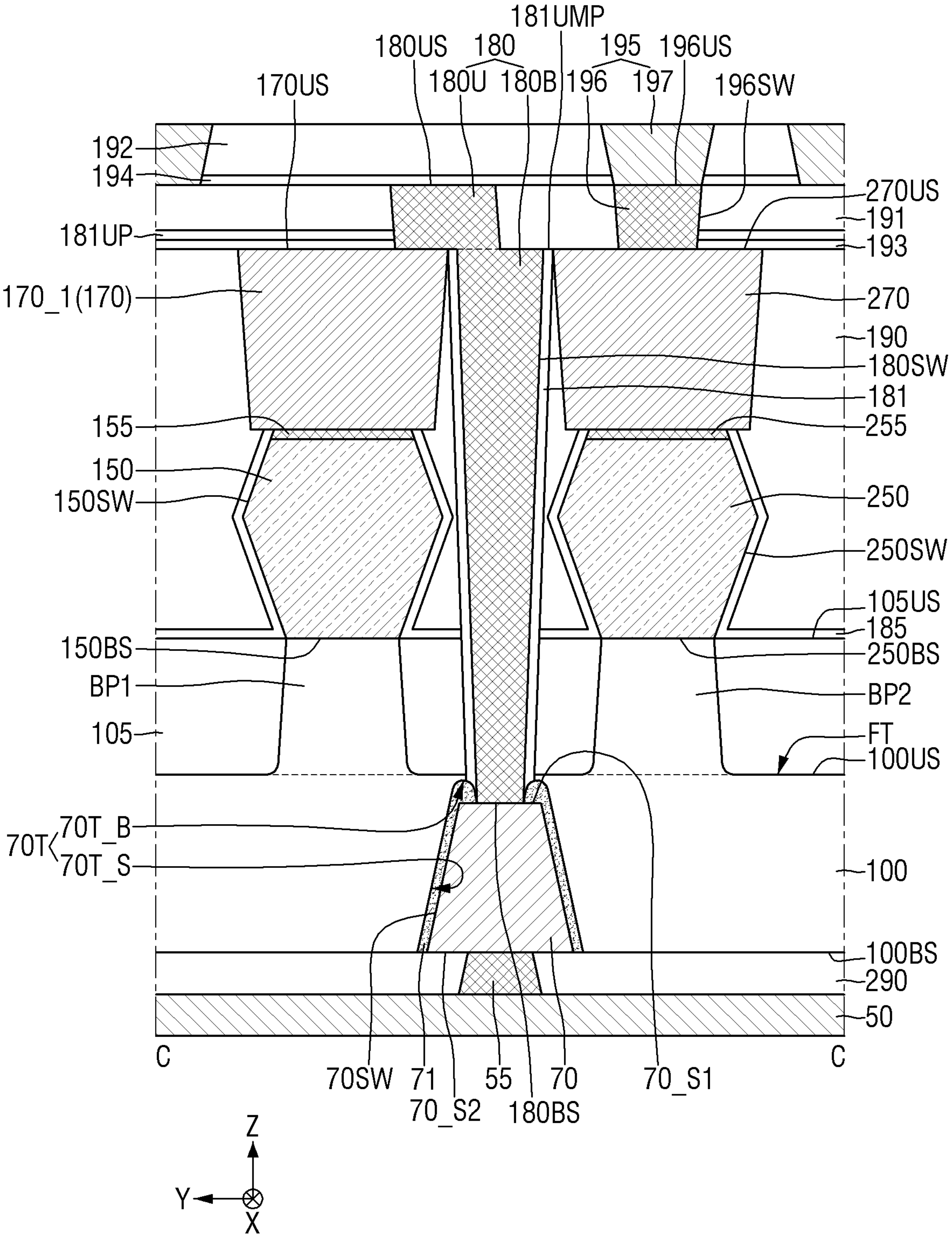
FIG. 17 is a cross-sectional view of a semiconductor device according to some embodiments of the present disclosure.

FIGS. 9 and 10 are cross-sectional views of a semiconductor device according to some embodiments of the present disclosure. In particular, FIG. 9 is a cross-sectional view taken along line C-C of FIG. 1 according to some embodiments of the present disclosure, and FIG. 10 is an enlarged cross-sectional view of part P of FIG. 9. FIGS. 11 and 12 are cross-sectional views of a semiconductor device according to some embodiments of the present disclosure. In particular, FIGS. 11 and 12 are cross-sectional views taken along lines B-B and C-C, respectively, of FIG. 1 according to some embodiments of the present disclosure. FIGS. 13 and 14 are cross-sectional views of a semiconductor device according to some embodiments of the present disclosure. In particular, FIGS. 13 and 14 are cross-sectional views taken along lines B-B and C-C, respectively, of FIG. 1 according to some embodiments of the present disclosure. FIGS. 15 and 16 are cross-sectional views of a semiconductor device according to some embodiments of the present disclosure. In particular, FIG. 15 is a cross-sectional view taken along line C-C of FIG. 1 according to some embodiments of the present disclosure, and FIG. 16 is an enlarged cross-sectional view of part Q of FIG. 15. FIG. 17 is a cross-sectional view of a semiconductor device according to some embodiments of the present disclosure. In particular, FIG. 17 is a cross-sectional view taken along line C-C of FIG. 1 according to some embodiments of the present disclosure. For convenience, FIGS. 9 through 17 will hereinafter be described, focusing mainly on the differences with FIGS. 1 through 8.

Referring to FIGS. 9 and 10, part of a contact connection via 180 may be recessed into a buried conductive pattern 70. For example, a portion of the contact connection via 180 may extend into the buried conductive pattern 70.

For example, parts of sidewalls 180SW of a lower portion 180B of the contact connection via 180 may be in contact with the buried conductive pattern 70. For example, respective portions of the sidewalls 180SW of the lower portion 180B of the contact connection via 180 may be in contact with the buried conductive pattern 70. Referring to FIG. 9, the buried conductive pattern 70 may be in contact with parts of the sidewalls 180SW of the lower portion 180B of the contact connection via 180 and a bottom surface 180BS of the contact connection via 180.

Referring to FIGS. 11 through 14, the semiconductor device according to some embodiments of the present disclosure may further include second buried insulating liners 72, which are disposed between first buried insulating liners 71 and a substrate 100.

The first buried insulating liners 71 may be disposed between the second buried insulating liners 72 and a buried conductive pattern 70. The second buried insulating liners 72 may be disposed on sidewalls 70SW of the buried conductive pattern 70. The second buried insulating liners 72 may not be disposed on a first surface 70_S1 of the buried conductive pattern 70. For example, the first surface 70_S1 of the buried conductive pattern 70 may be free of the second buried insulating liners 72.

The second buried insulating liners 72 may be formed of an insulating material. The second buried insulating liners 72 may extend along sidewalls 70T_S of a buried pattern trench 70T.

Referring to FIGS. 11 and 12, the second buried insulating liners 72 may extend along parts of a bottom surface 70T_B of the buried pattern trench 70T. For example, the height from a second surface 100BS of the substrate 100 to uppermost portions of the second buried insulating liners 72 may be greater than the height from the second surface 100BS of the substrate 100 to a bottom surface 180BS of a contact connection via 180.

Referring to FIGS. 13 and 14, the second buried insulating liners 72 may not extend along the bottom surface 70T_B of the buried pattern trench 70T. For example, the height from a second surface 100BS of a substrate 100 to uppermost portions of the second buried insulating liners 72 may be the same as, or less than, the height from the second surface 100BS of the substrate 100 to a bottom surface 180BS of a contact connection via 180.

Referring to FIGS. 15 and 16, a lower portion 180B of a contact connection via 180 may include first and second portions 180B_B and 180B_U.

The second portion 180B_U is disposed on the first portion 180B_B. An upper portion 180U of the contact connection via 180 may protrude in a third direction Z from the second portion 180B_U of the lower portion 180B of the contact connection via 180.

During the formation of the upper portion 180U of the contact connection via 180, part of the lower portion 180B of the contact connection via 180 may be removed. As a result, the lower portion 180B of the contact connection via 180 may be divided into the first and second portions 180B_B and 180B_U.

The sidewalls of the second portion 180B_U of the lower portion 180B of the contact connection via 180 may be continuously connected to second sidewalls 180U_SW2 of the upper portion 180U of the contact connection via 180. For example, at least one sidewall of the second portion 180B_U of the lower portion 180B of the contact connection via 180 may be continuously connected to or be integral with the second sidewall 180U_SW2 of the upper portion 180U of the contact connection via 180. The slope of the second sidewalls 180U_SW2 of the upper portion 180U of the contact connection via 180 may be the same as the slope of the sidewalls of the second portion 180B_U of the lower portion 180B of the contact connection via 180. A second upper interlayer insulating film 191 may cover or be on the sidewalls of the second portion 180B_U of the lower portion 180B of the contact connection via 180.

During the formation of the upper portion 180U of the contact connection via 180, part of a second source/drain contact 270 may be removed. The second upper interlayer insulating film 191 may fill a region 270RR from which the second source/drain contact 270 has been removed. In this case, via insulating liners 181 may not be in contact with the second source/drain contact 270.

The via insulating liners 181 may not be etched during the removal of part of the second source/drain contact 270 and part of the lower portion 180B of the contact connection via 180, but the present disclosure is not limited thereto.

Referring to FIG. 17, the semiconductor device according to some embodiments of the present disclosure may further include upper via insulating liners 181UP between a second upper interlayer insulating film 191 and a first upper etch stopper film 193.

The upper via insulating liners 181UP may include the same material as via insulating liners 181. The thickness of the upper via insulating liners 181UP may be the same as the thickness of the via insulating liners 181.

The upper via insulating liners 181UP and the via insulating liners 181 may be formed at the same time.

Figure 18:
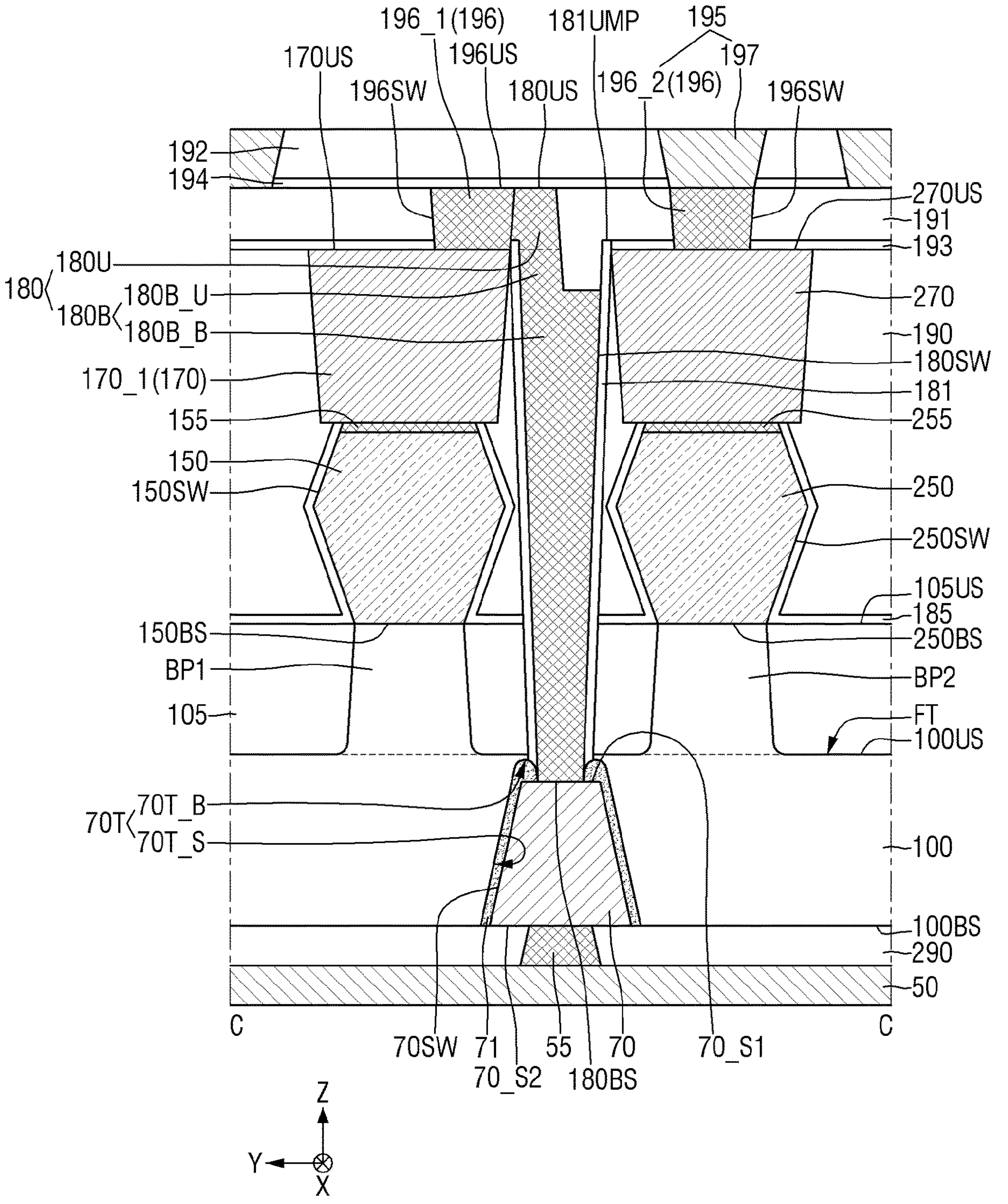
FIGS. 18 and 19 are cross-sectional views of a semiconductor device according to some embodiments of the present disclosure.
Figure 19:
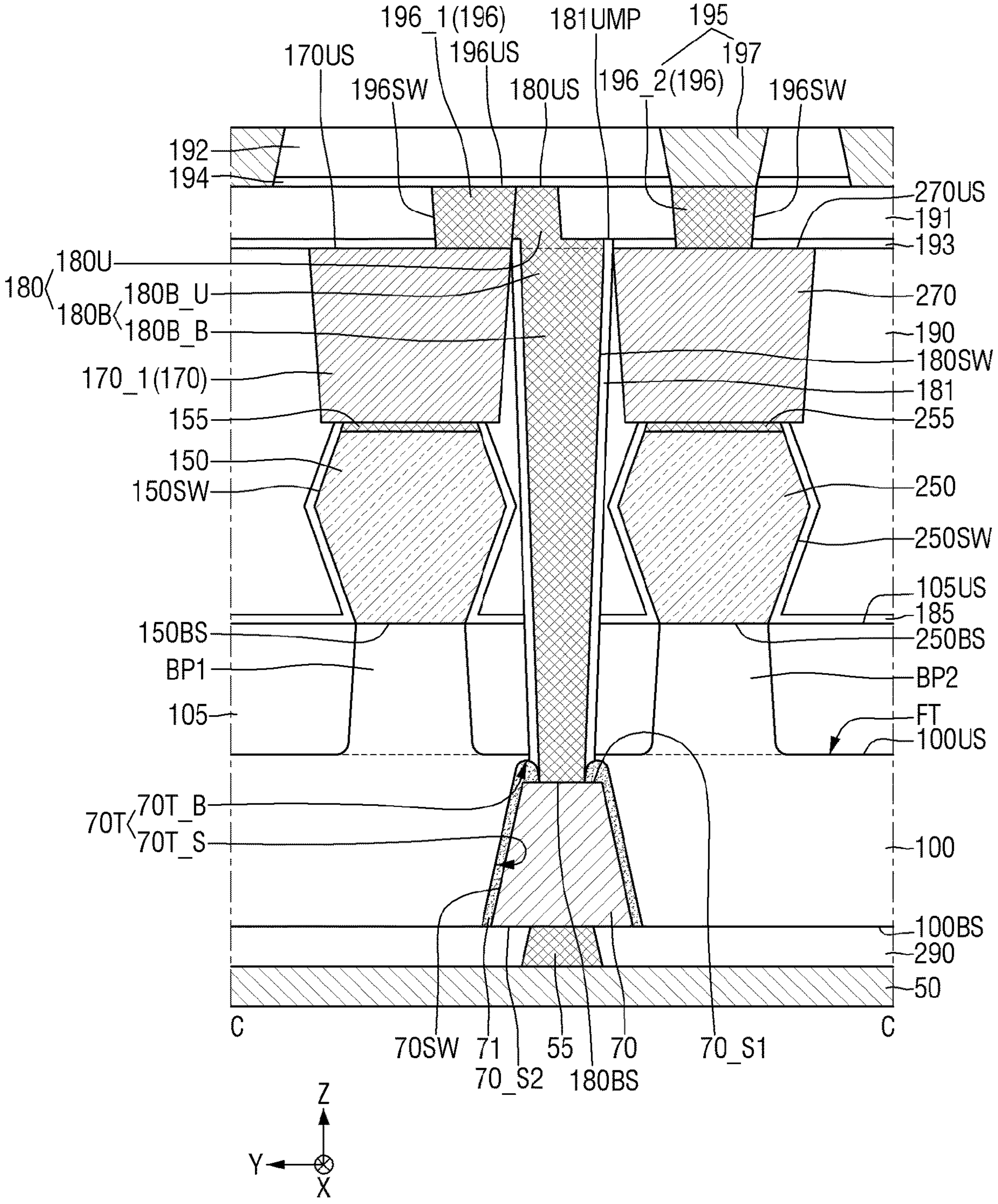

FIGS. 18 and 19 are cross-sectional views of a semiconductor device according to some embodiments of the present disclosure. In particular, FIGS. 18 and 19 are cross-sectional views taken along line C-C of FIG. 1 according to some embodiments of the present disclosure. For convenience, FIGS. 18 and 19 will hereinafter be described, focusing mainly on the differences with FIGS. 1 through 8.

Referring to FIGS. 18 and 19, an upper portion 180U of a contact connection via 180 may be in contact with front wiring vias 196.

The contact connection via 180 may be electrically connected to a first source/drain contact 170 via the front wiring vias 196. The upper portion 180U of the contact connection via 180 may be in contact with sidewalls 196SW of the front wiring vias 196. For example, the upper portion 180U of the contact connection via 180 may be in contact with at least one sidewall 196SW of the front wiring vias 196.

The front wiring vias 196 may include first and second front wiring vias 196_1 and 196_2.

The first front wiring via 196_1 may be in contact with the contact connection via 180. For example, the first front wiring via 196_1 may be directly connected to the upper portion 180U of the contact connection via 180. The contact connection via 180 may be electrically connected to a first rear connection contact 170_1 via the first front wiring via 196_1. The first front wiring via 196_1 may not be connected to a front wiring line 197.

The second front wiring via 196_2 is not in contact with the contact connection via 180. The second front wiring via 196_2 may not be electrically connected to the contact connection via 180. The second front wiring via 196_2 may be connected to the front wiring line 197.

Uppermost portions 181UMP of via insulating liners 181 may protrude in a third direction Z beyond an upper surface 170US of the first source/drain contact 170, but the present disclosure is not limited thereto.

Referring to FIG. 18, a lower portion 180B of the contact connection via 180 may include first and second portions 180B_B and 180B_U. During the formation of an upper portion 180U of the contact connection via 180, part of the lower portion 180B of the contact connection via 180 may be removed. A first upper etch stopper film 193 may be disposed on an upper surface 270US of a second source/drain contact 270, which is not connected to the second front wiring via 196_2. For example, the first upper etch stopper film 193 may be on a portion of the upper surface 270US of the second source/drain contact 270 that is not connected to the second front wiring via 196_2. The first upper etch stopper film 193 may prevent the second source/drain contact 270 from being removed during the formation of the upper portion 180U of the contact connection via 180.

Referring to FIG. 19, the contact connection via 180 may include the lower and upper portions 180B and 180U, which are divided from each other by the upper surface 170US of the first source/drain contact 170. For example, an interface between the lower and upper portions 180B and 180U of the contact connection via 180 may be coplanar with the upper surface 170US of the first source/drain contact 170. In a cross-sectional view, the upper portion 180U of the contact connection via 180 may have an L shape, but the present disclosure is not limited thereto.

Figure 20:
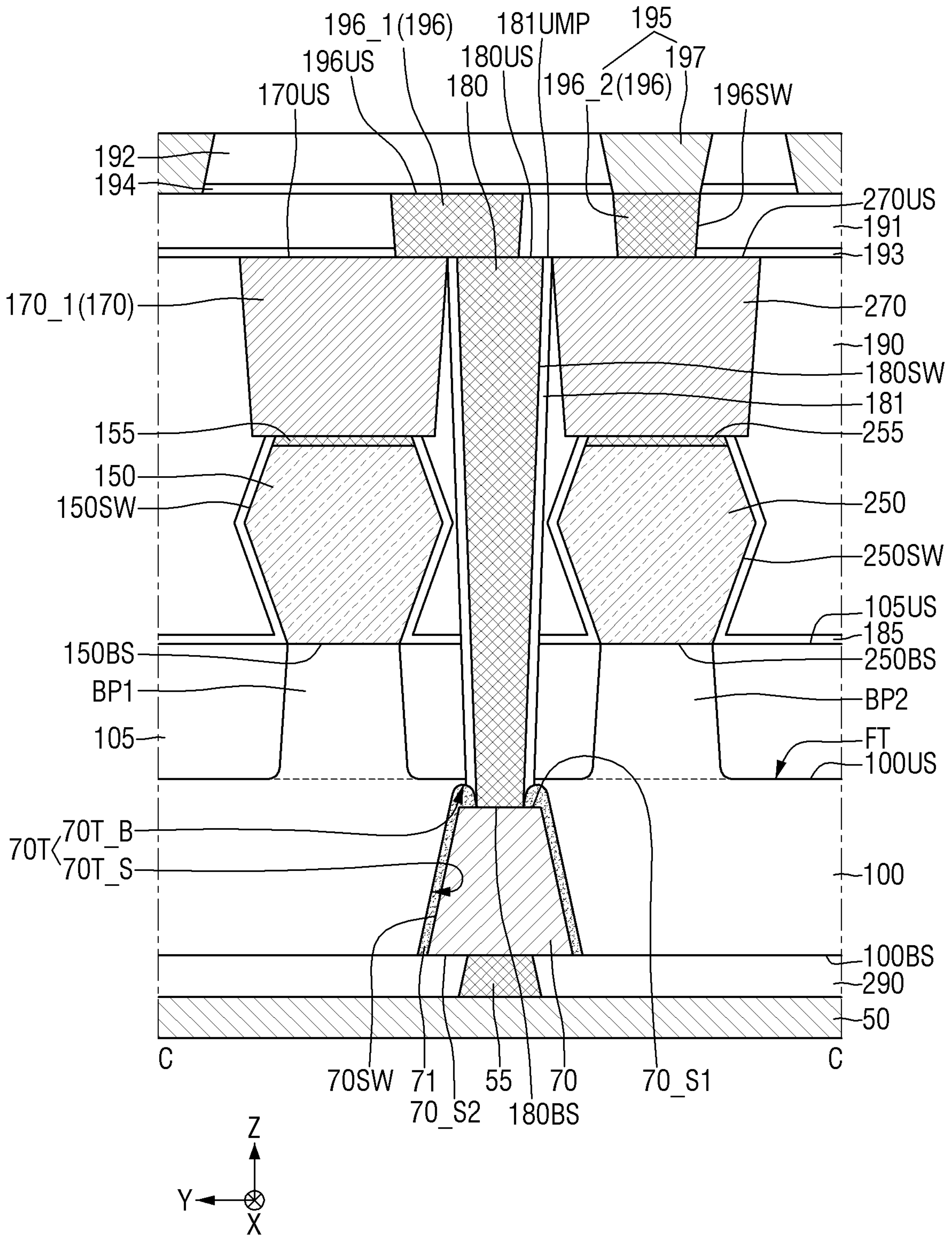
FIGS. 20 through 22 are cross-sectional views of semiconductor devices according to some embodiments of the present disclosure.
Figure 21:
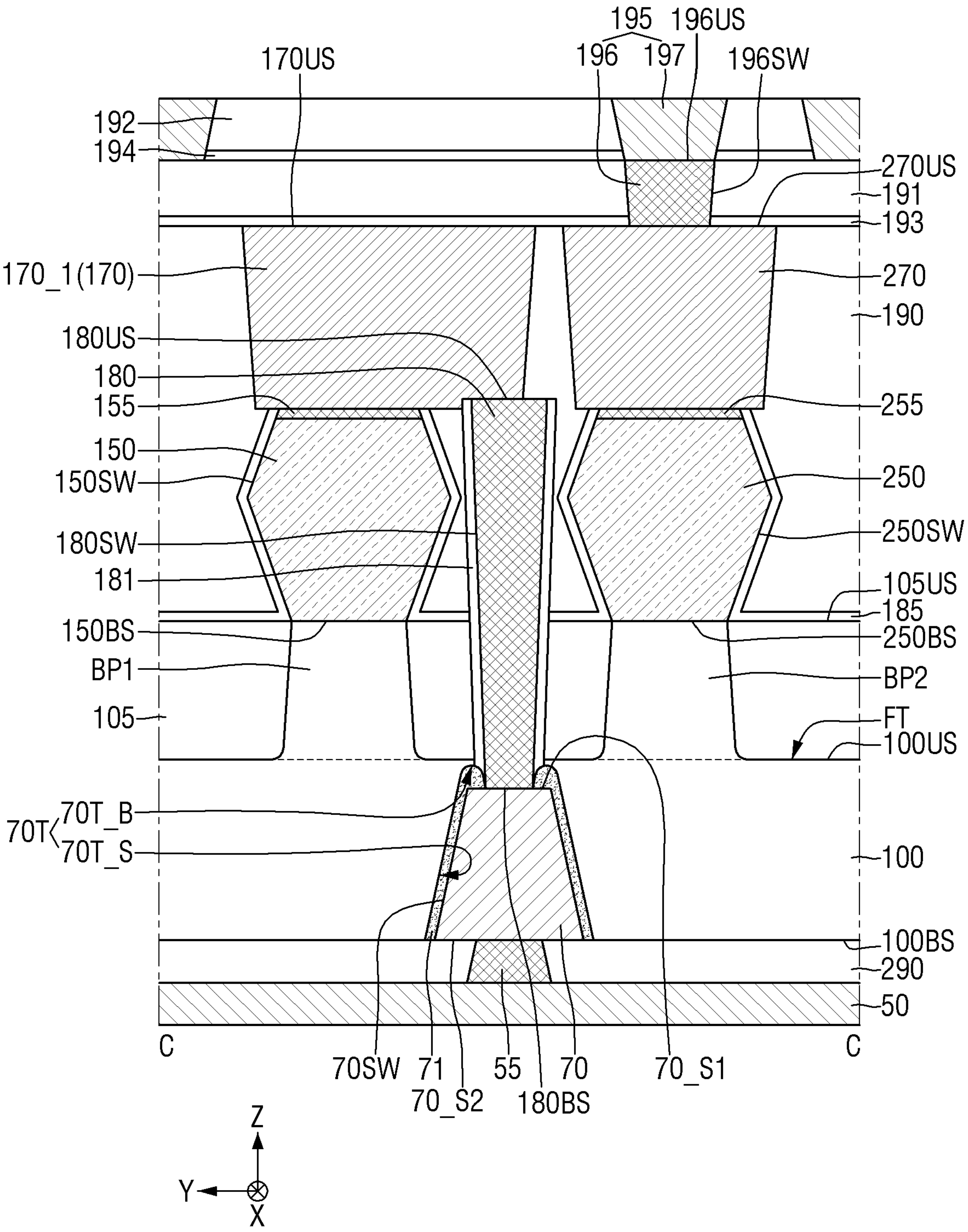
Figure 22:
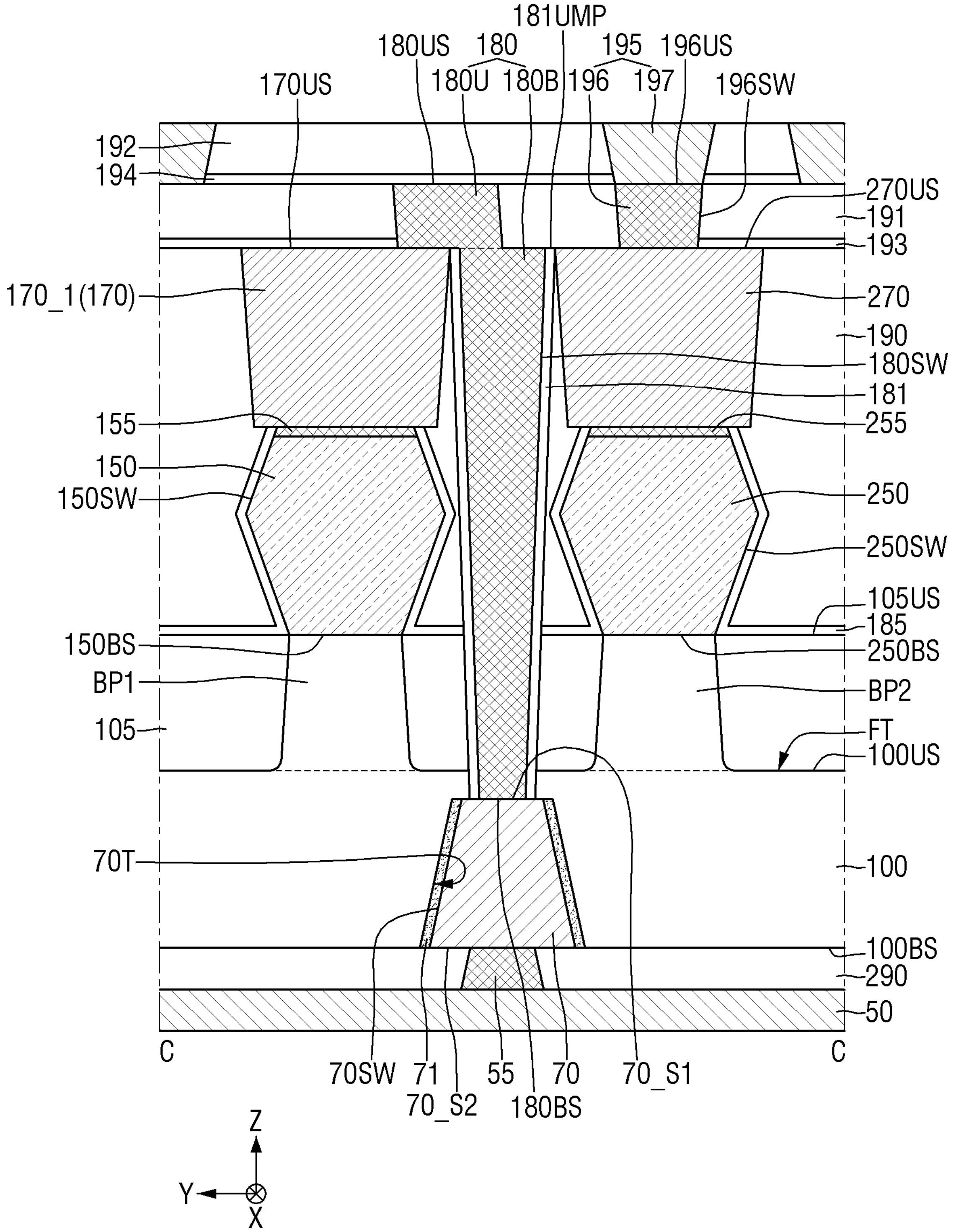

FIGS. 20 through 22 are cross-sectional views of semiconductor devices according to some embodiments of the present disclosure. In particular, FIGS. 20 through 22 are cross-sectional views taken along line C-C of FIG. 1 according to some embodiments of the present disclosure. For convenience, FIGS. 20 through 22 will hereinafter be described, focusing mainly on the differences with FIGS. 1 through 8.

Referring to FIG. 20, an upper surface 180US of a contact connection via 180 may be disposed on the same plane as (e.g., may be coplanar with) an upper surface 170US of a first source/drain contact 170.

For example, the height from bottom surfaces 150BS of first source/drain patterns 150 to the upper surface 180US of the contact connection via 180 may be the same as the height from the bottom surfaces 150BS of the first source/drain patterns 150 to the upper surface 170US of the first source/drain contact 170.

Front wiring vias 196 may include first and second front wiring vias 196_1 and 196_2. The first front wiring via 196_1 may connect the contact connection via 180 and a first rear connection contact 170_1.

The first front wiring via 196_1 may be disposed on the upper surface 170US of the first source/drain contact 170. The first front wiring via 196_1 may be disposed on the upper surface 180US of the contact connection via 180. The first front wiring via 196_1 may be in contact with the upper surface 170US of the first source/drain contact 170 and the upper surface 180US of the contact connection via 180. Although not illustrated, a first upper etch stopper film 193 may cover or be on part of the upper surface 180US of the contact connection via 180 that is not connected to the first front wiring via 196_1. However, the present disclosure is not limited thereto and, in some embodiments, the first upper etch stopper film 193 may not be on the upper surface 180US of the contact connection via 180. The first upper etch stopper film 193 may cover or be on part of the upper surface 170US of the first source/drain contact 170 that is not connected to the first front wiring via 196_1.

The second front wiring via 196_2 is not in contact with the upper surface 180US of the contact connection via 180. The second front wiring via 196_2 may connect a front wiring line 197 and a second source/drain contact 270.

Referring to FIG. 21, an upper surface 180US of a contact connection via 180 may be lower than an upper surface 170US of a first source/drain contact 170.

For example, the height from bottom surfaces 150BS of first source/drain patterns 150 to the upper surface 180US of the contact connection via 180 may be less than the height from the bottom surfaces 150BS of the first source/drain patterns 150 to the upper surface 170US of the first source/drain contact 170. For example, the height from the bottom surfaces 150BS of the first source/drain patterns 150 to the upper surface 170US of the first source/drain contact 170 may be greater than the height from the bottom surfaces 150BS of the first source/drain patterns 150 to the upper surface 180US of the contact connection via 180.

The first source/drain contact 170 may be in contact with the upper surface 180US of the contact connection via 180. The first source/drain contact 170 may cover or be on at least part of the upper surface 180US of the contact connection via 180.

Referring to FIG. 22, first buried insulating liners 71 may be disposed on sidewalls 70SW of a buried conductive pattern 70, but not on a first surface 70_S1 of the buried conductive pattern 70.

Part of the first surface 70_S1 of the buried conductive pattern 70 may not be covered by a contact connection via 180 and via insulating liners 181. Part of the first surface 70_S1 of the buried conductive pattern 70 may be in contact with a substrate 100.

Figure 23:
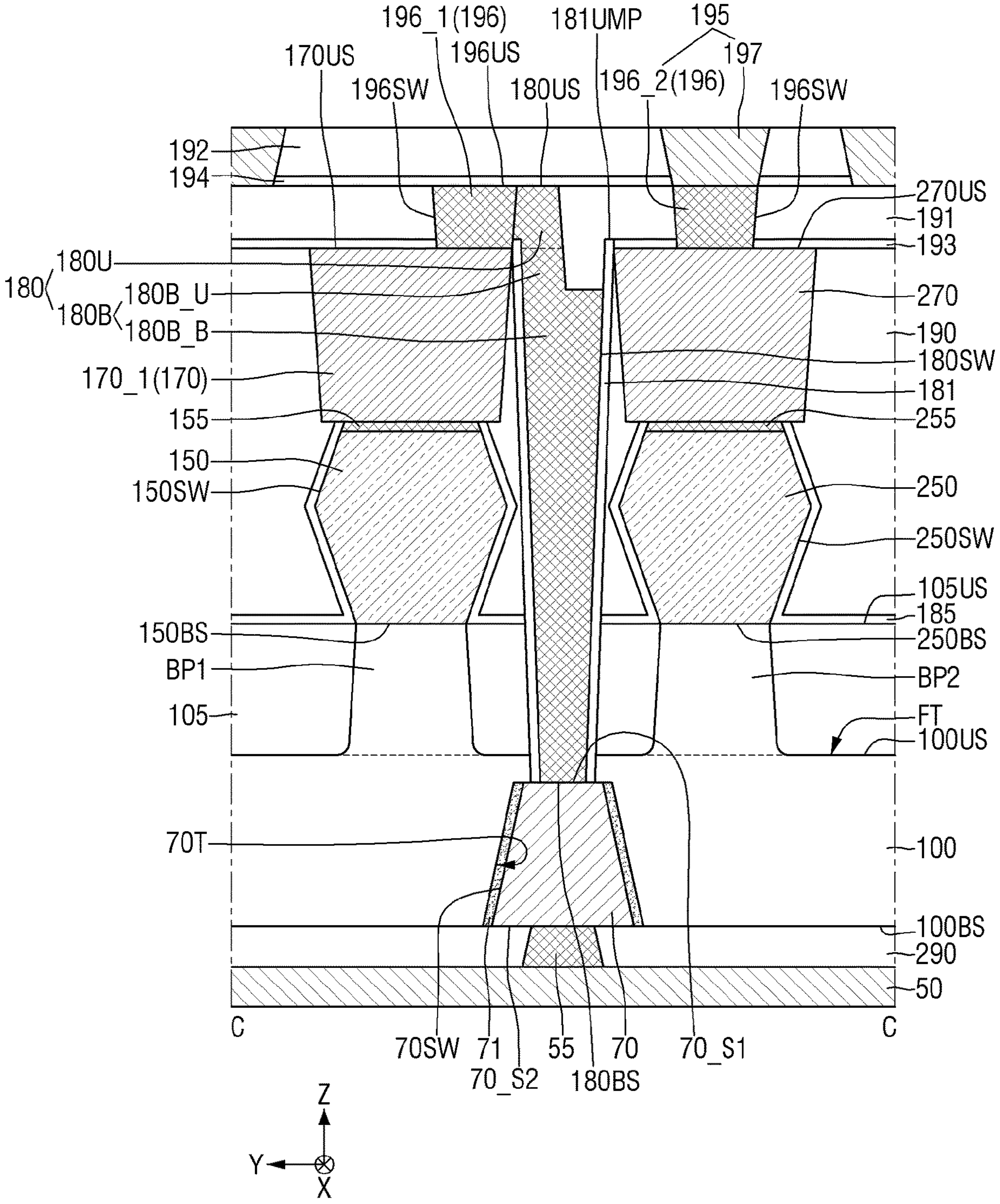
FIG. 23 is a cross-sectional view of a semiconductor device according to some embodiments of the present disclosure.

FIG. 23 is a cross-sectional view of a semiconductor device according to some embodiments of the present disclosure. In particular, FIG. 23 is a cross-sectional view taken along line C-C of FIG. 1 according to some embodiments of the present disclosure. For convenience, FIG. 23 will hereinafter be described, focusing mainly on the differences with FIG. 18.

Referring to FIG. 23, first buried insulating liners 71 may be disposed on sidewalls 70SW of a buried conductive pattern 70, but not on a first surface 70_S1 of the buried conductive pattern 70.

Part of the first surface 70_S1 of the buried conductive pattern 70 may be in contact with a substrate 100.

Figure 24:
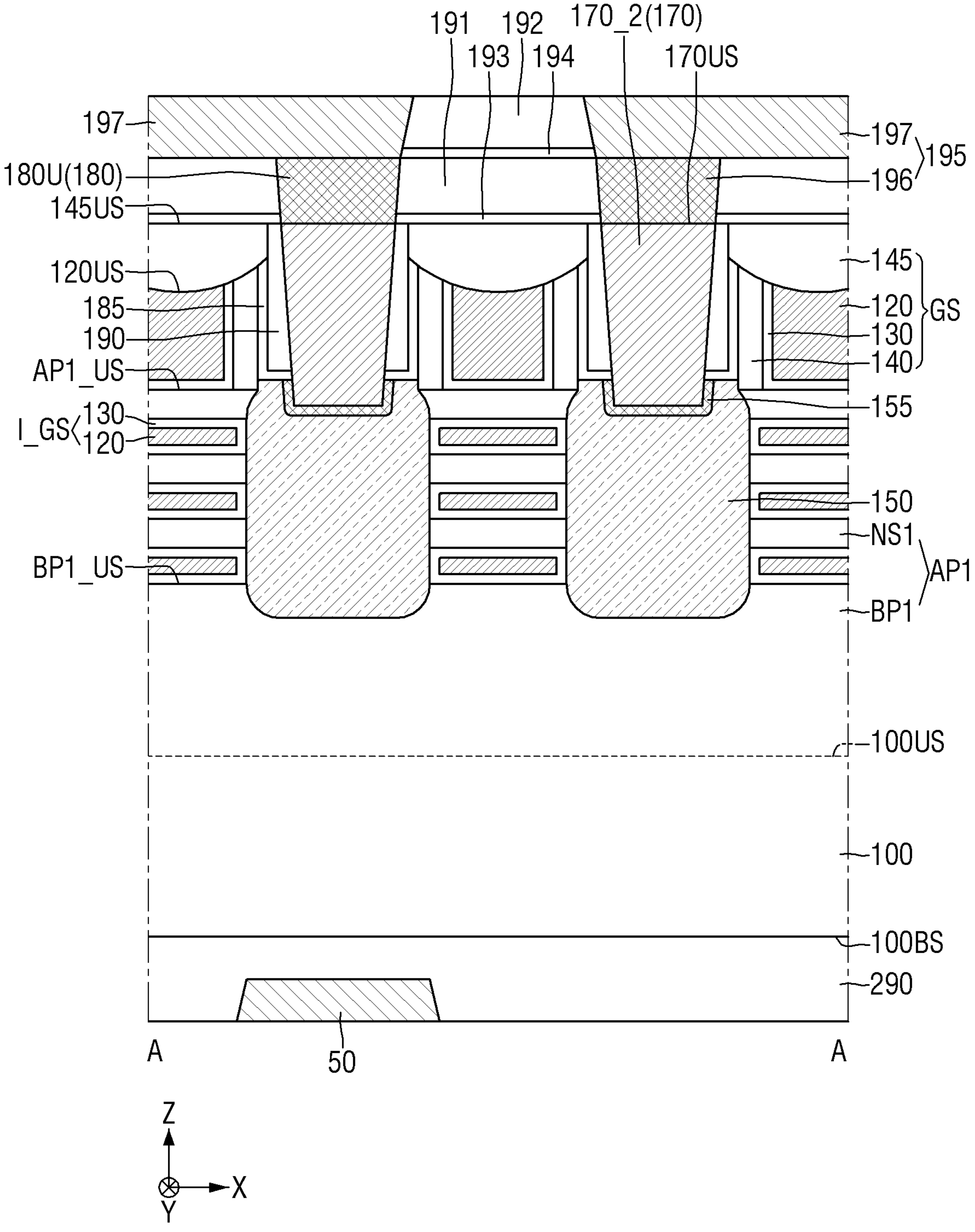
FIGS. 24 and 25 are cross-sectional views of a semiconductor device according to some embodiments of the present disclosure.
Figure 25:
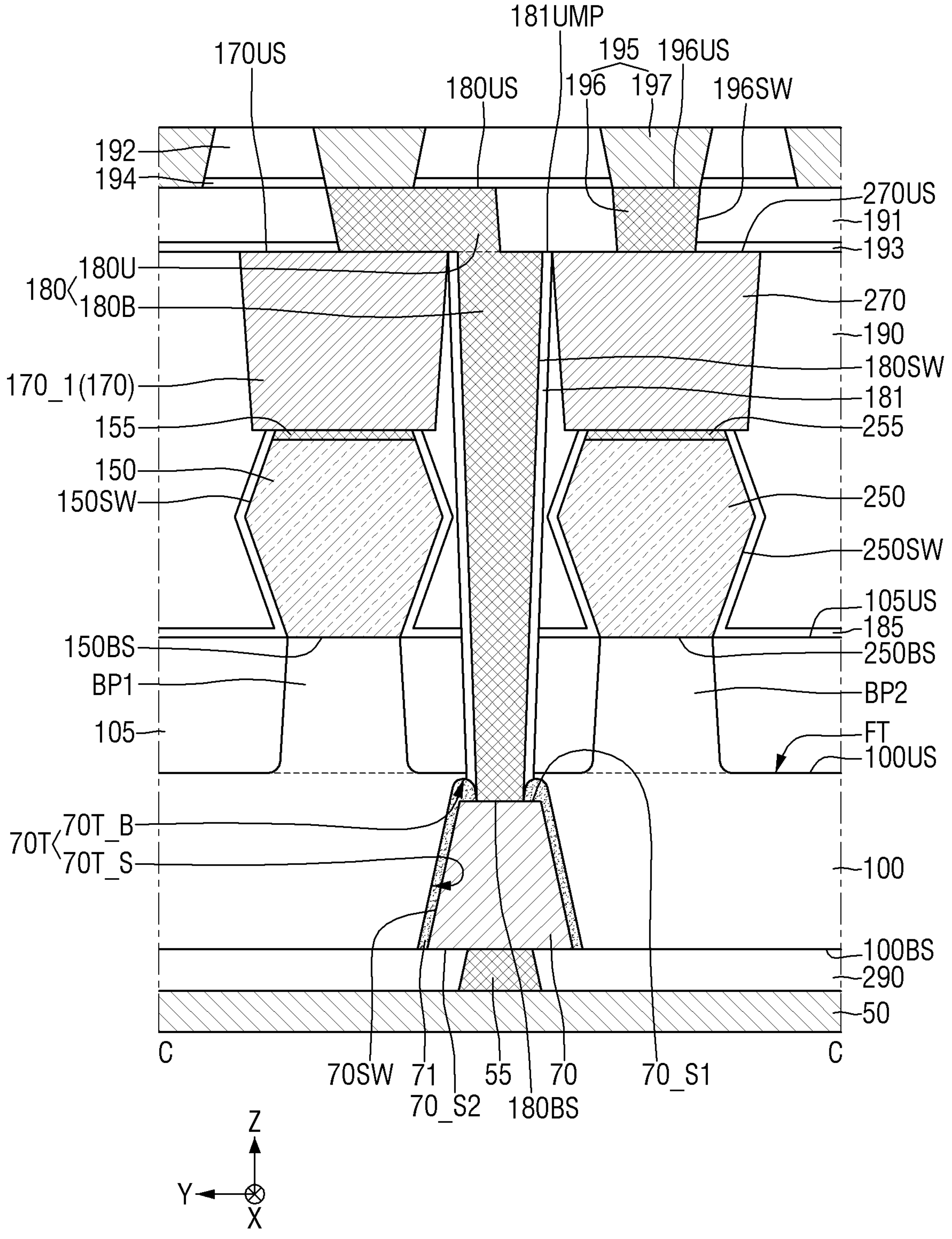
Figure 26:
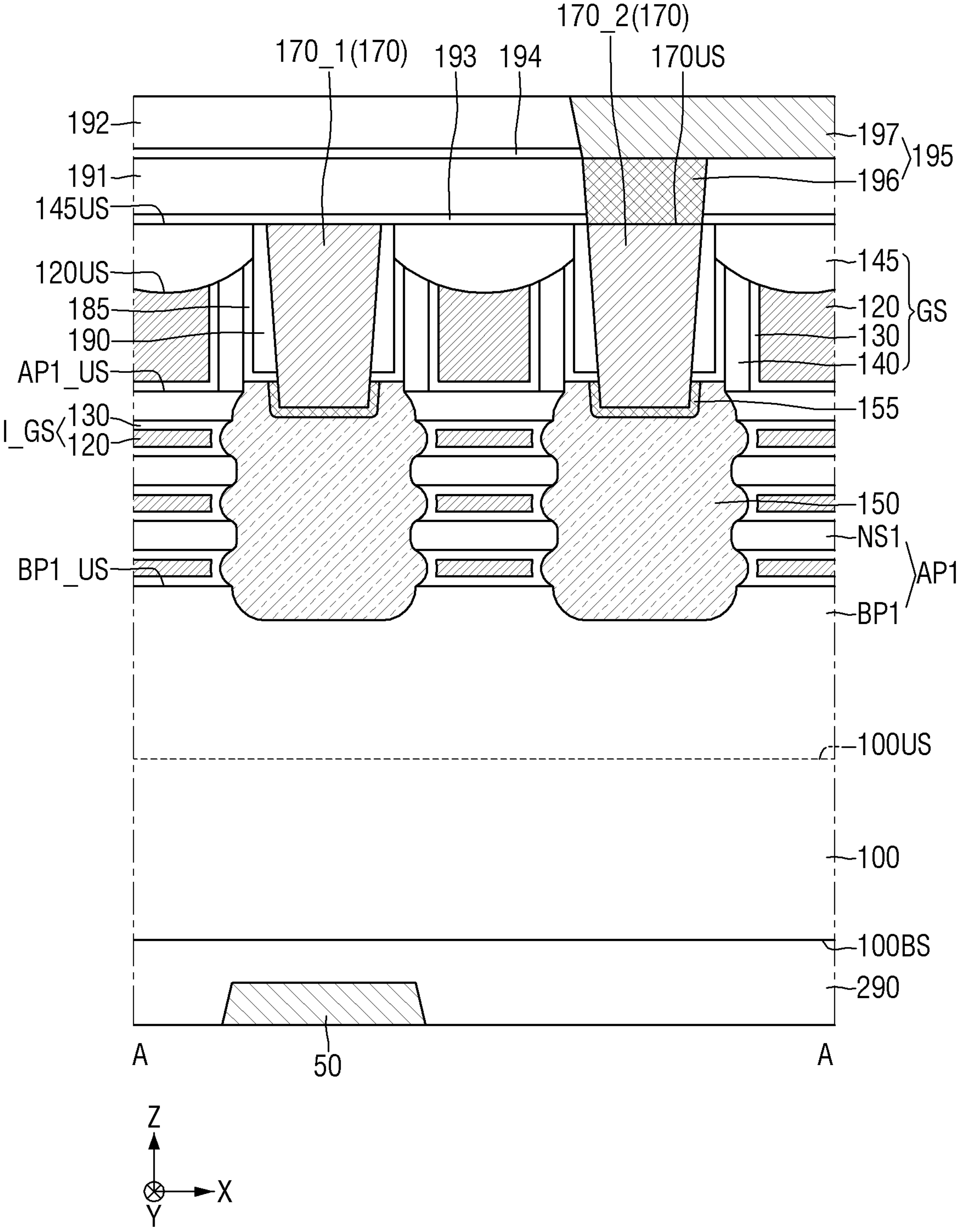
FIGS. 26 and 27 are cross-sectional views of a semiconductor device according to some embodiments of the present disclosure.
Figure 27:
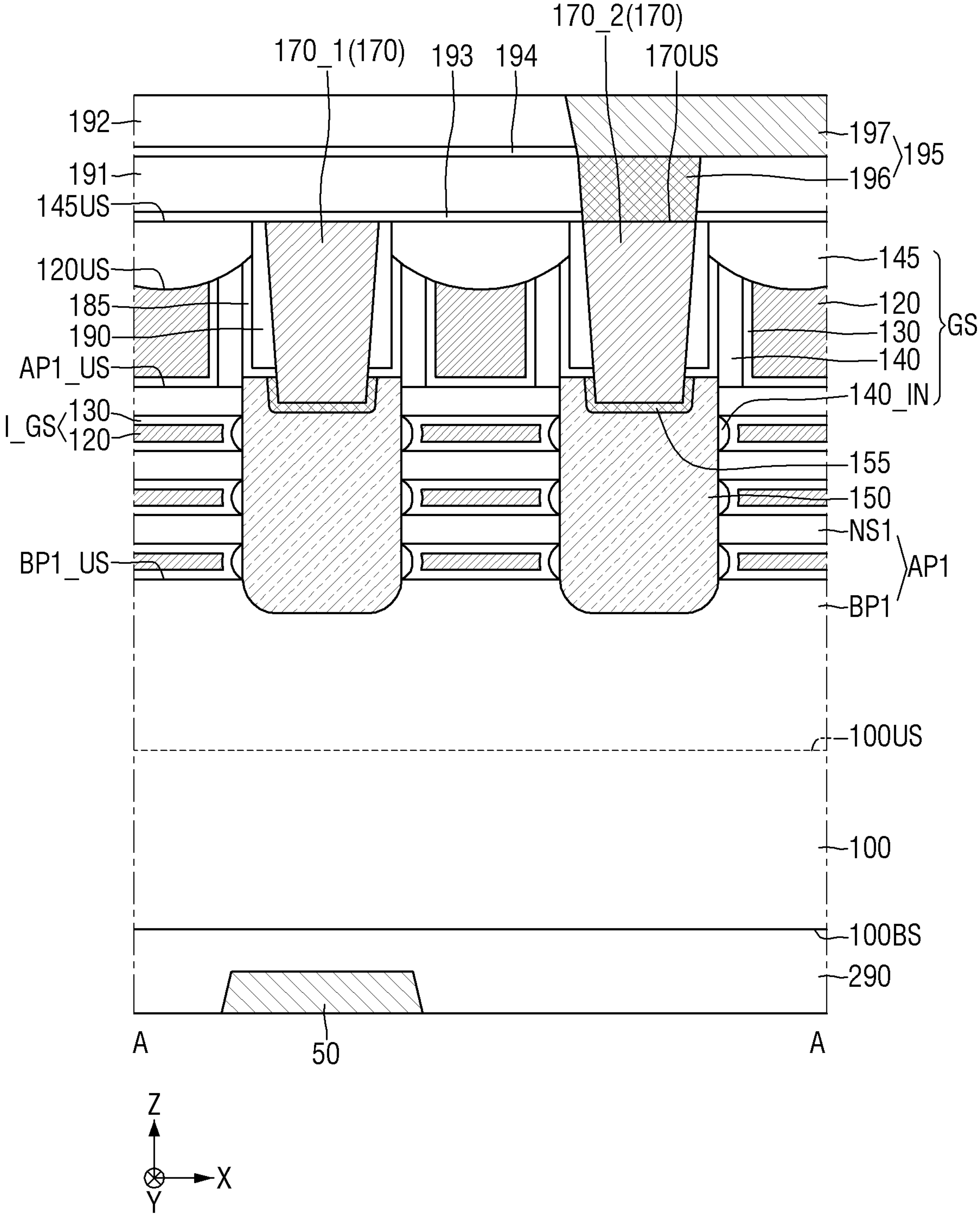

FIGS. 24 and 25 are cross-sectional views of a semiconductor device according to some embodiments of the present disclosure. In particular, FIGS. 24 and 25 are cross-sectional views taken along lines A-A and C-C, respectively, of FIG. 1 according to some embodiments of the present disclosure. FIGS. 26 and 27 are cross-sectional views of a semiconductor device according to some embodiments of the present disclosure. In particular, FIGS. 26 and 27 are cross-sectional views taken along line A-A of FIG. 1 according to some embodiments of the present disclosure. For convenience, FIGS. 24 through 27 will hereinafter be described, focusing mainly on the differences with FIGS. 1 through 8.

Referring to FIGS. 24 and 25, a first rear connection contact 170_1 may be connected not only to a rear wiring line 50, but also to a front wiring line 197.

An upper portion 180U of a contact connection via 180 may connect the first rear connection contact 170_1 and the front wiring line 197. For example, the front wiring line 197 may be on the upper portion 180U of the contact connection via 180.

Although illustrated in FIGS. 18 and 19 that a first front wiring via 196_1 is not connected to a front wiring line 197, the present disclosure is not limited thereto and, in some embodiments, the first rear connection contact 170_1 may be connected to the front wiring line 197 via the first front wiring via 196_1.

Referring to FIG. 26, each of first source/drain patterns 150 may include outer sidewalls, which are in contact with first sheet patterns NS1 and inner gate structures I_GS.

The outer sidewalls of each of the first source/drain patterns 150 may have a wavy shape.

Referring to FIG. 27, each of gate structures GS may further include a plurality of inner spacers 140_IN.

The inner spacers 140_IN may be disposed between first sheet patterns NS1, which are adjacent to one another in a third direction Z, and between a first lower pattern BP1 and the first sheet patterns NS1. The inner spacers 140_IN are disposed between inner gate structures I_GS and first source/drain patterns 150. For example, the inner gate structures I_GS may include a gate insulating film 130, and the inner spacers 140_IN may be between the gate insulating film 130 and the first source/drain patterns 150. The inner gate structures I_GS may not be in contact with the first source/drain patterns 150.

Figure 28:
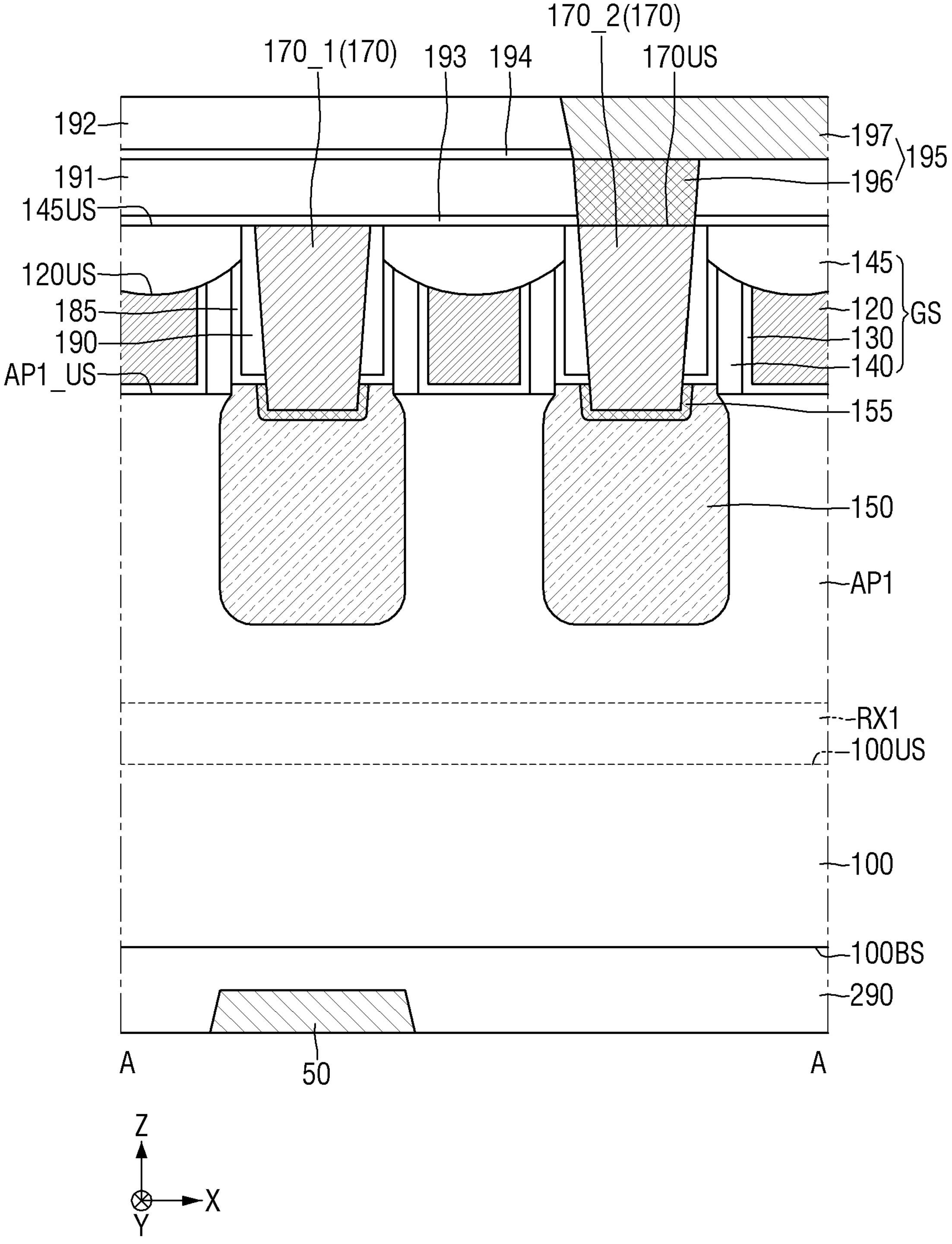
FIGS. 28 and 29 are cross-sectional views of a semiconductor device according to some embodiments of the present disclosure.
Figure 29:
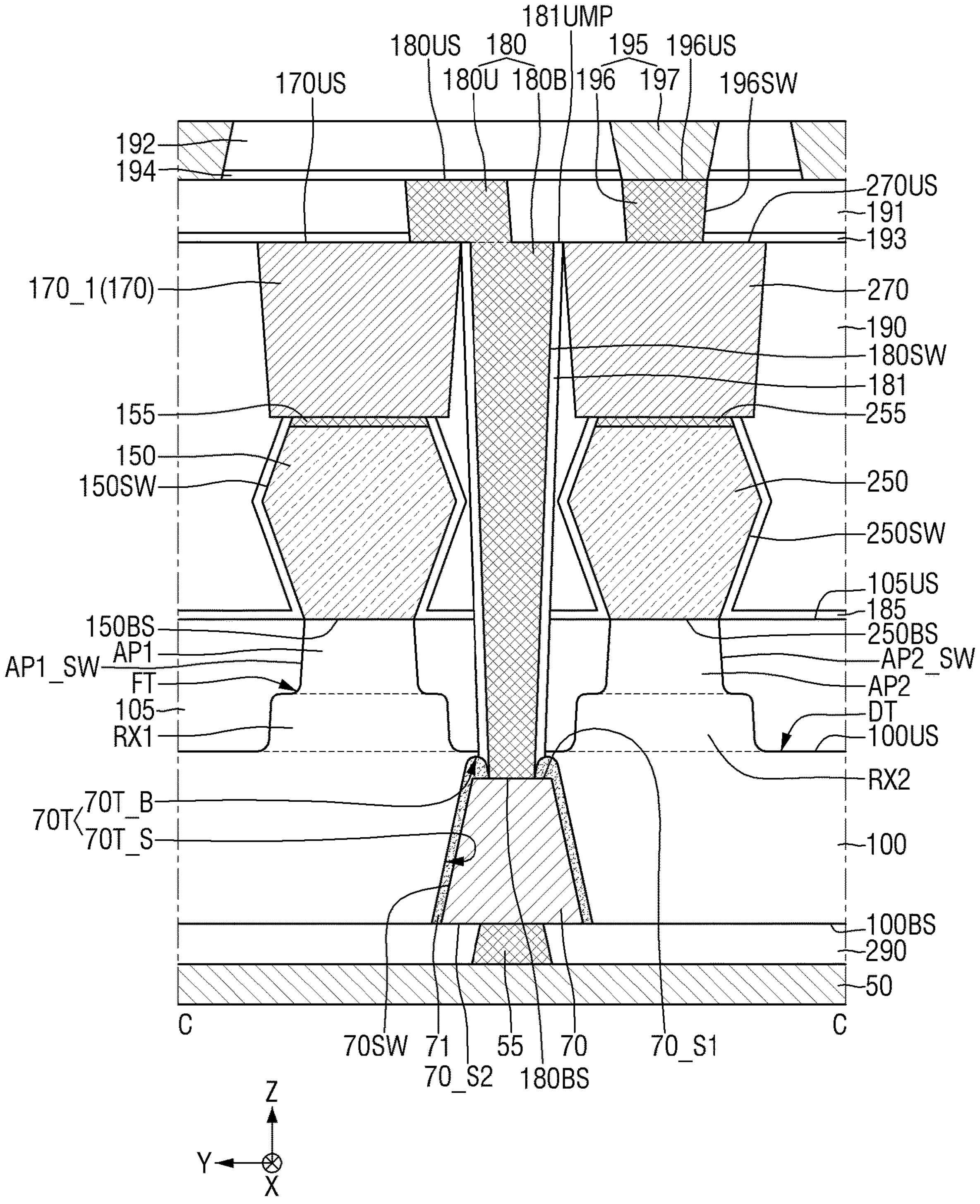
Figure 30:
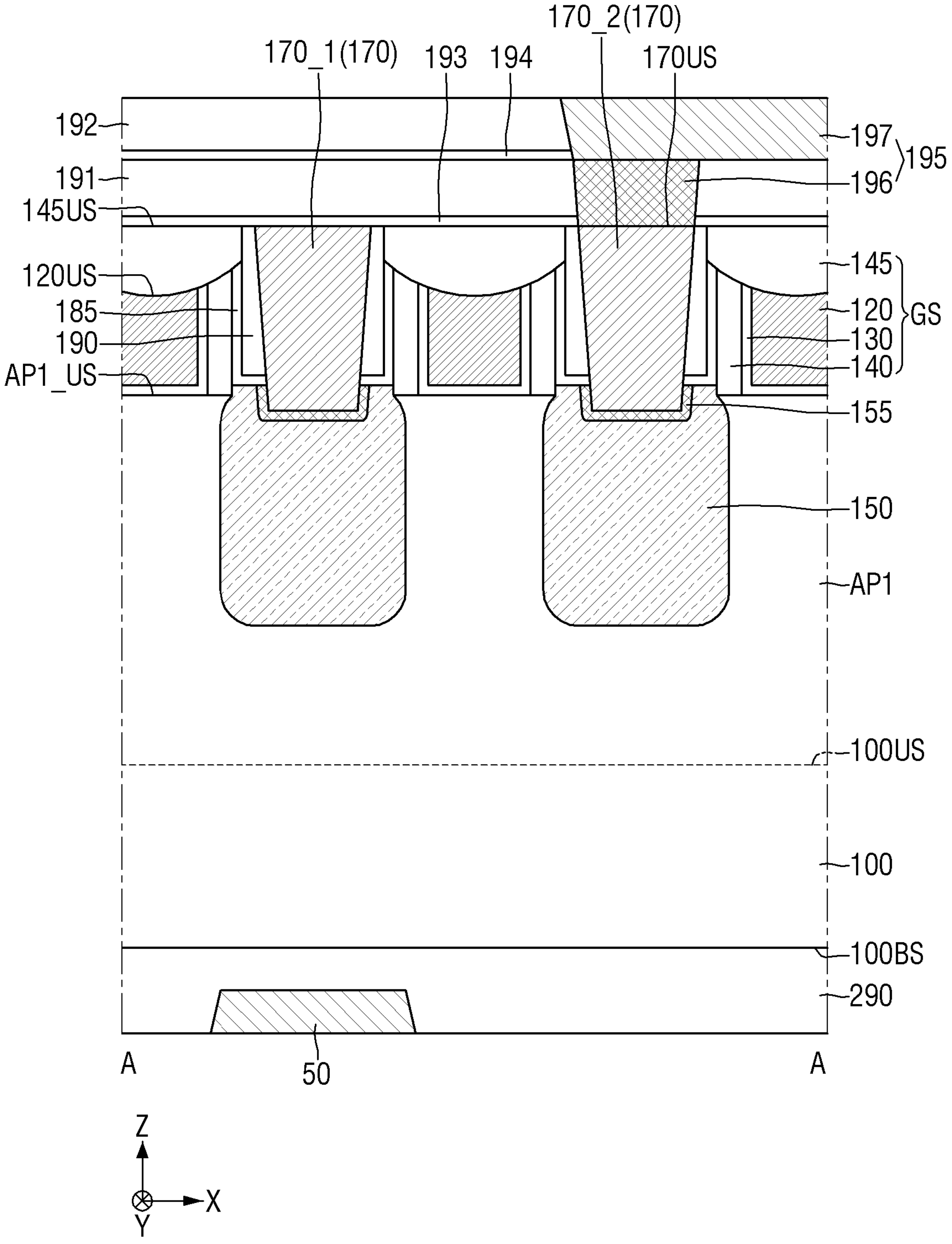
FIGS. 30 and 31 are cross-sectional views of a semiconductor device according to some embodiments of the present disclosure.
Figure 31:
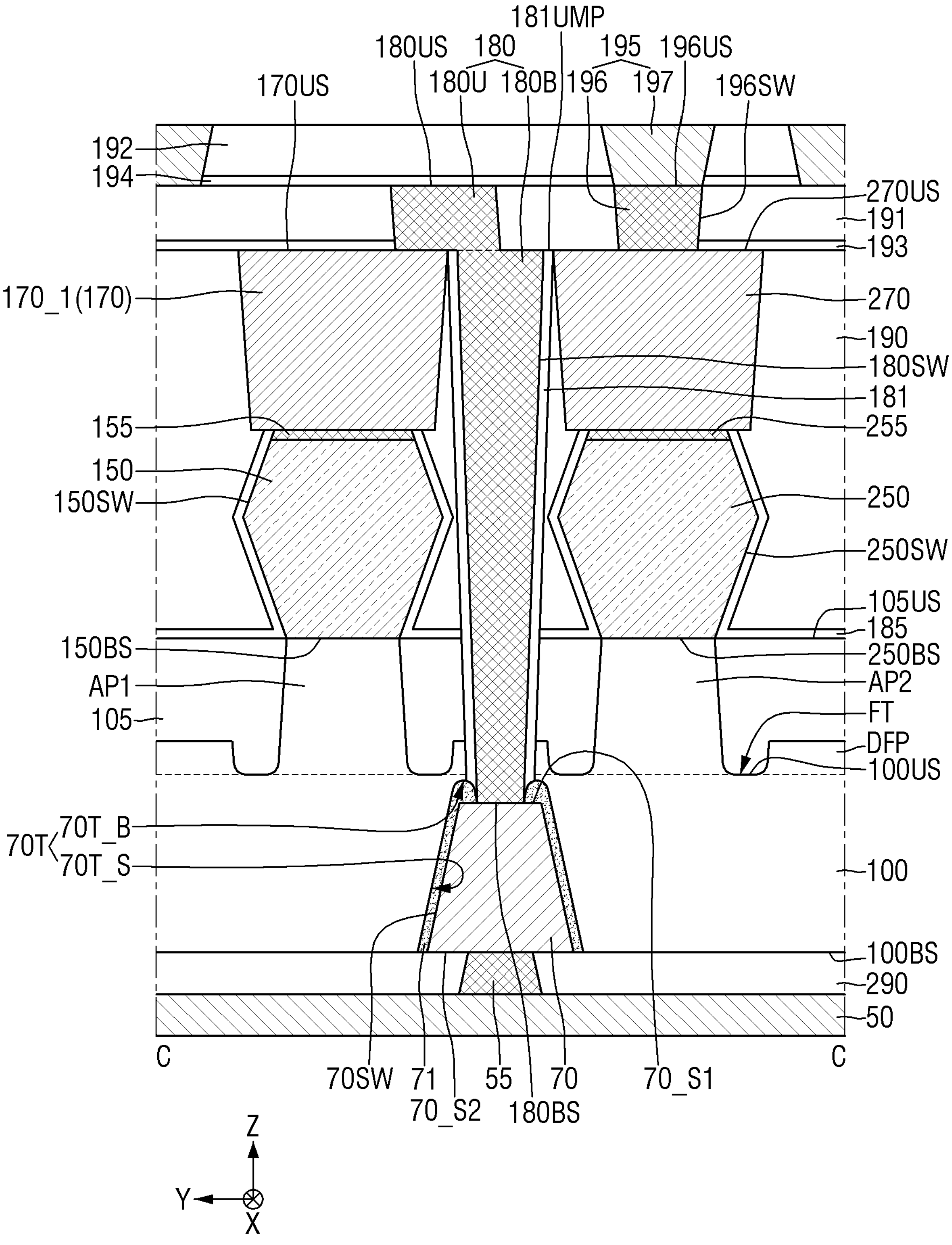

FIGS. 28 and 29 are cross-sectional views of a semiconductor device according to some embodiments of the present disclosure. In particular, FIGS. 28 and 29 are cross-sectional views taken along lines A-A and C-C, respectively, of FIG. 1 according to some embodiments of the present disclosure. FIGS. 30 and 31 are cross-sectional views of a semiconductor device according to some embodiments of the present disclosure. In particular, FIGS. 30 and 31 are cross-sectional views taken along lines A-A and C-C, respectively, of FIG. 1 according to some embodiments of the present disclosure. For convenience, FIGS. 28 through 31 will hereinafter be described, focusing mainly on the differences with FIGS. 1 through 8.

Referring to FIGS. 28 through 31, each of first and second active patterns AP1 and AP2 does not include sheet patterns (e.g., does not include first and second sheet patterns NS1 and NS2).

The first and second active patterns AP1 and AP2 may be fin-type patterns protruding beyond an upper surface 105US of a field insulating film 105. Referring to FIG. 29, the field insulating film 105 may cover or be on parts of sidewalls AP1_SW of the first active pattern AP1 and parts of sidewalls AP2_SW of the second active pattern AP2.

Each of gate structures GS does not include inner gate structures (e.g., "I_GS" of FIG. 2).

Referring to FIGS. 28 and 29, the first active pattern AP1 may protrude from a first active region RX1. The second active pattern AP2 may protrude from a second active region RX2. The first and second active regions RX1 and RX2 may be defined by deep trenches DT, which are deeper than fin trenches FT. For example, a first surface 100US of a substrate 100 may correspond to the bottom surfaces of the deep trenches DT. One first active pattern AP1 and one second active pattern AP2 are illustrated as being disposed in the first active region RX1 and the second active region RX2, respectively, but the present disclosure is not limited thereto. A plurality of first active patterns AP1 may be disposed in the first active region RX1, and a plurality of second active patterns AP2 may be disposed in the second active region RX2.

Referring to FIGS. 30 and 31, a dummy fin-type pattern DFP may be disposed between first and second active patterns AP1 and AP2. A field insulating film 105 covers or is on the upper surface of the dummy fin-type pattern DFP. One dummy fin-type pattern DFP is illustrated as being disposed between the first and second active patterns AP1 and AP2, but the present disclosure is not limited thereto. A plurality of dummy fin-type patterns DFP may be disposed between the first and second active patterns AP1 and AP2.

Figure 32:
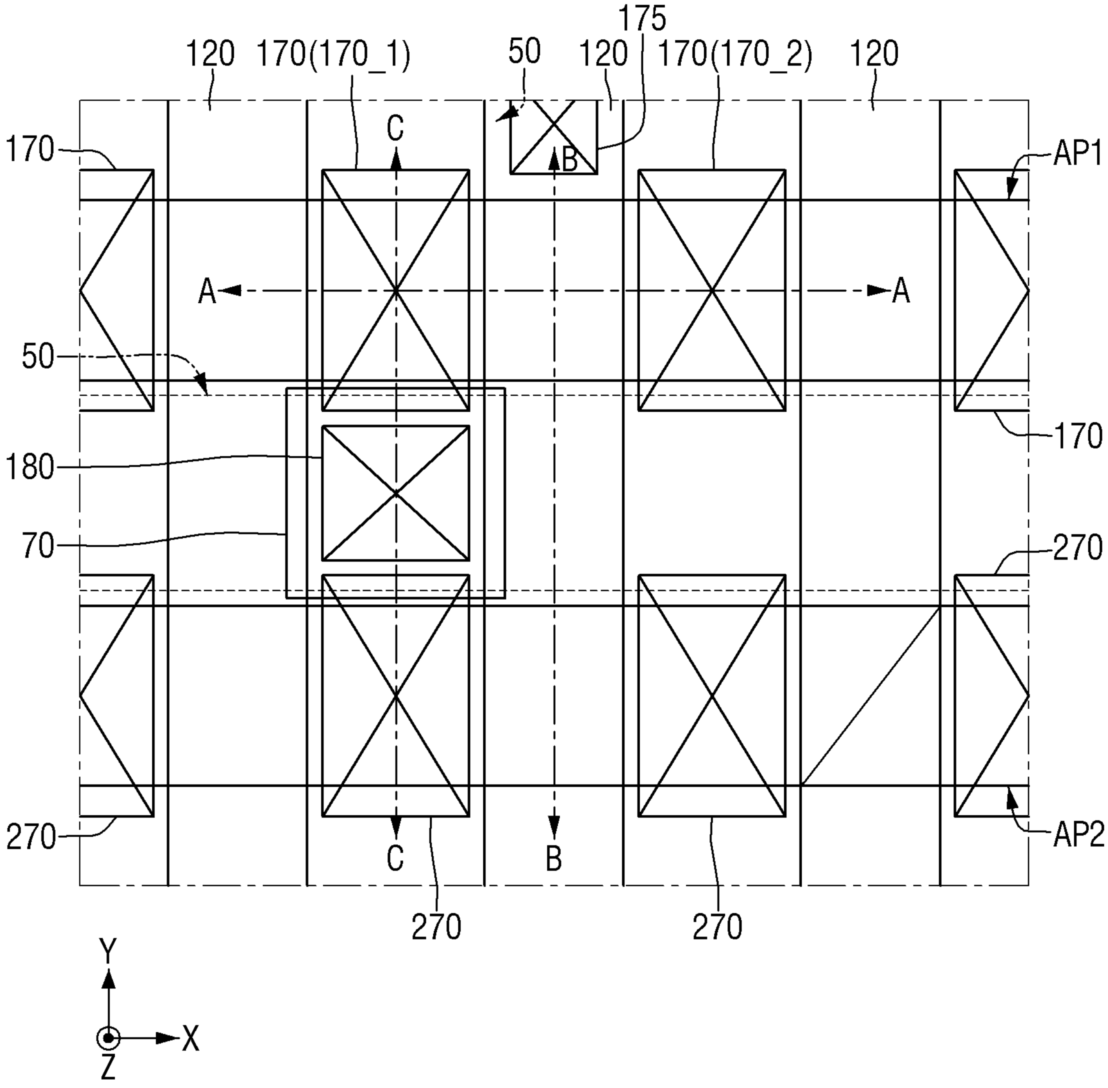
FIGS. 32 through 34 illustrate a semiconductor device according to some embodiments of the present disclosure.
Figure 33:
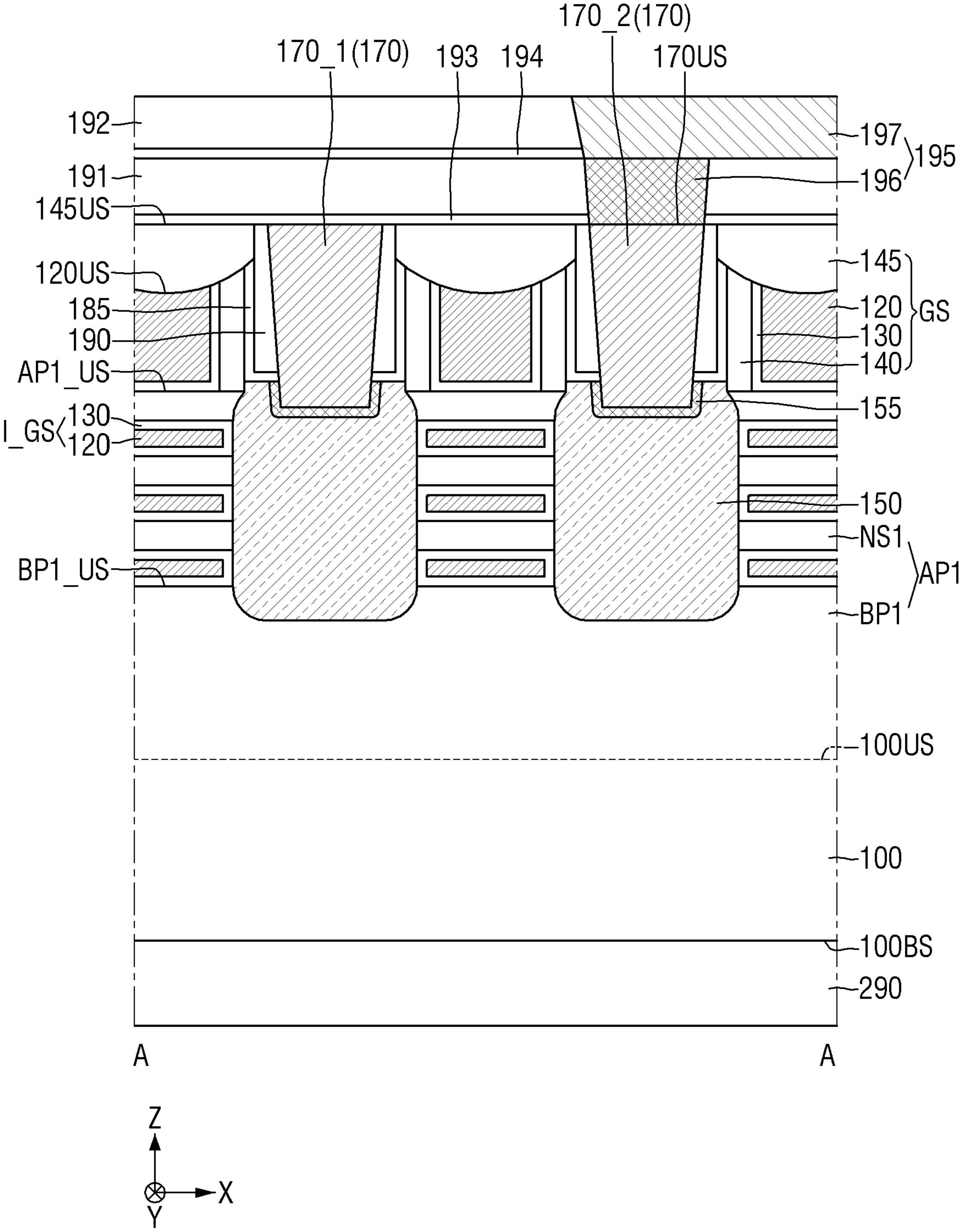
Figure 34:
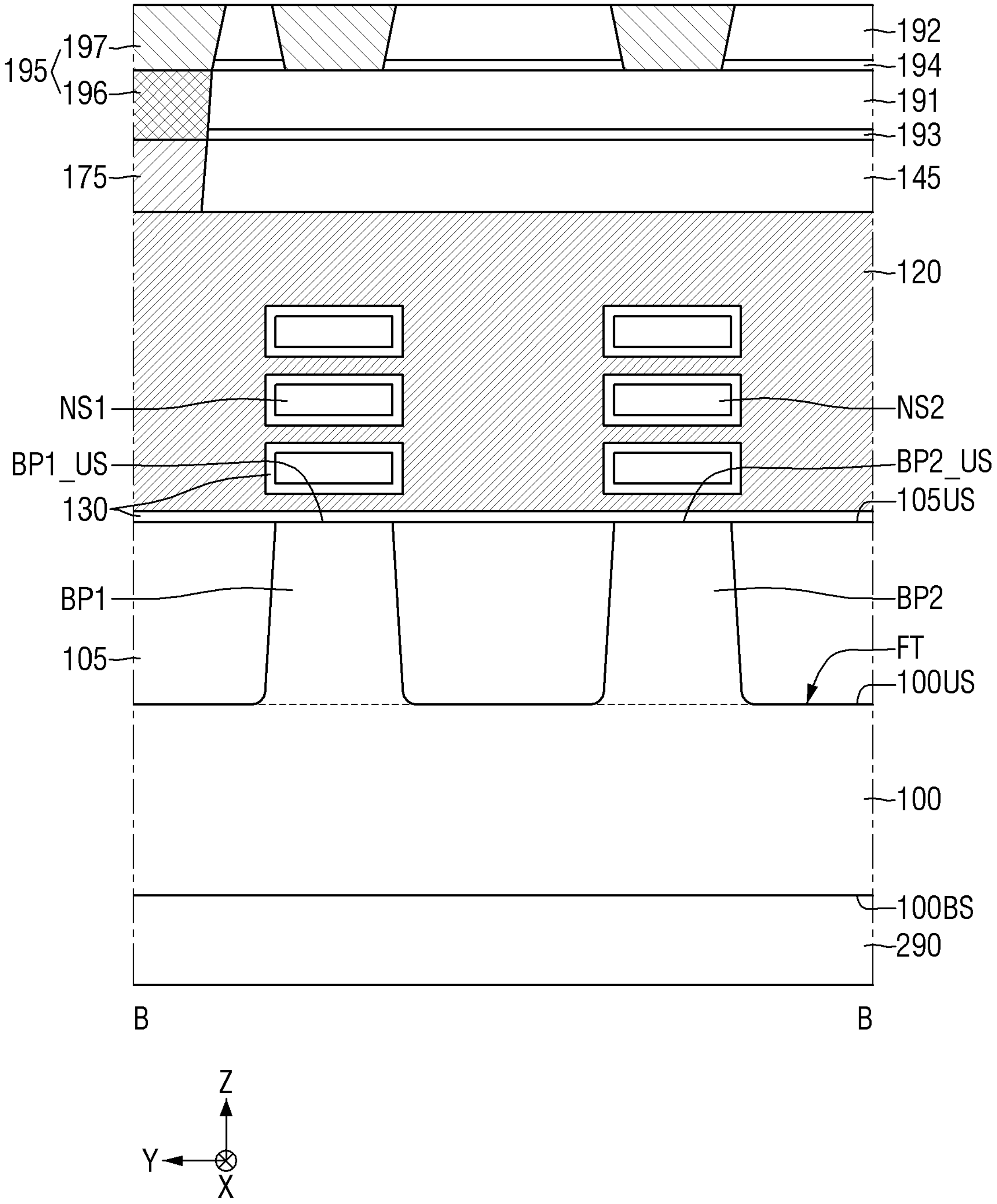

FIGS. 32 through 34 illustrate a semiconductor device according to some embodiments of the present disclosure. For convenience, FIGS. 32 through 34 will hereinafter be described, focusing mainly on the differences with FIGS. 1 through 8.

Specifically, FIG. 32 is a layout view of a semiconductor device according to some embodiments of the present disclosure. FIGS. 33 and 34 are cross-sectional views taken along lines A-A and B-B, respectively, of FIG. 32. A cross-sectional view taken along line C-C of FIG. 32 may be substantially the same as illustrated in FIG. 4.

Referring to FIGS. 32 through 34, a buried conductive pattern 70 may be formed as a contact.

The buried conductive pattern 70 may be disposed between first and second lower patterns BP1 and BP2, which are adjacent to each other in a second direction Y. The buried conductive pattern 70 may be disposed between gate electrodes 120, which are adjacent to each other in a first direction X. In a plan view, the buried conductive pattern 70 may not intersect the gate electrodes 120. Referring to FIG. 34, the buried conductive pattern 70 may not be disposed between the first and second lower patterns BP1 and BP2, which are disposed below the gate electrodes 120.

A rear wiring line 50 may extend in the first direction X, but the present disclosure is not limited thereto.

FIGS. 35 through 42 are cross-sectional views illustrating intermediate steps of a method of fabricating a semiconductor device according to some embodiments of the present disclosure. In particular, FIGS. 35 through 42 are cross-sectional views taken along line C-C of FIG. 1 illustrating intermediate steps of a method of fabricating a semiconductor device according to some embodiments of the present disclosure. The semiconductor device of FIGS. 1 through 8 may be obtained by the method of FIGS. 35 through 42.

Figure 35:
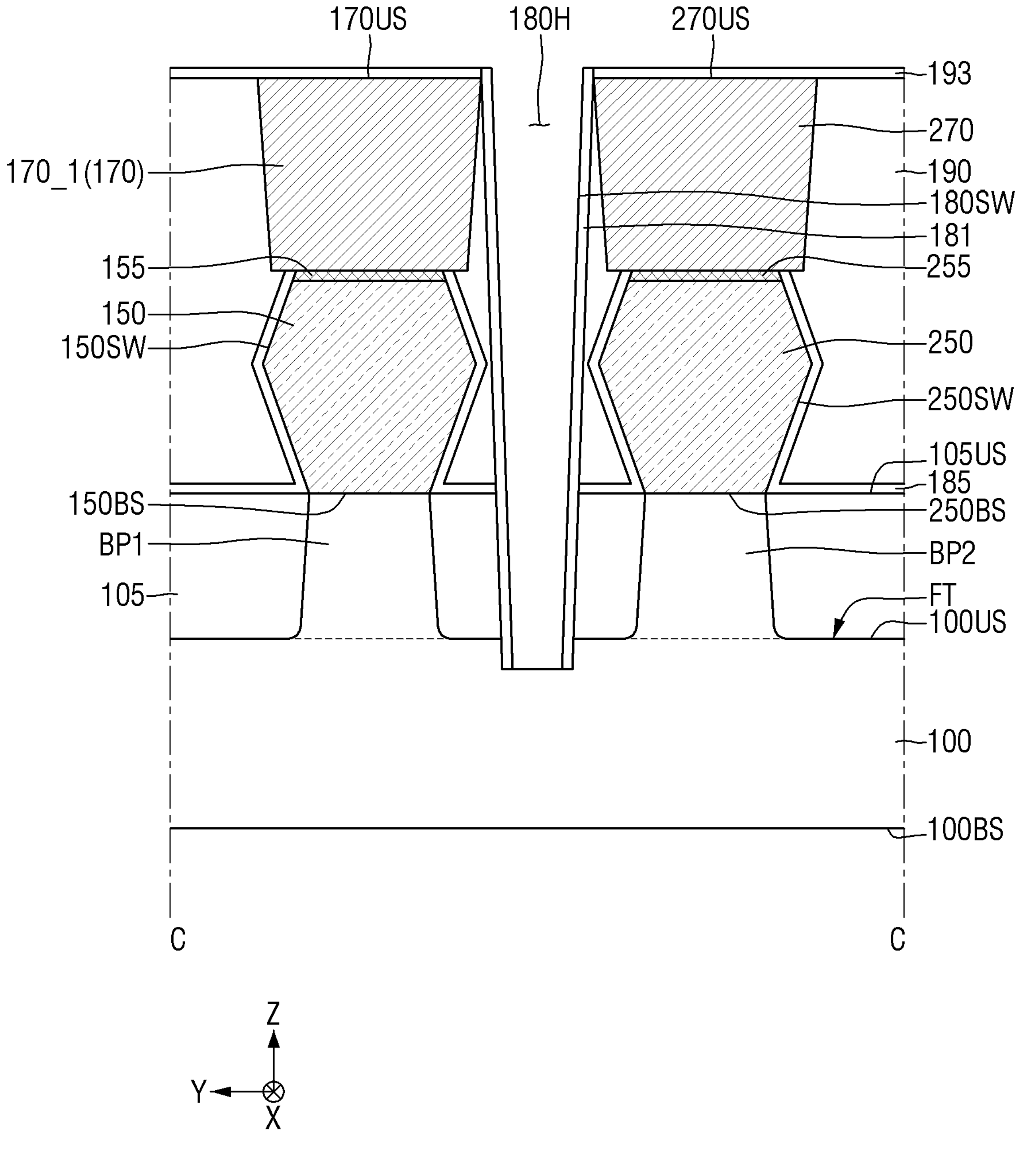
FIGS. 35 through 42 are cross-sectional views illustrating intermediate steps of a method of fabricating a semiconductor device according to some embodiments of the present disclosure.

Referring to FIG. 35, first and second source/drain patterns 150 and 250 are formed on first and second lower patterns BP1 and BP2, respectively. A source/drain etch stopper film 185 and a first upper interlayer insulating film 190 are formed on the first and second source/drain patterns 150 and 250.

Thereafter, referring to FIG. 2, first sheet patterns NS1 are formed on the first lower pattern BP1. As a result, a first active pattern AP1 is formed on a first surface 100US of a substrate 100. The substrate 100 has a second surface 100BS, which is opposite to the first surface 100US in a third direction Z. Although not specifically illustrated, second sheet patterns NS2 may be formed on the second lower pattern BP2. Gate insulating films 130, which surround the first sheet patterns NS1, and gate electrodes 120 may be formed on the first lower pattern BP1. Gate capping patterns 145 may be formed on the gate electrodes 120. As a result, gate structures GS may be formed on the first active pattern AP1. The height from upper surfaces 145US of the gate capping patterns 145 to an upper surface AP1_US of the first active pattern AP1 may be the same as the height from the upper surface AP1_US of the first active pattern AP1 to the upper surface of the first upper interlayer insulating film 190.

Thereafter, referring to FIG. 35, a first source/drain contact 170 may be formed on the first source/drain pattern 150. A second source/drain contact 270 may be formed on the second source/drain pattern 250. A first contact silicide film 155 may be formed between the first source/drain contact 170 and the first source/drain pattern 150. A second contact silicide film 255 may be formed between the second source/drain contact 270 and the second source/drain pattern 250.

A first upper etch stopper film 193 may be formed on the first upper interlayer insulating film 190, the first source/drain contact 170, and the second source/drain contact 270. The first upper etch stopper film 193 may extend along an upper surface 170US of the first source/drain contact 170 and an upper surface 270US of the second source/drain contact 270.

Thereafter, a contact connection via hole 180H may be formed between the first and second source/drain contacts 170 and 270. The contact connection via hole 180H may penetrate or extend in the first upper etch stopper film 193, the first upper interlayer insulating film 190, and a field insulating film 105. The contact connection via hole 180H may extend to the substrate 100. The contact connection via hole 180H may expose the substrate 100. For example, a first mask pattern may be formed on the first upper etch stopper film 193. The contact connection via hole 180H may be formed using the first mask pattern as an etch mask. The contact connection via hole 180H may be self-aligned between the first and second source/drain contacts 170 and 270.

Thereafter, a pre-via insulating liner may be formed on the sidewalls and the bottom surface of the contact connection via hole 180H and on the first upper etch stopper film 193. The pre-via insulating liner may be etched by an anisotropic etching process. As a result, via insulating liners 181 may be formed along the sidewalls of the contact connection via hole 180H. During the anisotropic etching process, part of the pre-via insulating liner formed on the bottom surface of the contact connection via hole 180H may be removed. During the anisotropic etching process, parts of the pre-via insulating liner formed along the profile of the first upper etch stopper film 193 may also be removed.

The anisotropic etching process may not be performed after the formation of the pre-via insulating liner. That is, steps following the step illustrated in FIG. 36 may be formed after the formation of the pre-via insulating liner. In this case, the parts of the pre-via insulating liner formed along the profile of the first upper etch stopper film 193 may be the upper via insulating liners 181UP of FIG. 17.

Figure 36:
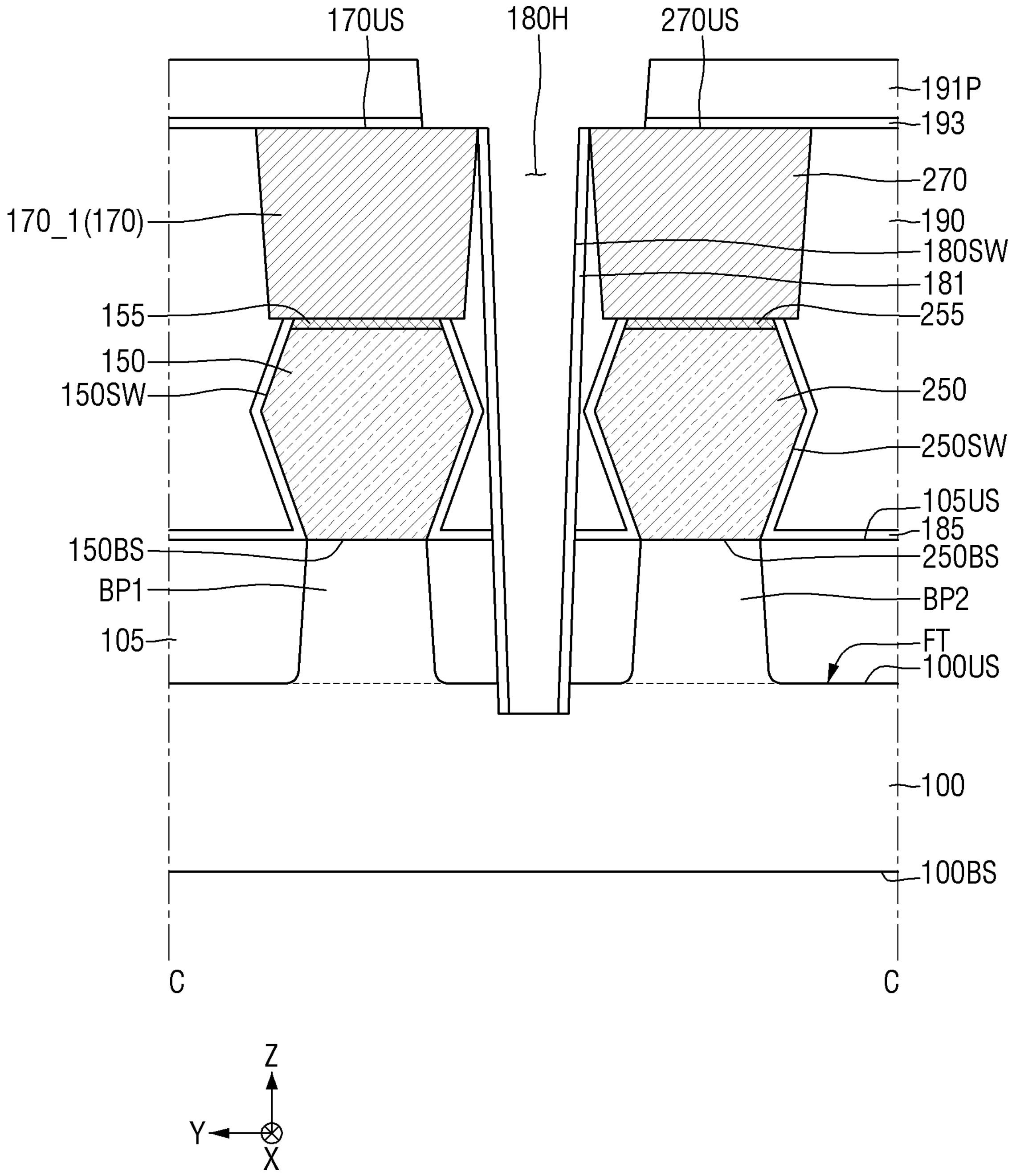

Referring to FIG. 36, a pre-interlayer insulating film 191P may be formed on the first upper etch stopper film 193.

The pre-interlayer insulating film 191P may include an opening exposing the contact connection via hole 180H. The opening of the pre-interlayer insulating film 191P may expose part of the upper surface 170US of the first source/drain contact 170 and part of the upper surface 270US of the second source/drain contact 270.

The opening of the pre-interlayer insulating film 191P may not expose the upper surface 270US of the second source/drain contact 270.

For example, the pre-interlayer insulating film 191P may fill or be in the contact connection via hole 180H. The pre-interlayer insulating film 191P may cover or be on the first upper etch stopper film 193. Thereafter, an opening exposing the contact connection via hole 180H may be formed by an etching process. During the formation of the opening, part of the pre-interlayer insulating film 191P that fills or is in the contact connection via hole 180H may be removed.

In another example, a sacrificial pattern may be formed in the contact connection via hole 180H. The pre-interlayer insulating film 191P may be formed on the sacrificial pattern and the first upper etch stopper film 193. Thereafter, an opening exposing the contact connection via hole 180H may be formed. During the formation of the opening, the sacrificial pattern that fills or is in the contact connection via hole 180H may be removed.

Figure 37:
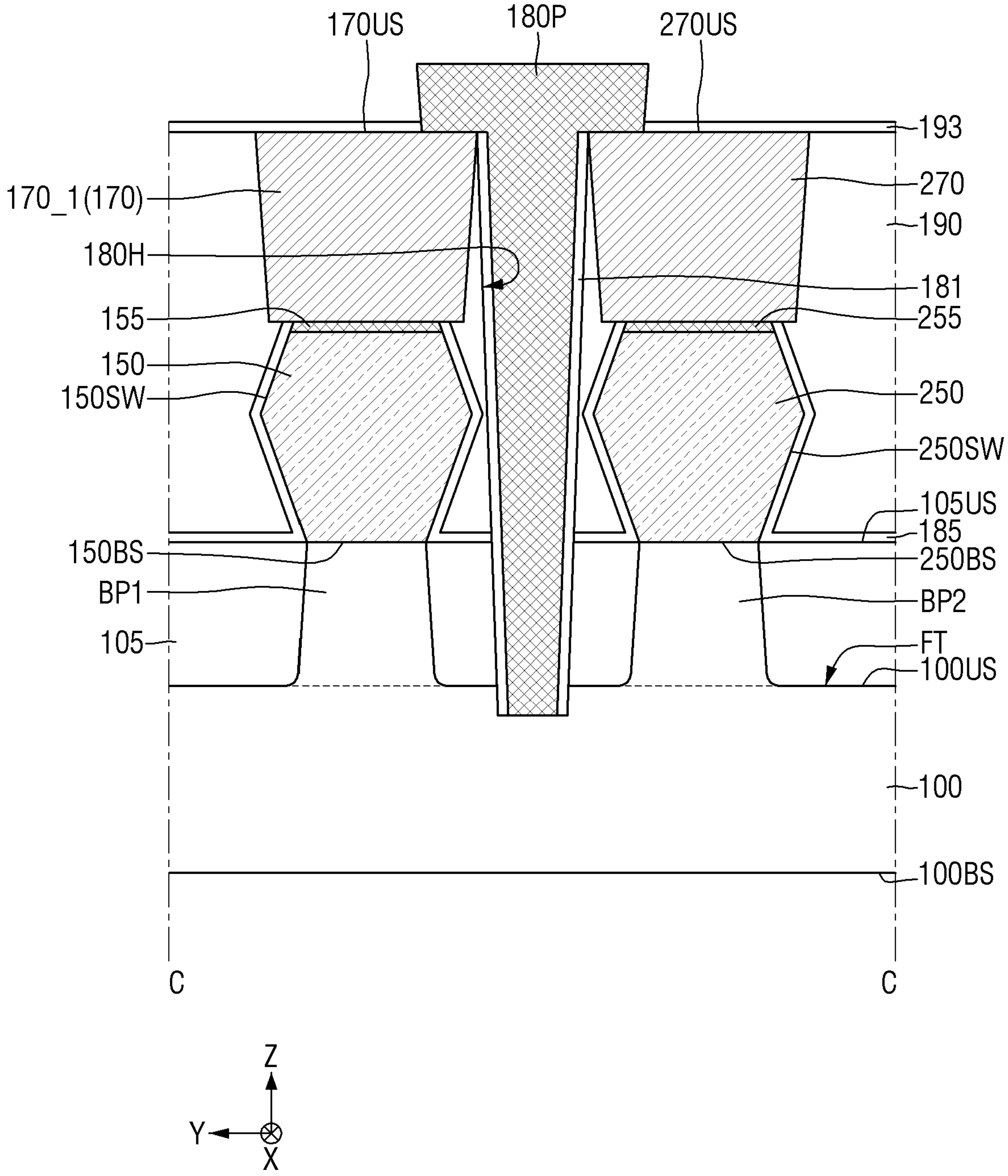

Referring to FIGS. 36 and 37, a pre-contact connection via 180P may be formed in the contact connection via hole 180H. The pre-contact connection via 180P may be formed on the via insulating liners 181.

The pre-contact connection via 180P may fill or be in the opening of the pre-interlayer insulating film 191P. The pre-contact connection via 180P may be formed on the upper surface 170US of the first source/drain contact 170 and the upper surface 270US of the second source/drain contact 270.

Thereafter, the pre-interlayer insulating film 191P may be removed.

Figure 38:
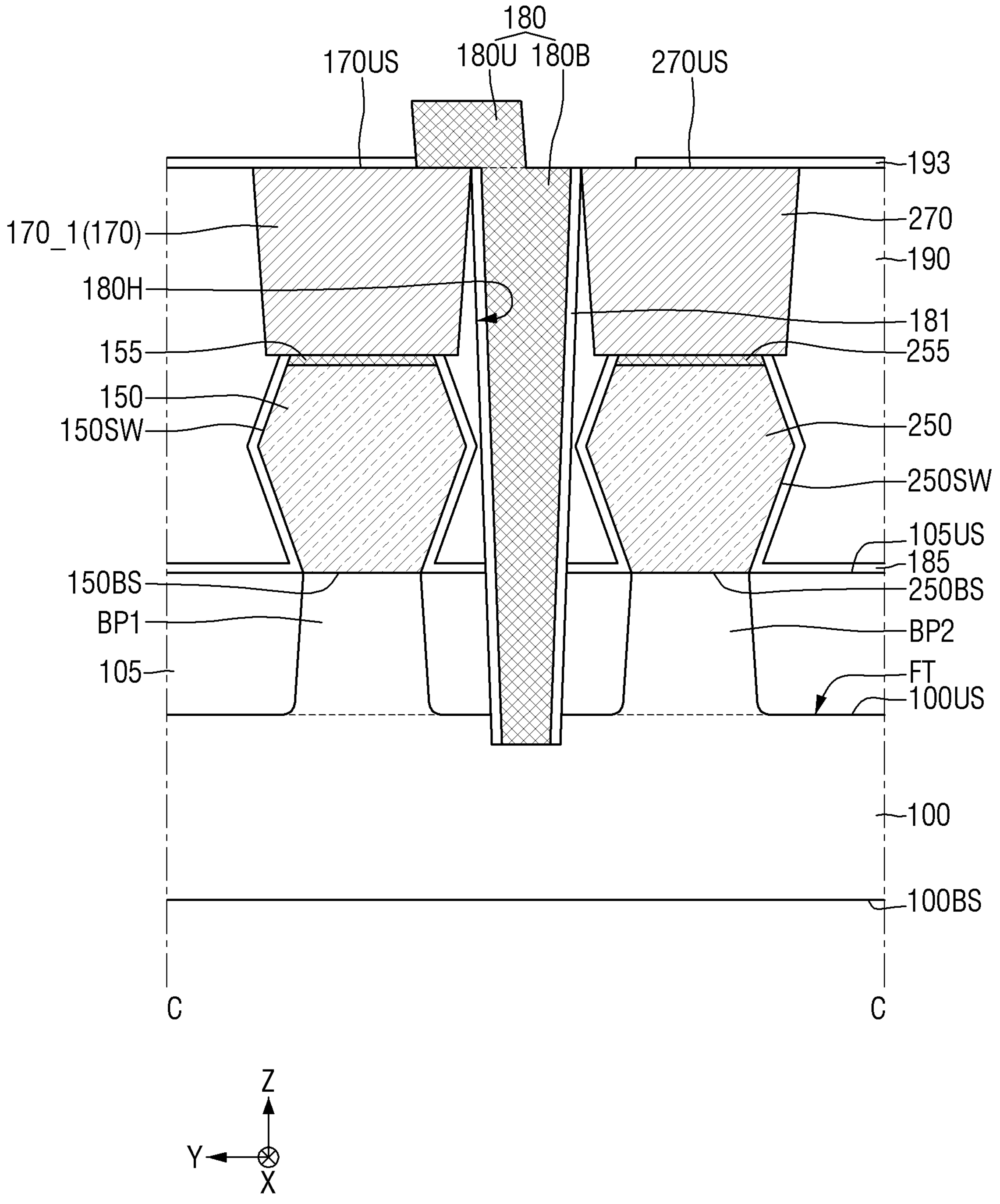

Referring to FIGS. 37 and 38, a contact connection via 180 may be formed by removing part of the pre-contact connection via 180P.

Part of the pre-contact connection via 180P on the upper surface 270US of the second source/drain contact 270 may be removed. Accordingly, the contact connection via 180 may be in contact with the upper surface 170US of the first source/drain contact 170, but not in contact with the upper surface 270US of the second source/drain contact 270.

As part of the pre-contact connection via 180P connected to the upper surface 270US of the second source/drain contact 270 is removed, part of the upper surface 270US of the second source/drain contact 270 may be exposed. The first upper etch stopper film 193 is not disposed on the exposed part of the upper surface 270US of the second source/drain contact 270.

Figure 39:
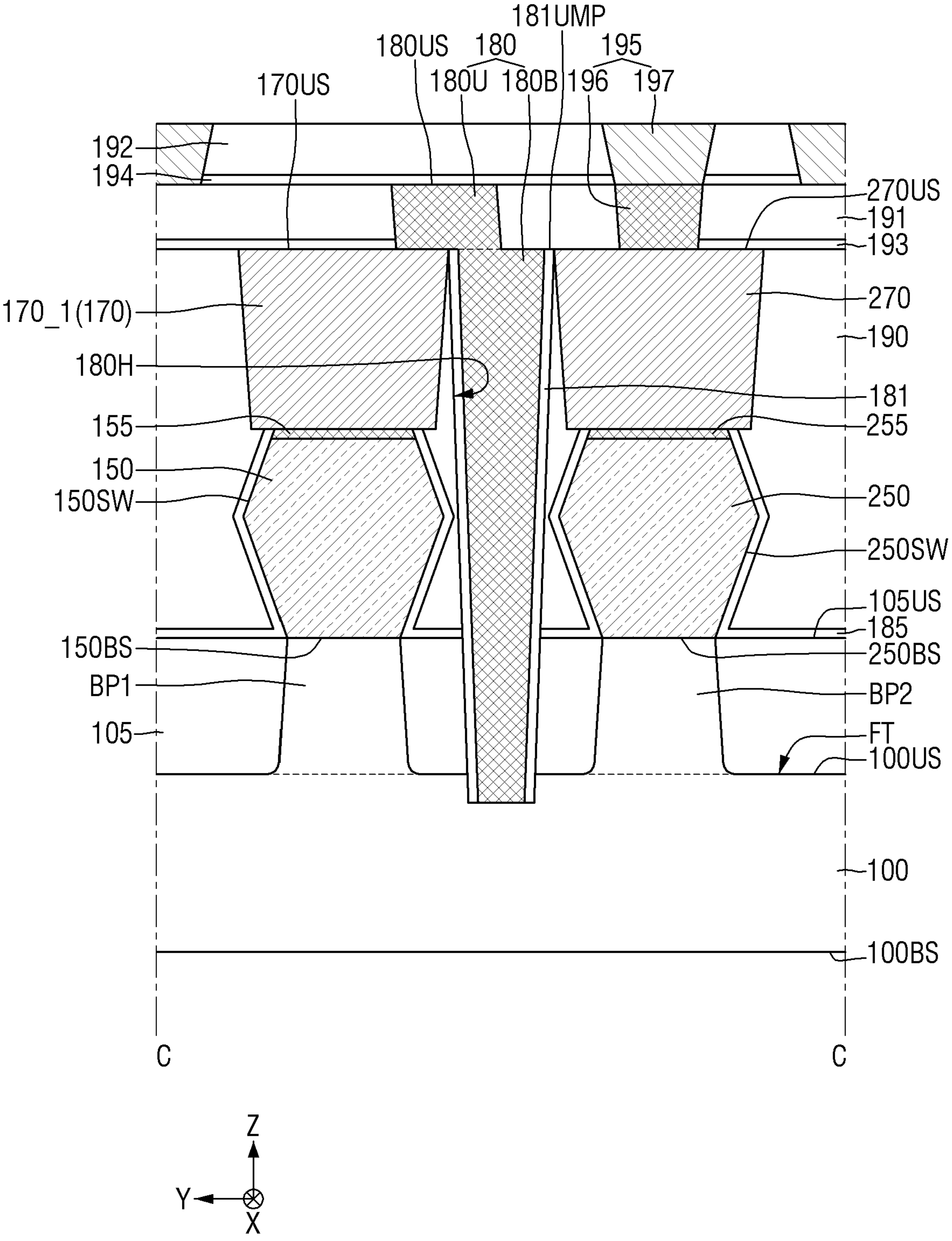

Referring to FIGS. 38 and 39, a second upper interlayer insulating film 191 may be formed on the first upper etch stopper film 193. A front wiring via 196 may be formed in the second upper interlayer insulating film 191.

Thereafter, a second upper etch stopper film 194 and a third upper interlayer insulating film 192 may be formed. A front wiring line 197, which is connected to the front wiring via 196, may be formed in the third upper interlayer insulating film 192.

In some embodiments, a front wiring via 196 and a front wiring line 197 that have an integral structure may be formed in the second upper interlayer insulating film 191.

Figure 40:
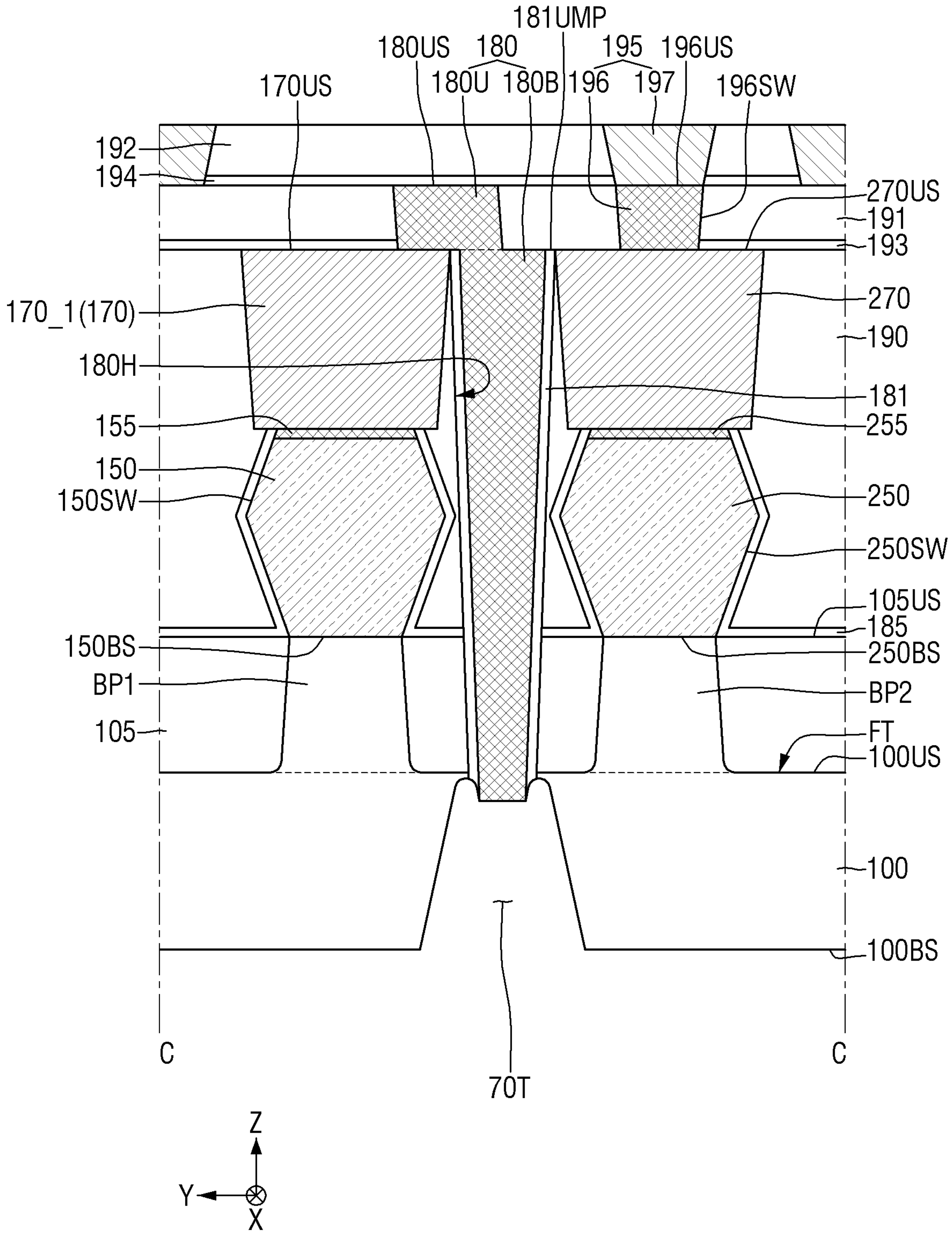

Referring to FIG. 40, a buried pattern trench 70T may be formed in the substrate 100.

The buried pattern trench 70T may extend from the second surface 100BS to the first surface 100US of the substrate 100. The buried pattern trench 70T may expose the contact connection via 180. The buried pattern trench 70T may expose parts of the sidewalls of the contact connection via 180. As a result, first and second concave areas 70T_BCV1 and 70T_BCV2 of the bottom surface of the buried pattern trench 70T may be formed (e.g., see FIGS. 5-7).

Figure 41:
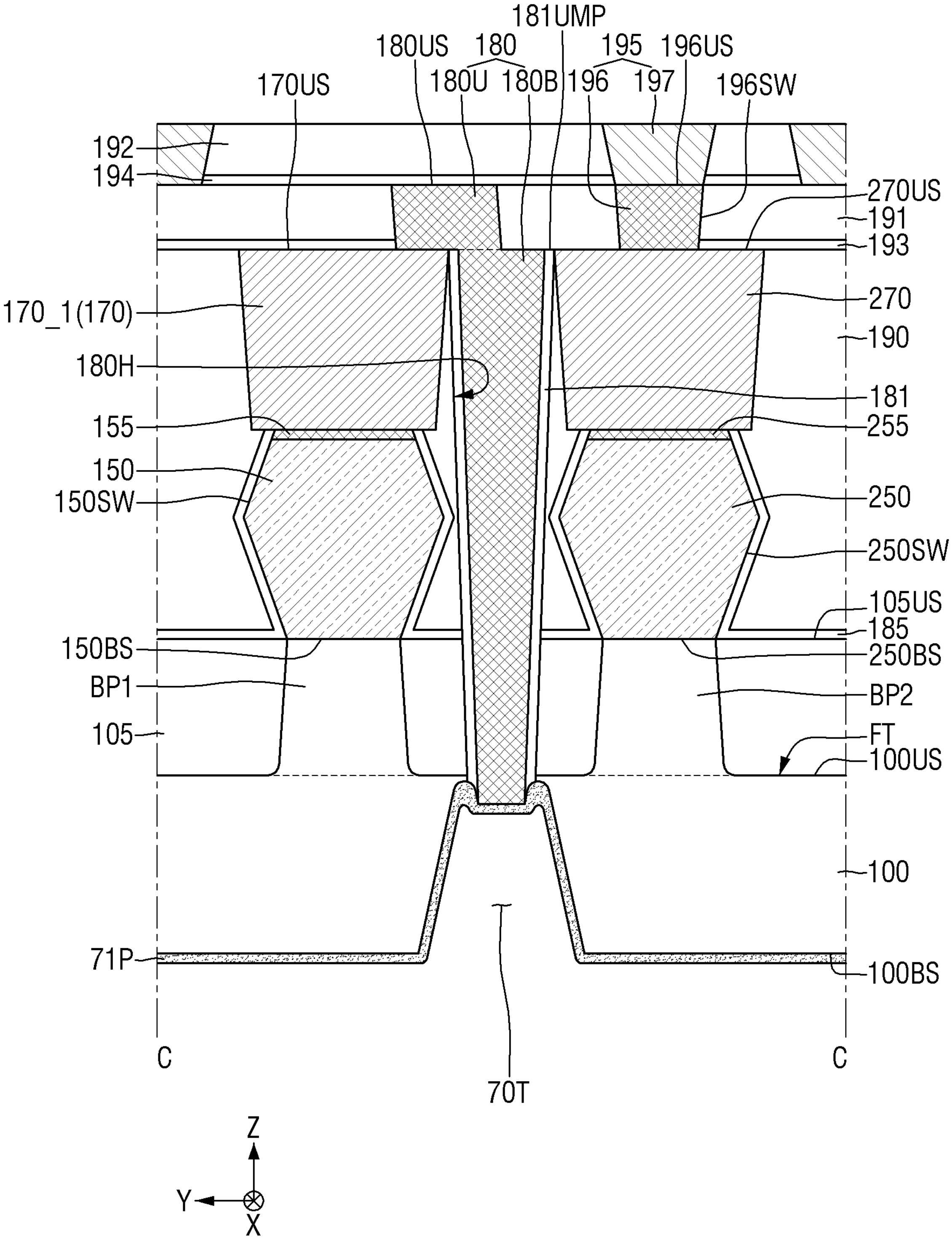

Referring to FIGS. 40 and 41, a pre-buried insulating liner 71P may be formed along the profile of the buried pattern trench 70T. The pre-buried insulating liner 71P may be formed along the second surface 100BS of the substrate 100.

The pre-buried insulating liner 71P may be formed by, for example, an atomic layer deposition (ALD) method, but the present disclosure is not limited thereto.

Figure 42:
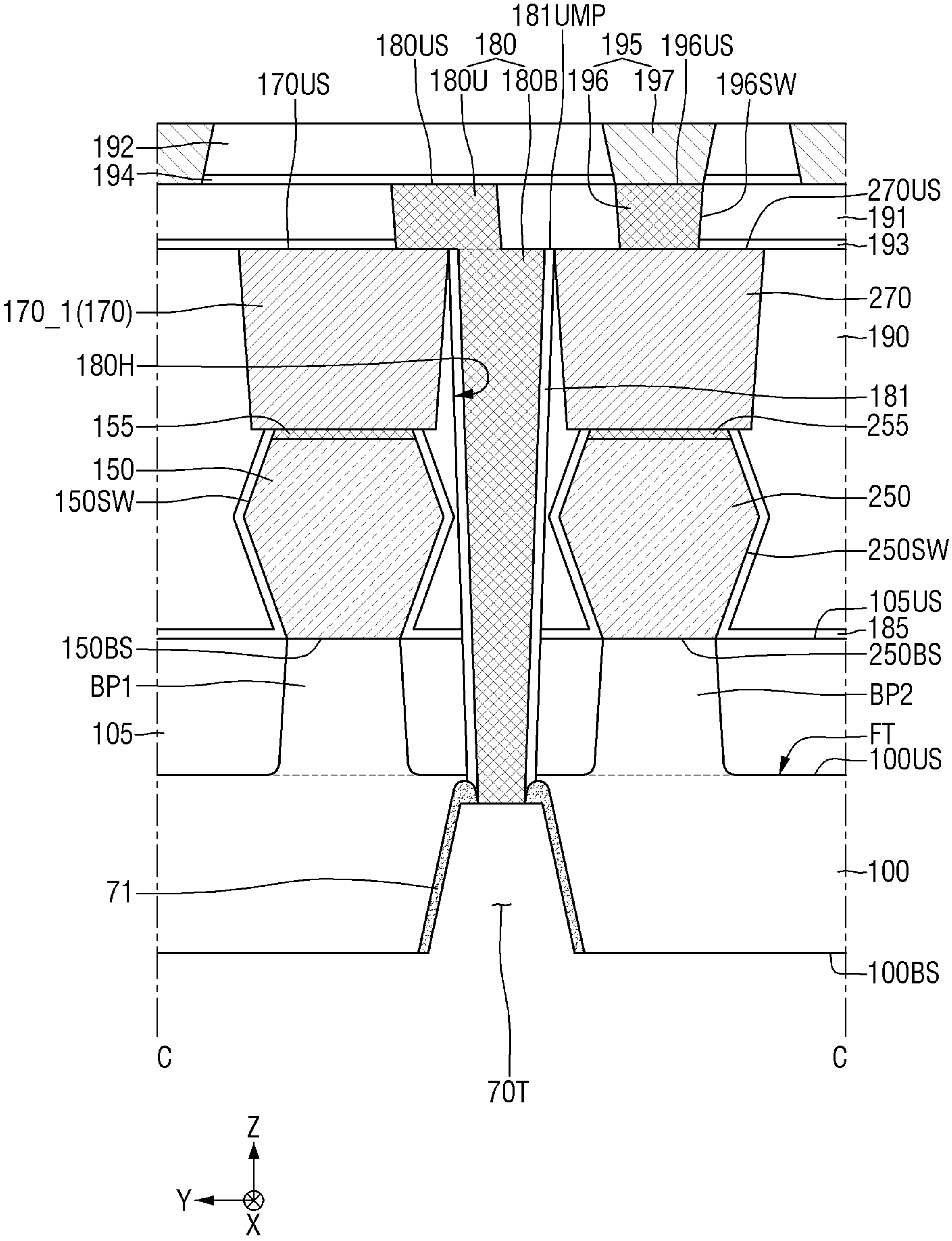

Referring to FIGS. 41 and 42, first buried insulating liners 71 may be formed along the profile of the buried pattern trench 70T by removing parts of the pre-buried insulating liner 71P.

During the formation of the first buried insulating liners 71, parts of the pre-buried insulating liner 71 on the second surface 100BS of the substrate 100 may be removed. Also, during the formation of the first buried insulating liners 71, the contact connection via 180 may be exposed. For example, a bottom surface of the contact connection via 180 may be exposed.

Thereafter, referring to FIG. 4, a buried conductive pattern 70 may be formed in the buried pattern trench 70T. A rear wiring line 50, which is connected to the buried conductive pattern 70, may be formed on the second surface 100BS of the substrate 100.

Figure 43:
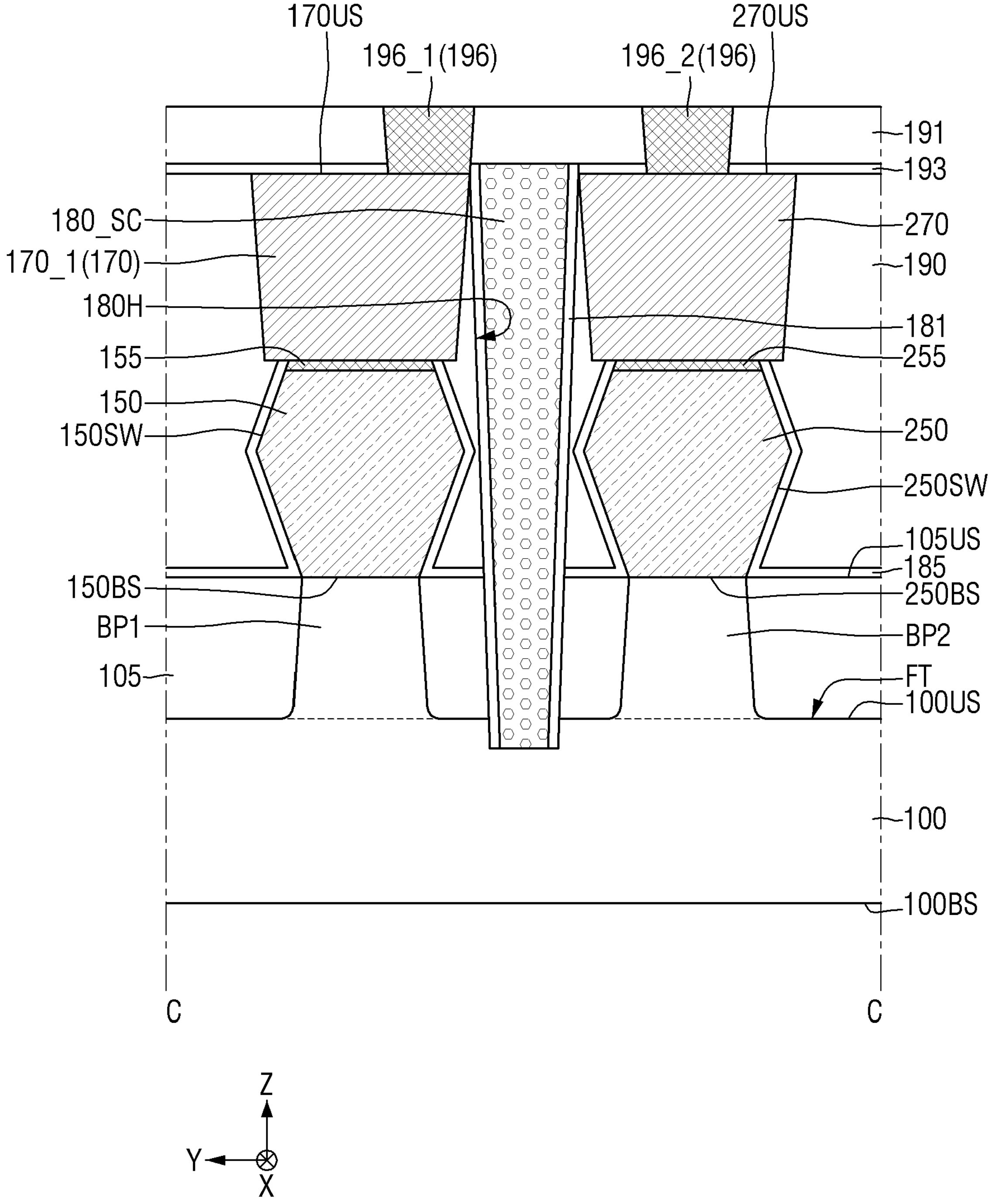
FIGS. 43 through 47 are cross-sectional views illustrating intermediate steps of a method of fabricating a semiconductor device according to some embodiments of the present disclosure.

FIGS. 43 through 47 are cross-sectional views illustrating intermediate steps of a method of fabricating a semiconductor device according to some embodiments of the present disclosure. FIG. 43 illustrates a step following the step illustrated in FIG. 35. In particular, FIGS. 43 through 47 are cross-sectional views taken along line C-C of FIG. 1 illustrating intermediate steps of a method of fabricating a semiconductor device according to some embodiments of the present disclosure. The semiconductor device of FIGS. 18 and 19 may be obtained by the method of FIGS. 43 through 47.

Referring to FIG. 43, a via sacrificial pattern 180_SC may be formed in a contact connection via hole 180H. The via sacrificial pattern 180_SC may fill or be in the contact connection via hole 180H.

Thereafter, a second upper interlayer insulating film 191 may be formed on the via sacrificial pattern 180_SC and a first upper etch stopper film 193. Thereafter, front wiring vias 196 may be formed in the second upper interlayer insulating film 191. A first front wiring via 196_1 may be connected to a first source/drain contact 170 through the first upper etch stopper film 193. A second front wiring via 196_2 may be connected to a second source/drain contact 270 through the first upper etch stopper film 193.

Figure 44:
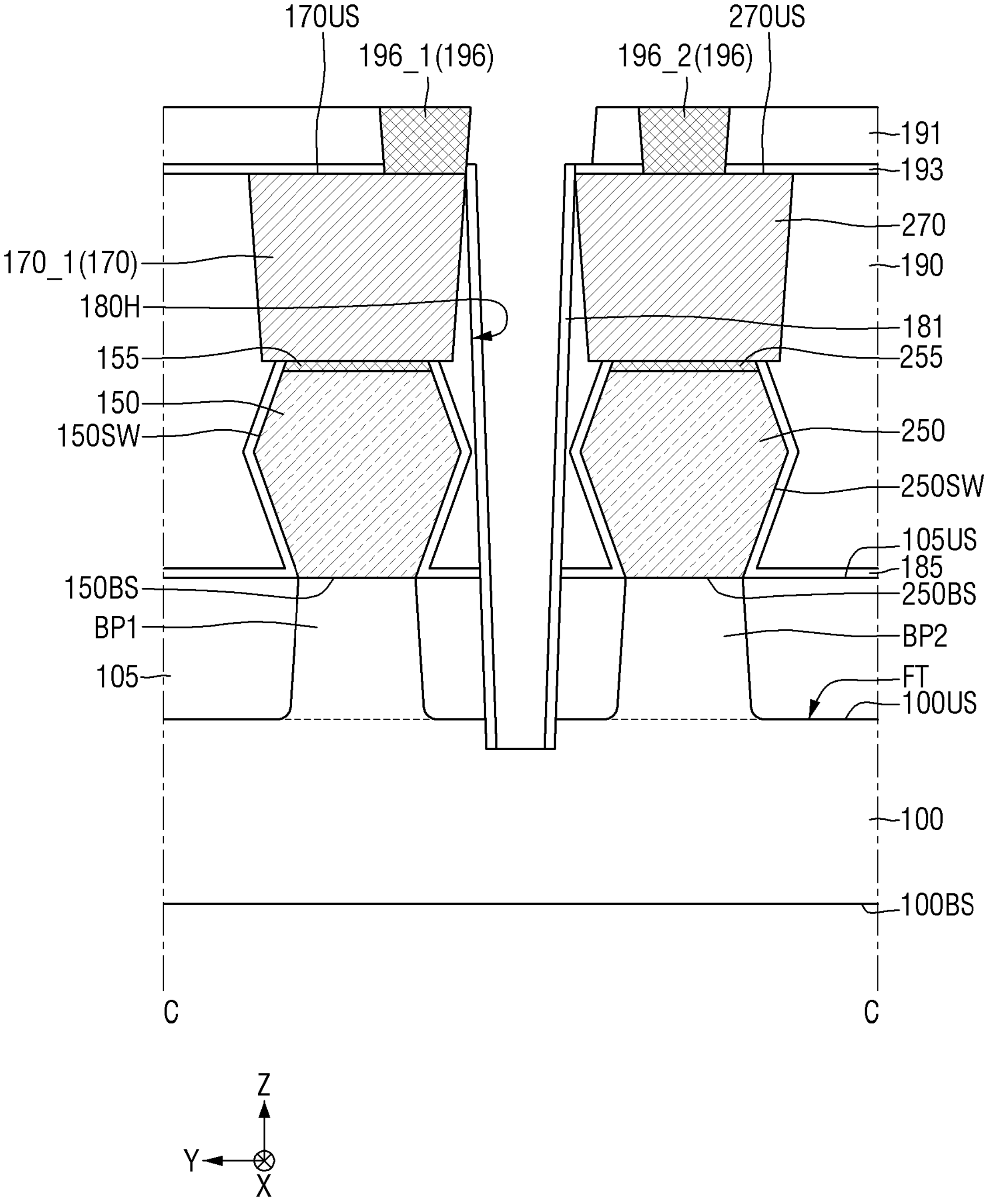

Referring to FIGS. 43 and 44, an opening exposing the via sacrificial pattern 180_SC may be formed in the second upper interlayer insulating film 191.

Thereafter, the exposed via sacrificial pattern 180_SC may be removed.

Figure 45:
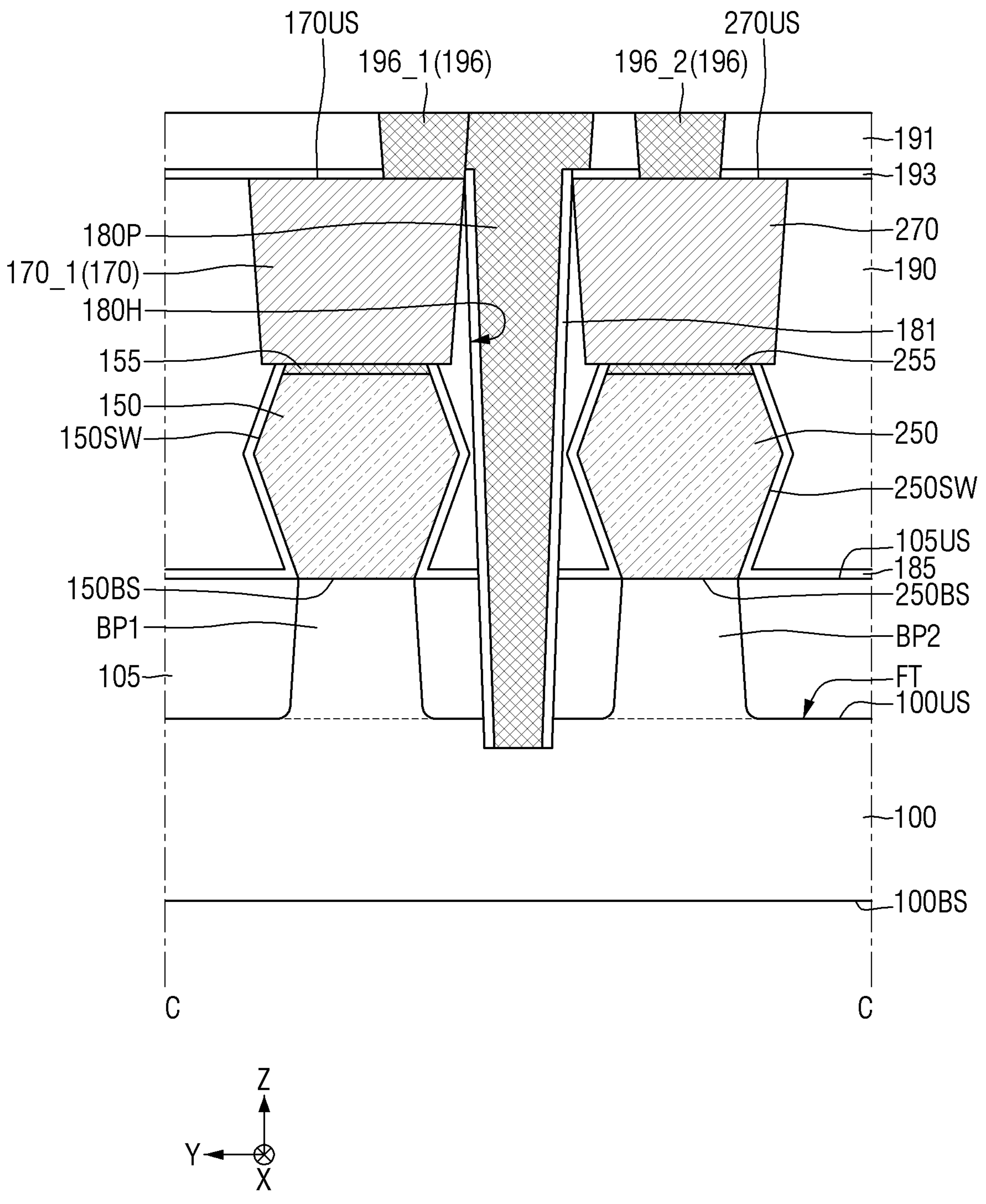

Referring to FIGS. 44 and 45, a pre-contact connection via 180P may be formed in the contact connection via hole 180H. The pre-contact connection via 180P is in contact with the first front wiring via 196_1.

The pre-contact connection via 180P may be formed on via insulating liners 181. The pre-contact connection via 180P may fill or be in the opening of the second upper interlayer insulating film 191.

Part of the pre-contact connection via 180P may be formed on an upper surface 270US of the second source/drain contact 270. As the first upper etch stopper film 193 is disposed between the pre-contact connection via 180P and the second source/drain contact 270, the pre-contact connection via 180P may not be in contact with the upper surface 270US of the second source/drain contact 270.

Figure 46:
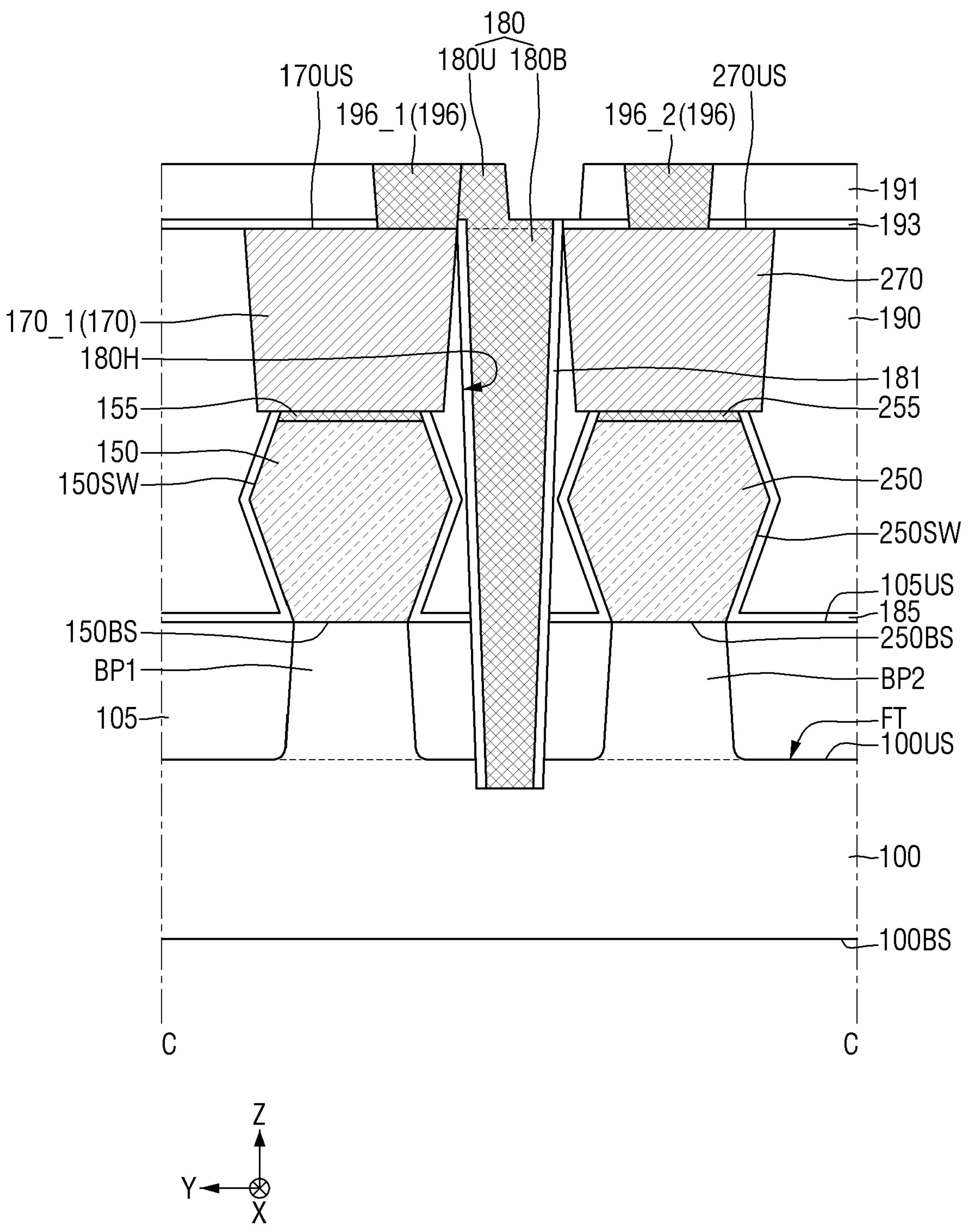

Referring to FIGS. 45 and 46, a contact connection via 180 may be formed by removing part of the pre-contact connection via 180P.

Part of the pre-contact connection via 180P on the upper surface 270US of the second source/drain contact 270 may be removed.

Figure 47:
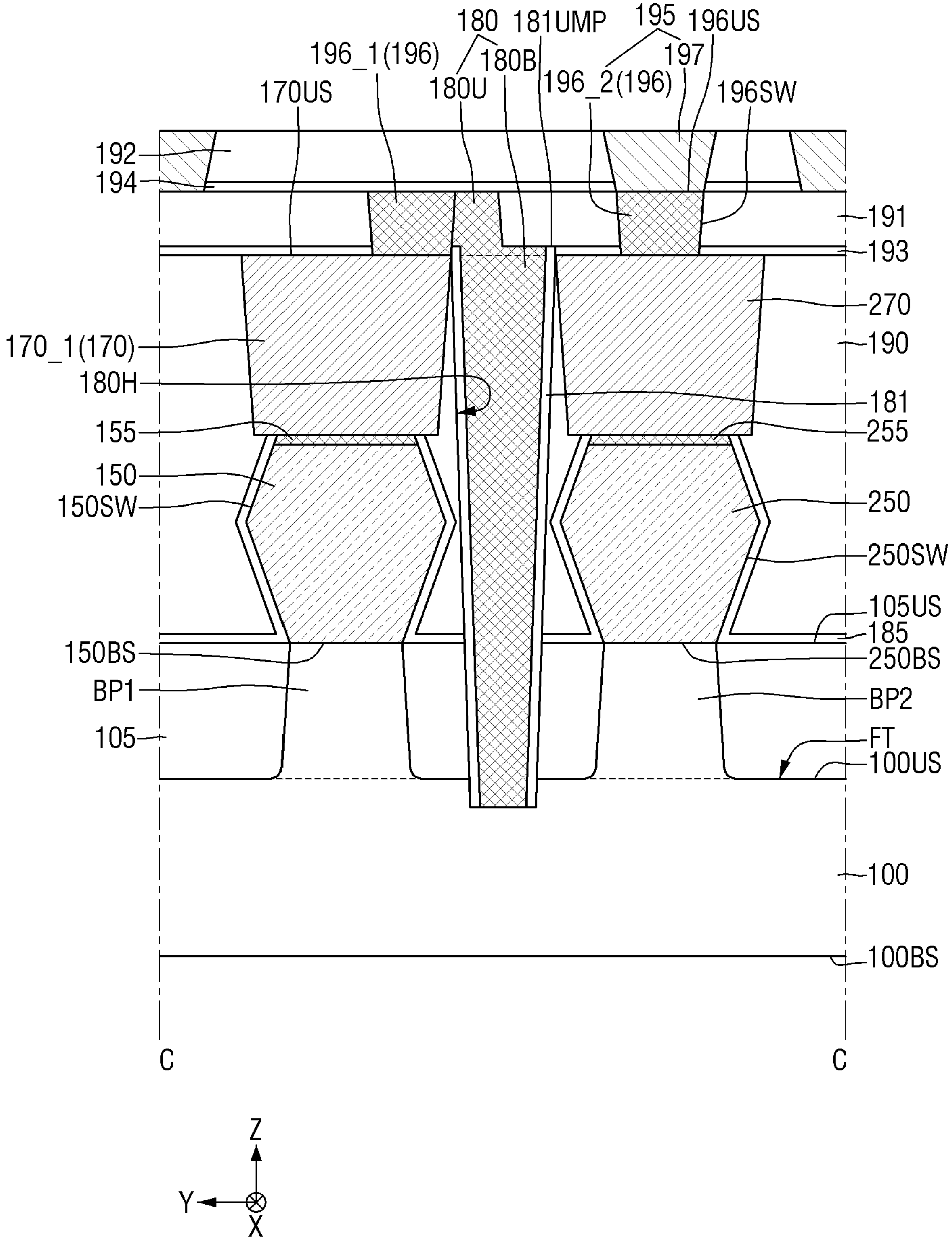

Referring to FIGS. 46 and 47, the second upper interlayer insulating film 191 may be additionally formed on the upper surface 270US of the second source/drain contact 270 from which part of the pre-contact connection via 180P has been removed.

Thereafter, a second upper etch stopper film 194 and a third upper interlayer insulating film 192 may be formed. A front wiring line 197, which is connected to the second front wiring via 196_2, may be formed in the third upper interlayer insulating film 192.

In concluding the detailed description, those skilled in the art will appreciate that many variations and modifications may be made to the example embodiments without substantially departing from the principles of the present inventive concept. Therefore, the disclosed example embodiments of the invention are used in a generic and descriptive sense only and not for purposes of limitation.

What is claimed is:

1. A semiconductor device comprising:

a substrate that has first and second surfaces opposite to each other in a first direction;

a first fin-type pattern that protrudes in the first direction from the first surface of the substrate and extends in a second direction;

a first source/drain pattern that is on the first fin-type pattern and has a bottom surface electrically connected to the first fin-type pattern;

a first source/drain contact that is on the first source/drain pattern and is electrically connected to the first source/drain pattern;

a contact connection via that extends in the first direction and is electrically connected to the first source/drain contact;

a buried conductive pattern that is in the substrate, is electrically connected to the contact connection via, and has first and second surfaces opposite to each other in the first direction, the first surface of the buried conductive pattern facing the first source/drain contact; and first buried insulating liners that extend along sidewalls and along the first surface of the buried conductive pattern, wherein a height from the bottom surface of the first source/drain pattern to an upper surface of the contact connection via is greater than a height from the bottom surface of the first source/drain pattern to an upper surface of the first source/drain contact, and wherein a thickness of a first portion of at least one of the first buried insulating liners that is on a respective one of the sidewalls of the buried conductive pattern is less than a thickness of a second portion of the at least one of the first buried insulating liners that is on the first surface of the buried conductive pattern.

2. The semiconductor device of claim 1, further comprising second buried insulating liners between the first buried insulating liners and the substrate.

3. The semiconductor device of claim 2, wherein the second buried insulating liners are on the sidewalls of the buried conductive pattern, and wherein the first surface of the buried conductive pattern is free of the second buried insulating liners.

4. The semiconductor device of claim 1, wherein the contact connection via includes upper and lower portions, wherein the upper portion of the contact connection via protrudes in the first direction beyond the upper surface of the first source/drain contact and is in contact with the upper surface of the first source/drain contact, and wherein the lower portion of the contact connection via is between the upper portion of the contact connection via and the buried conductive pattern.

5. The semiconductor device of claim 1, further comprising a front wiring via that is on the first surface of the substrate and is in contact with the upper surface of the first source/drain contact, wherein the contact connection via includes upper and lower portions, wherein the upper portion of the contact connection via protrudes in the first direction beyond the upper surface of the first source/drain contact and is in contact with the front wiring via, and wherein the lower portion of the contact connection via is between the upper portion of the contact connection via and the buried conductive pattern.

6. The semiconductor device of claim 1, further comprising via insulating liners that extend along sidewalls of the contact connection via, wherein the via insulating liners are between the contact connection via and the first source/drain contact and are in contact with the contact connection via and the first source/drain contact.

7. The semiconductor device of claim 6, wherein a portion of the contact connection via protrudes in the first direction beyond uppermost portions of the via insulating liners.

8. The semiconductor device of claim 1, wherein a portion of the contact connection via extends into the buried conductive pattern, and wherein respective portions of sidewalls of the contact connection via are in contact with the buried conductive pattern.

9. The semiconductor device of claim 1, wherein the substrate includes a buried pattern trench, wherein a bottom surface of the buried pattern trench includes first and second concave areas, and wherein the first buried insulating liners are in the first and second concave areas of the bottom surface of the buried pattern trench.

10. The semiconductor device of claim 1, wherein a height from the second surface of the substrate to a bottom surface of the contact connection via is less than a thickness of the substrate in the first direction.

11. The semiconductor device of claim 1, further comprising:

a second fin-type pattern that protrudes in the first direction from the first surface of the substrate and is adjacent to the first fin-type pattern in a third direction;

a second source/drain pattern that is on the second fin-type pattern and is electrically connected to the second fin-type pattern;

a second source/drain contact that is on the second source/drain pattern and is electrically connected to the second source/drain pattern; and via insulating liners that extend along sidewalls of the contact connection via, wherein the via insulating liners are in contact with the first and second source/drain contacts, and wherein the second source/drain contact is not electrically connected to the contact connection via.

12. A semiconductor device comprising:

a substrate that has first and second surfaces opposite to each other in a first direction, the substrate comprising a buried pattern trench that extends in the first direction from the second surface toward the first surface of the substrate and has a bottom surface including first and second concave areas;

a fin-type pattern that protrudes in the first direction from the first surface of the substrate and extends in a second direction;

a source/drain pattern that is on the fin-type pattern and is electrically connected to the fin-type pattern;

a source/drain contact that is on the source/drain pattern and is electrically connected to the source/drain pattern;

a contact connection via that extends in the first direction and is electrically connected to the source/drain contact;

first buried insulating liners within the buried pattern trench that extend along at least a portion of sidewalls, the bottom surface, and the first and second concave areas of the buried pattern trench; and a buried conductive pattern that is on the first buried insulating liners, is in the buried pattern trench, and is in contact with the contact connection via.

13. The semiconductor device of claim 12, further comprising second buried insulating liners that extend along the sidewalls of the buried pattern trench, wherein the first buried insulating liners are between the buried conductive pattern and the second buried insulating liners.

14. The semiconductor device of claim 12, wherein the contact connection via includes upper and lower portions, wherein the upper portion of the contact connection via protrudes in the first direction beyond an upper surface of the source/drain contact and is in contact with the upper surface of the source/drain contact, and wherein the lower portion of the contact connection via is between the upper portion of the contact connection via and the buried conductive pattern.

15. The semiconductor device of claim 12, further comprising a front wiring via that is on the first surface of the substrate and is in contact with an upper surface of the source/drain contact, wherein the contact connection via includes upper and lower portions, wherein the upper portion of the contact connection via protrudes in the first direction beyond the upper surface of the source/drain contact and is in contact with the front wiring via, and wherein the lower portion of the contact connection via is between the upper portion of the contact connection via and the buried conductive pattern.

16. The semiconductor device of claim 12, wherein the source/drain pattern includes a bottom surface electrically connected to the fin-type pattern, wherein a height from the bottom surface of the source/drain pattern to an upper surface of the source/drain contact is greater than a height from the bottom surface of the source/drain pattern to an upper surface of the contact connection via, and wherein the source/drain contact is in contact with the upper surface of the contact connection via.

17. The semiconductor device of claim 12, further comprising a front wiring via that is on the first surface of the substrate and is in contact with an upper surface of the source/drain contact and an upper surface of the contact connection via.

18. A semiconductor device comprising:

a substrate that has first and second surfaces opposite to each other in a first direction;

a first fin-type pattern that protrudes in the first direction from the first surface of the substrate and extends in a second direction;

a second fin-type pattern that protrudes in the first direction from the first surface of the substrate and is adjacent to the first fin-type pattern in a third direction;

a first source/drain pattern that is on the first fin-type pattern and is electrically connected to the first fin-type pattern;

a second source/drain pattern that is on the second fin-type pattern and is electrically connected to the second fin-type pattern;

a first source/drain contact that is on the first source/drain pattern and is electrically connected to the first source/drain pattern;

a second source/drain contact that is on the second source/drain pattern and is electrically connected to the second source/drain pattern;

a contact connection via that is between the first and second source/drain contacts, extends in the first direction, and is electrically connected to the first source/drain contact;

via insulating liners that extend along sidewalls of the contact connection via and are in contact with the first and second source/drain contacts;

a buried conductive pattern that is in the substrate, is electrically connected to the contact connection via, and has first and second surfaces opposite to each other in the first direction, the first surface of the buried conductive pattern facing the first source/drain contact; and buried insulating liners that extend along sidewalls and along the first surface of the buried conductive pattern, wherein the buried insulating liners comprise inner surfaces contacting the buried conductive pattern, and outer surfaces contacting the substrate, wherein the contact connection via includes an upper portion that protrudes in the first direction beyond an upper surface of the first source/drain contact, and a lower portion that is between the upper portion of the contact connection via and the buried conductive pattern, wherein the buried insulating liners include first and second curved portions on the first surface of the buried conductive pattern, wherein the first and second curved portions comprise inner surfaces contacting the buried conductive pattern, and outer surfaces contacting the substrate, wherein the contact connection via is between the first and second curved portions of the buried insulating liners, and wherein the outer surfaces of the first and second curved portions of the buried insulating liners that are in contact with the substrate have a convex shape.

19. The semiconductor device of claim 18, wherein the upper portion of the contact connection via is in contact with the upper surface of the first source/drain contact.

20. The semiconductor device of claim 18, further comprising a front wiring via on the first surface of the substrate and in contact with the upper surface of the first source/drain contact, wherein the upper portion of the contact connection via is in contact with a sidewall of the front wiring via.

* * * * *